(12) United States Patent
Trovato et al.

(10) Patent No.: US 6,728,581 B1
(45) Date of Patent: Apr. 27, 2004

(54) DIFFERENTIAL BUDDING: METHOD AND APPARATUS FOR PATH PLANNING WITH MOVING OBSTACLES AND GOALS

(75) Inventors: Karen Irene Trovato, Putnam Valley, NY (US); Leendert Dorst, Yorktown Heights, NY (US)

(73) Assignee: North American Philips Corporation, New York, NY (US)

( * ) Notice: Subject to any disclaimer, the term of this patent is extended or adjusted under 35 U.S.C. 154(b) by 0 days.

(21) Appl. No.: 07/508,024

(22) Filed: Apr. 11, 1990

Related U.S. Application Data

(63) Continuation of application No. 07/166,599, filed on Mar. 9, 1988, now Pat. No. 4,949,277.

(51) Int. Cl.[7] .............................................. G05B 19/00
(52) U.S. Cl. .................. 700/56; 700/254; 700/255; 701/23; 701/301; 701/26; 701/310; 706/905; 706/919

(58) Field of Search .................. 901/1, 50; 700/56, 700/28, 245, 250, 253, 254, 255; 701/23, 25, 301, 117, 118, 201, 202, 26, 210; 706/905, 919

(56) References Cited

U.S. PATENT DOCUMENTS

| | | | | | |
|---|---|---|---|---|---|
| 4,674,048 A | * | 6/1987 | Okumura | .......................... | 901/1 |
| 4,764,873 A | * | 8/1988 | Libby | ....................... | 364/513 X |

\* cited by examiner

*Primary Examiner*—William Grant
*Assistant Examiner*—Ramesh Patel

(57) ABSTRACT

A method is presented for path planning after changes in task space. In one embodiment, the method is applied to planning a path for a robot arm. The method identifies areas in the configuration space which are affected by the changes in task space. Cost waves can then be repropagated in these affected areas to allow for planning in N dimensions and using space variant metrics. The method is also adapted to use in the presence of phantom obstacles.

15 Claims, 56 Drawing Sheets

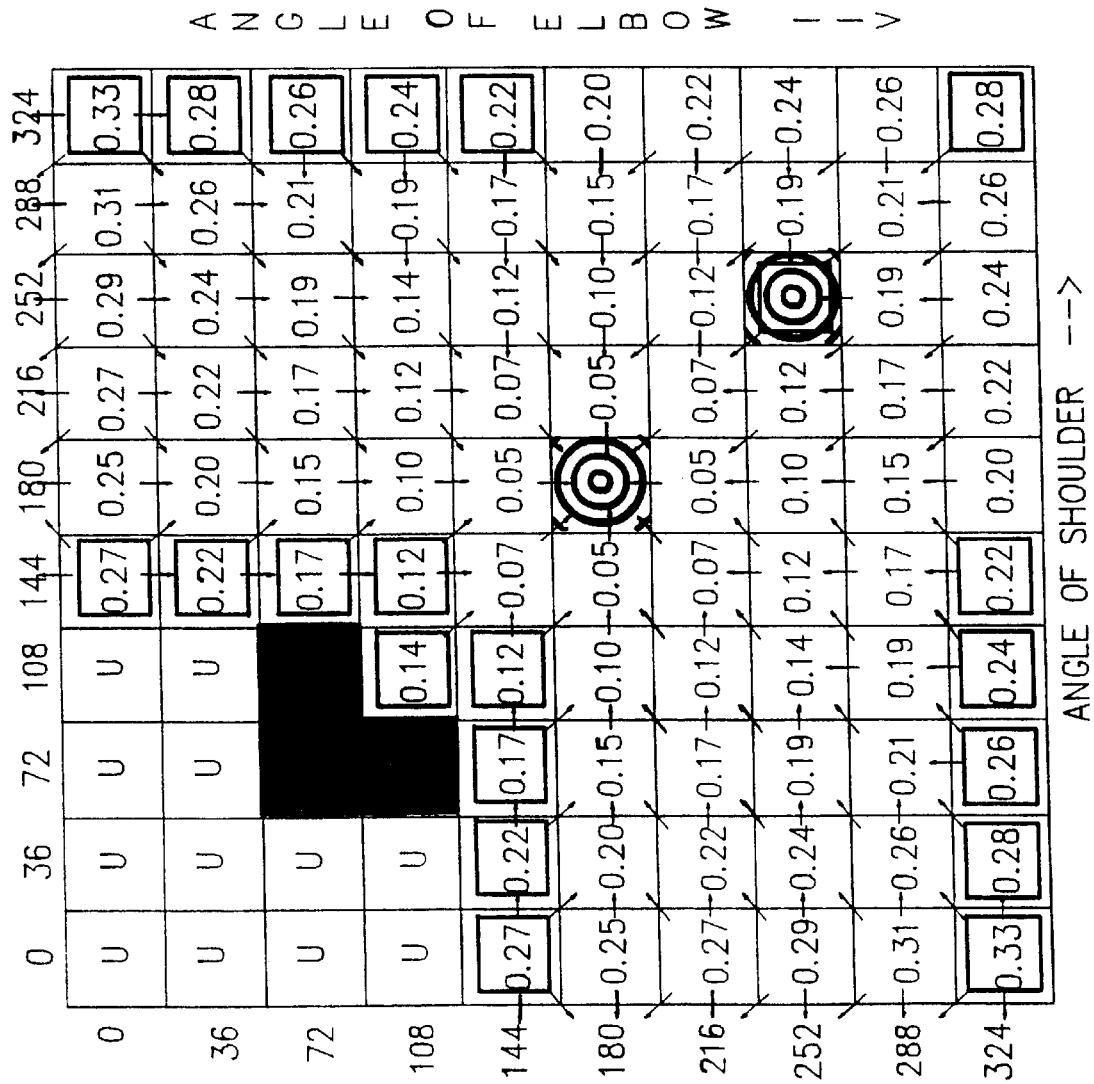

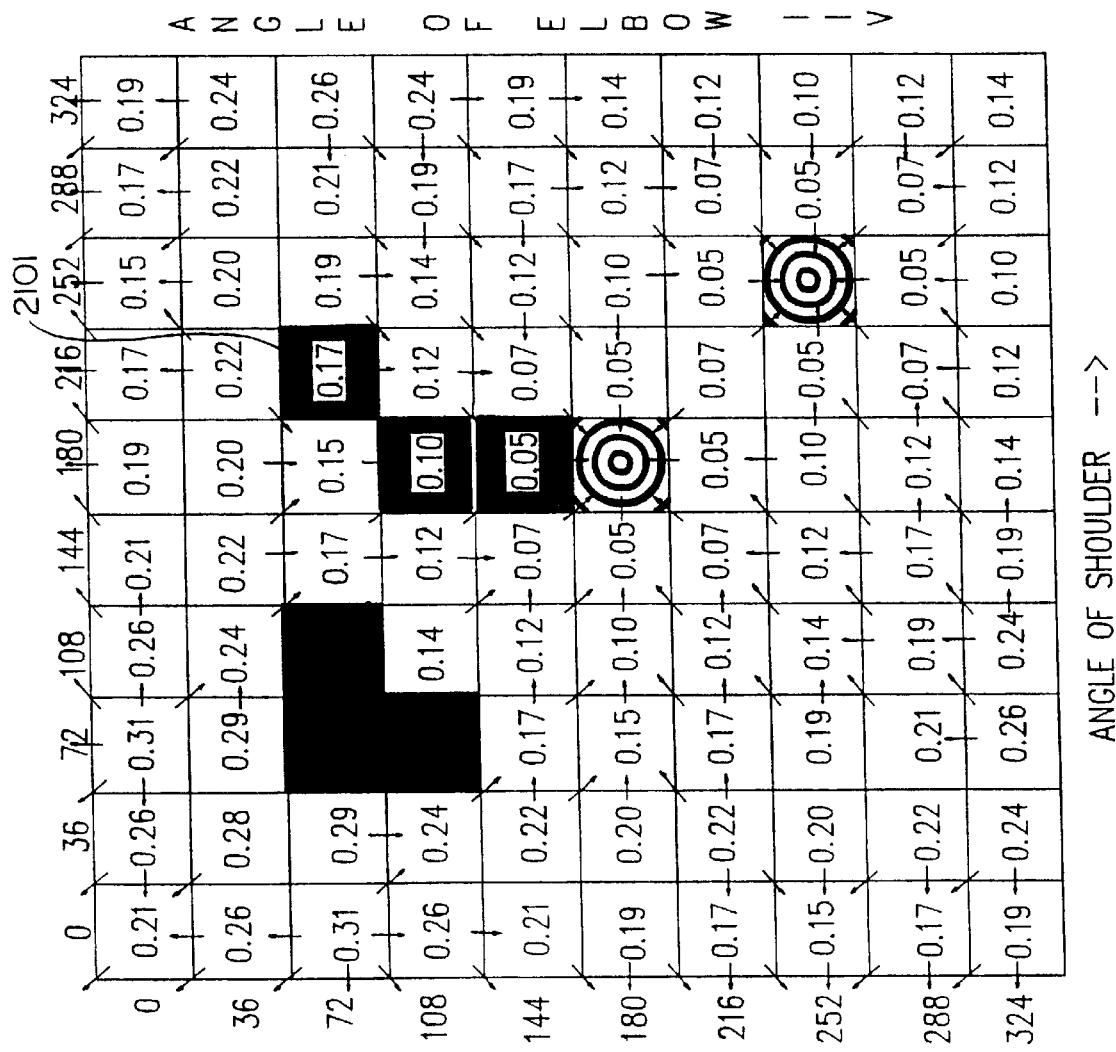

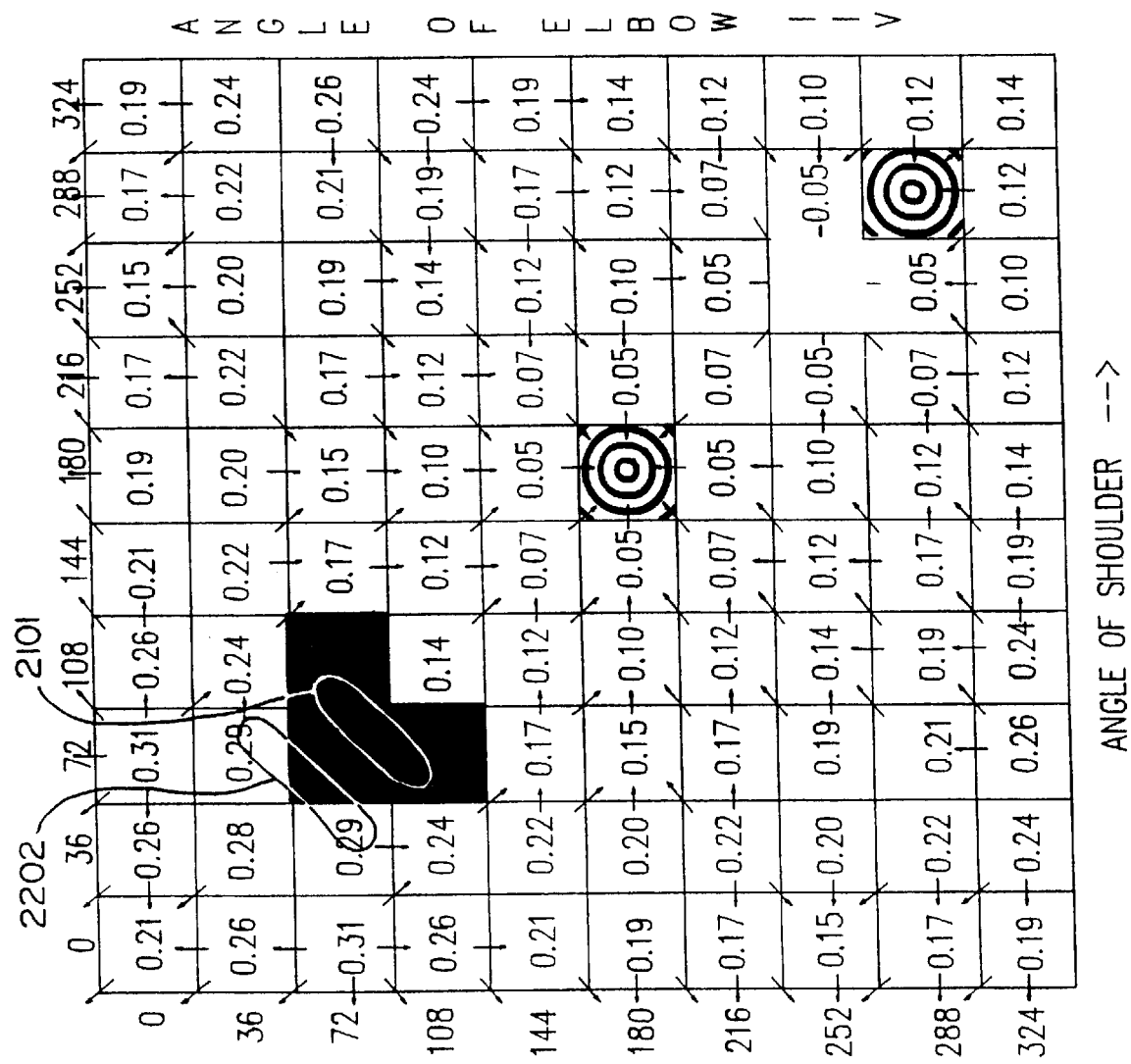

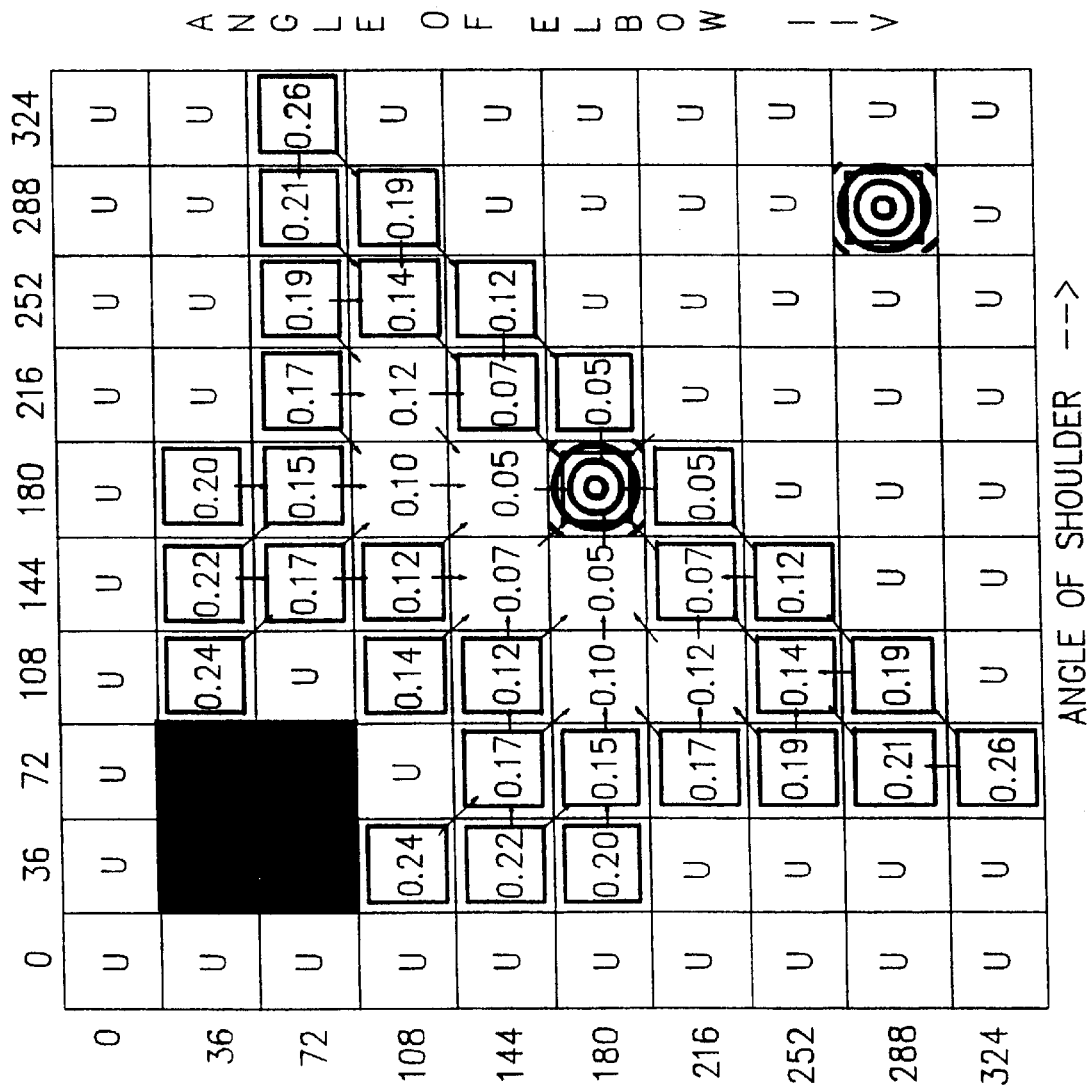

DIFFERENTIAL BUDDING: METHOD AND APPARATUS FOR PATH PLANNING WITH MOVING OBSTACLES AND GOALS

This is a continuation of U.S. application Ser. No. 07/166,599, filed Mar. 9, 1998 now U.S. Pat. No. 4,949,277.

A portion of the disclosure of this patent document contains material which is subject to copyright protection. The copyright owner has no objection to the fascimile reproduction by anyone of the patent document of the patent disclosure, as it appears in the Patent and trademark Office patent file or records, but otherwise reserves all copyright rights whatsoever.

BACKGROUND OF THE INVENTION

1. Field of the Invention

The invention relates to path planning and in particular to repropagating cost waves in a configuration space after some aspect of that space has been changed.

The invention also relates to path planning in a configuration space in which the location of obstacles is not known.

2. Prior Art

The field of path planning is one with many applications. The most common application is to controlling robots, for instance robot arms such as are used in the space shuttle. Other applications include electronic maps, traffic control, emergency vehicle control, and emergency exit systems.

The path planning problem, as applied to robots, typically involves getting a robot from a start point to a goal point while avoiding obstacles. Automating multi-dimensional path planning for robots is one of the great historical problems of robotics.

The present invention is an improvement on the invention disclosed U.S. patent application Ser. No. 123,502, now abandoned which is incorporated herein by reference as background material. That application disclosed, amongst other things, propagating cost waves through a configuration space by budding, using a space-variant metric.

After budding, some aspect of the configuration space may change, for instance, if an obstacle is removed or a goal added. In such a case, it may be inefficient to bud the entire configuration space again because only a small part of the configuration space may be affected.

Another problem which arises after a change in configuration space is that the precise location of the changes, particularly in obstacle location, may not be known. An approach to this problem is set forth in V. Lumelsky, "Algorithmic and Complexity Issues of Robot Motion in an Uncertain Environment", Journal of Complexity 3, 146–182 (1987); and V. Lumelsky, "Dynamic Path Planning for a Planar Articulated Robot Arm Moving Amidst Unknown Obstacles", Automatica, Vol. 23., No. 5, pp. 551–570 (1987). This approach suffers from certain shortcomings. For instance, the method disclosed is only able to deal with two dimensions. The method, also does not have a memory for previously encountered obstacles.

SUMMARY OF THE INVENTION

It is therefore an object of the invention to deal with changes in a configuration space.

It is a second object to deal with changes in configuration space in the context of a space-variant metric.

It is a further object of the invention to deal with changes in a configuration space using budding.

It is still a further object of the invention to deal with changes in condition in multiple dimensions.

It is another object of the invention to deal with unsensed or partially sensed changes in conditions in the context of a space-variant metric.

It is yet another object of the invention to deal with unsensed or partially sensed changes in conditions using budding.

It is yet a further object of the invention to deal with unsensed or partially sensed changes in conditions with improved abilities to incorporate new data into the memory of the path planes.

These and other objects of the invention are achieved herein using a method referred to herein as differential budding.

The method involves identifying a region in configuration space which is affected by a change of conditions in task space. Precisely selected states referred to as a perimeter and which define this region are then placed on a "sifting heap" from which they are budded.

In the case of an added obstacle, the perimeter includes the front edge of the obstacle as well as surrounding a group of states which are connected via direction arrows to the back edge of the added obstacle.

In the case of removed obstacles, the perimeter states are neighbors of the removed obstacle states.

In the case of added goals, the perimeter states are the added goals themselves.

In the case of partially sensed changes in conditions, the changes in conditions are detected while following a pre-calculated path. Most changes in conditions can then be dealt with as an added obstacle, a removed obstacle, an added goal, or a removed goal. In one embodiment of the invention, the object first encounters a portion of the change in conditions iteratively follows a newly calculated path until the change in conditions is taken into account.

Further objects and advantages will become apparent in what follows.

BRIEF DESCRIPTION OF THE DRAWING

The invention will now be described using several examples with reference to the following figures:

FIGS. 8b, 9, and 10 show the effects of the method of FIGS. 1–7 on the configuration space corresponding to the task space of FIG. 8a.

FIG. 13b shows a configuration space at an intermediate status resulting from the newly added goals of FIG. 13a.

FIG. 20 shows a configuration space of FIG. 19b at an intermediate status resulting from the application of the method of FIGS. 2–7.

FIG. 21 shows the configuration space of FIG. 20 after budding and with a new path.

FIG. 22 shows the configuration space of FIG. 21 with the obstacle and the goal both moved slightly.

FIG. 23 shows the configuration space of FIG. 22 at an intermediate status resulting from the application of the method of FIGS. 2–7.

FIG. 34b shows the configuration space corresponding to FIG. 34a.

DETAILED DESCRIPTION OF THE PREFERRED EMBODIMENT

1. Overview of the Method

Figure 1:
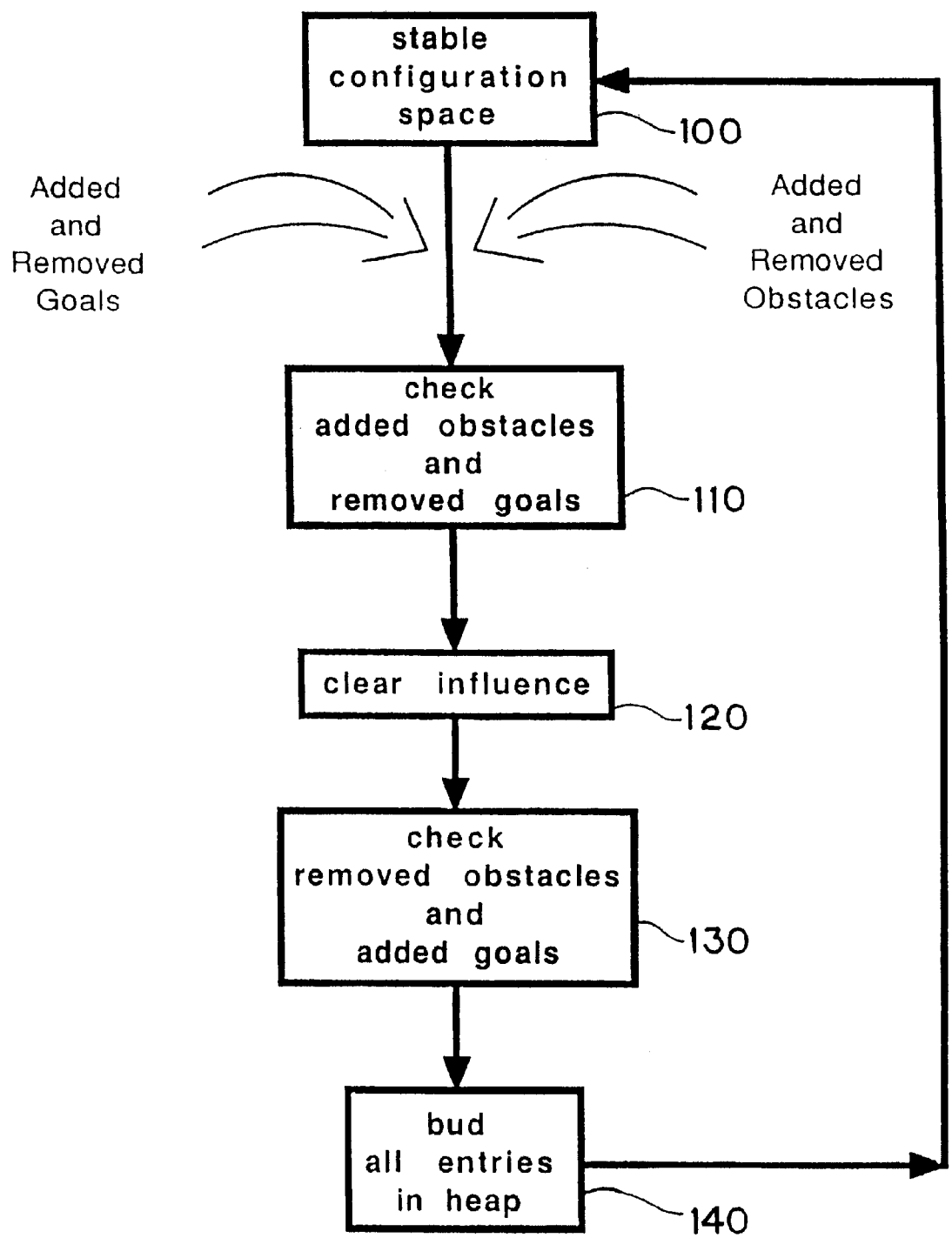
FIG. 1 is a summary flow chart of the differential budding method.

FIG. 1 gives a general overview of steps used in "differential budding", a method for regenerating a configuration space with changes in obstacles and goals. The resulting configuration space provides information necessary to generate a series of set points to be followed for an optimal path.

In box 100, a configuration space filled with direction arrows and costs_to_goal is assumed. Information about changed goal and obstacle states is also assumed to be provided. These states are already transformed from task space to configuration space. It should be noted that the method will work if the configuration space is merely initialized, with UNCOSTED in each cost-to-goal, and no direction arrows.

In box 110, information about newly added obstacle states and newly removed goal states is used to initialize the corresponding states in configuration space.

In box 120, all states 'influenced' by the added obstacle and removed goal states are initialized to have UNCOSTED values and no direction arrows. 'Influenced' neighbors are those that are on paths that point to or through these added obstacle or removed goal states. The 'perimeter' of states around this region is obtained and added to the heap for later 'budding'.

In box 130, information about newly removed obstacle states and newly added goal states is used to initialize the corresponding states in configuration space. The heap is set up so that 'budding' can take place.

In box 140, the states on the heap accumulated as a result of boxes 110, 120, and 130 are 'budded' resulting in a stable (valid) configuration space. Given a starting state, an optimal path of set points can be read out by following the direction arrows in configuration space to the goal state.

Two special structures are used for efficiency: a sifting heap, and a sifting array. The 'sifting heap' is a regular heap except that it keeps at most one copy of a tuple (state) in the heap even though many requests to add extra copies may be made. Whenever the word "heap" is used herein, a "sifting heap" is intended. The 'sifting array' (used to store unique states of the perimeter) is similarly a regular array except that it keeps at most one copy of a tuple (state). Some of the arrays referred to herein are sifting and some are not. In both cases, sifting is achieved by maintaining flags in each state of the configuration space that report if a state is in the heap or in the perimeter array. Then all that is needed when adding or removing states from the heap or perimeter is to modify these flags correctly.

A. Check added obstacles and removed goals.

Figure 2:
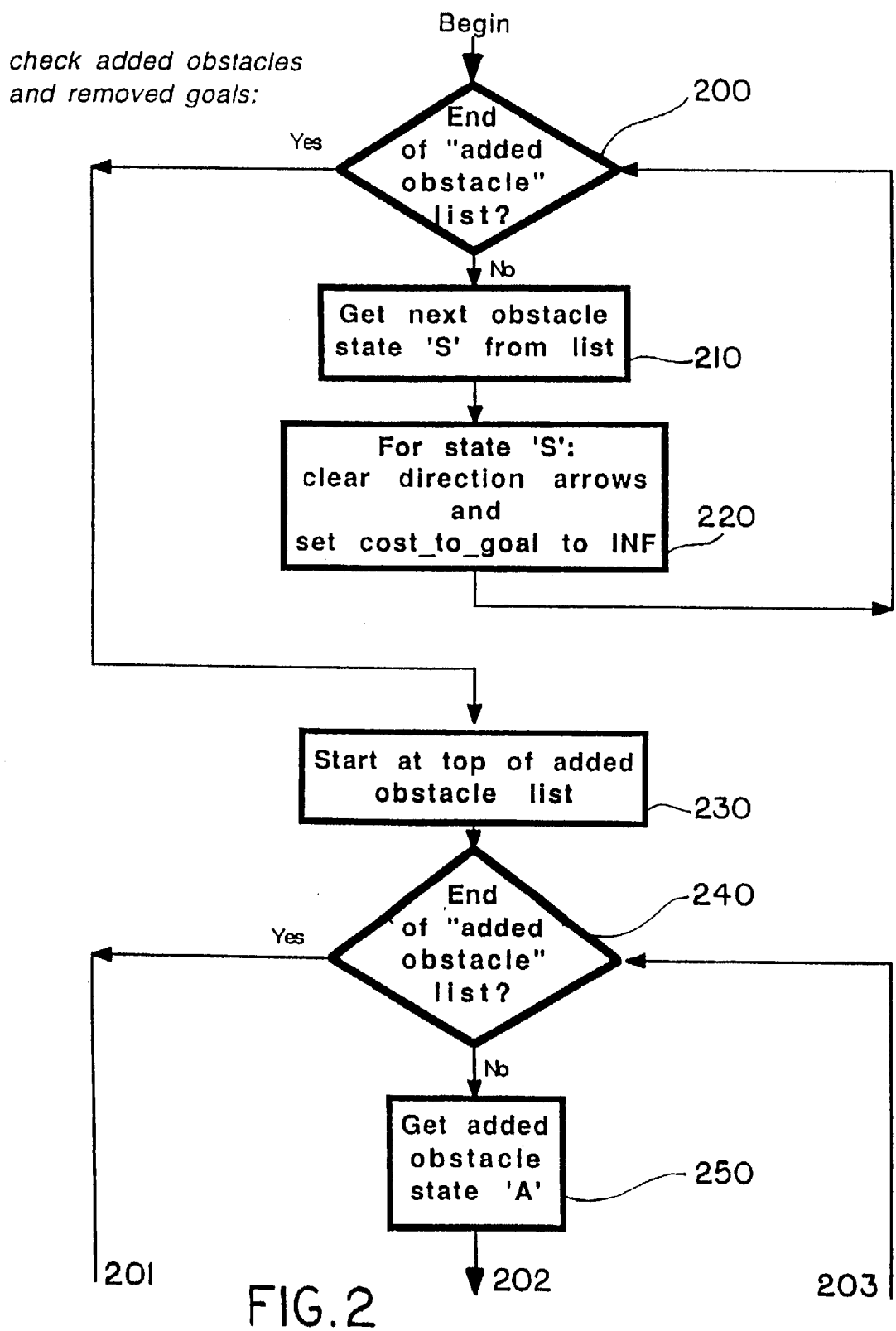
FIGS. 2 and 3 are flow charts giving more details of box 110 of FIG. 1.
Figure 3:
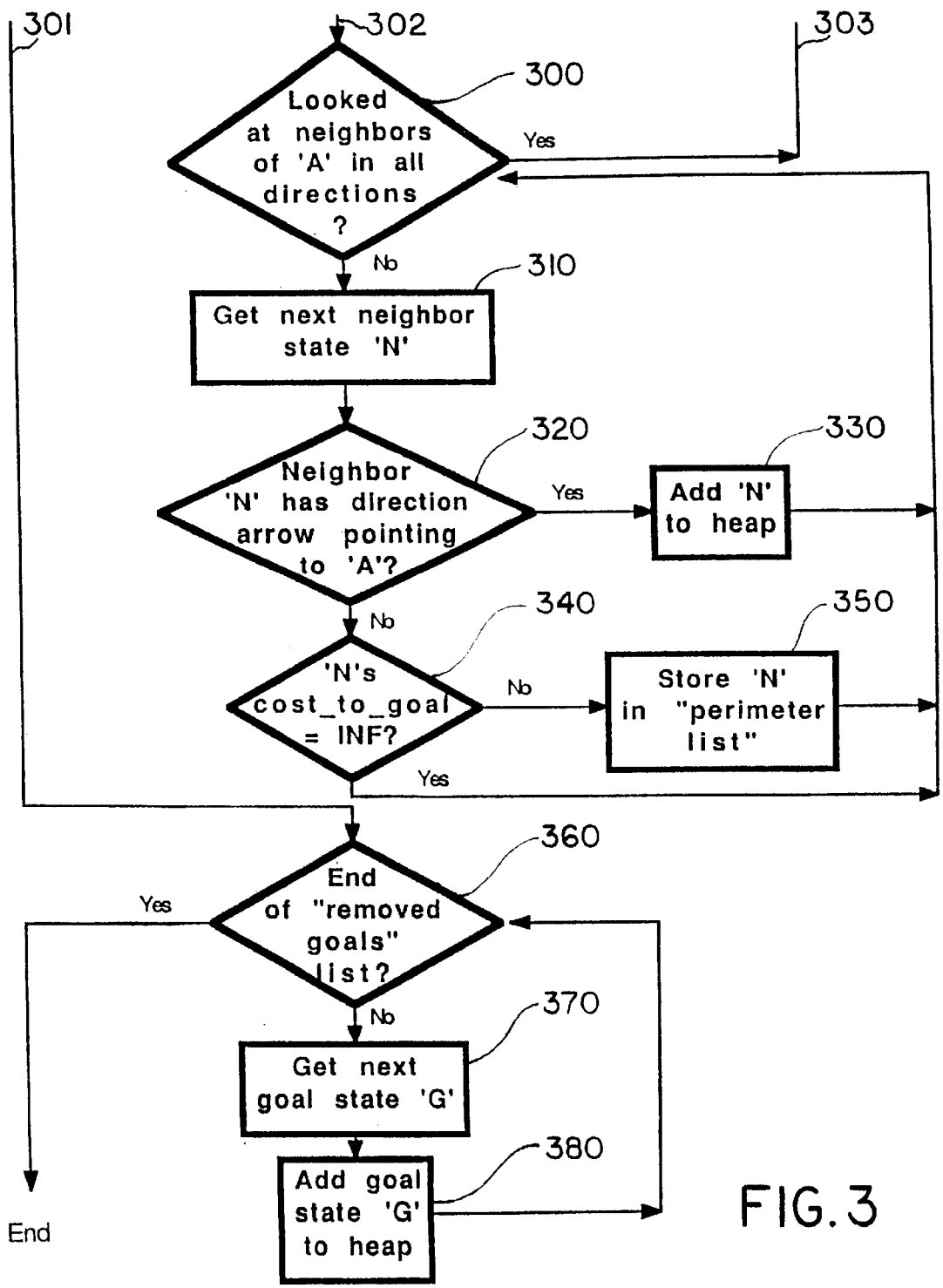

The method in box 110 is detailed by the flowchart of FIG. 2 and FIG. 3. The method of box 120 is detailed by the flowchart in FIG. 4 and FIG. 5. The method of box 130 is detailed by the flowchart of FIG. 6 and FIG. 7.

The 'check added obstacles and removed goals' method of box 110 includes three main parts.

The first part is shown in boxes 200, 210, and 220. Box 200 tests whether the end of the "added obstacle" list has been reached. If the result of the test in box 200 is "Yes", control passes to box 230. If the result of the test in box 200 is "No", control passes to box 210. Box 210 gets the next obstacle state 'S' from the added obstacle list. Box 220 then clears the direction arrows field and sets the cost_to_goal field to INF in the state 'S'. After box 220, control is returned to box 200.

Boxes 200, 210, and 220 thus constitute a loop which initializes each 'added obstacle' state ('S') in configuration space to have no direction arrows and an INF (INFINITE) cost_to_goal.

The second part of the "check added obstacles and removed goals" method of box 110 is shown in boxes 230, 240 and 250 of FIG. 2, and boxes 300, 310, 320, 330, 340, and 350 of FIG. 3. It should also be noted that line 201 of FIG. 2 connects to line 301 of FIG. 3; line 202 of FIG. 2 connects to line 302 of FIG. 3; and line 203 of FIG. 2 connects to line 303 of FIG. 3.

In this second part of box 110, the 'front edge' of the obstacle and the 'back edge' of the added obstacle are obtained. The 'front edge' contains those neighbor states that are on the 'goal side' of the added obstacle. These states are neighbors of the obstacle region, have cost values other than INFINITY or UNCOSTED, and are not pointing toward any of the obstacle states. The 'back edge' contains those neighbor states that are not on the front edge. These states have direction arrows that point into the added obstacle.

Box 240 signifies a test for the end of the "added obstacle" list. If the end has been reached, control passes via line 201/301 to box 360. If the end has not been reached, control passes to box 250, where an added obstacle 'A' is retrieved.

Then at box 300, it is determined whether all of the neighbor states 'N' of the obstacle state 'A' have been considered. If all of the neighbor states 'N' have been considered, control returns via line 303/203 to box 240. If a neighbor state 'N' has not been considered, control passes to box 310, where that state 'N' is retrieved.

Box 320 indicates a test of whether the state 'N' contains a direction arrow that points to 'A'. If state 'N' does not contain such a direction arrow, control passes to box 340. If state 'N' does contain such a direction arrow, the state 'N' is added to the heap at box 330. If the state 'N' is added to the heap at box 330, 'N' is considered to be part of the 'back edge' of the added obstacle. After box 330, control returns to box 300.

In box 340, 'N' is tested for whether its cost_to_goal field contains INF. If 'N' does have a cost_to_goal of INF, control is returned to box 300. If 'N' has a cost_to_goal other than INF, it is added to the 'perimeter list' at box 350, and is considered part of the 'front edge' of the obstacle.

The third part of the "check added obstacles and removed goals" method of box 110 is shown in boxes 360, 370 and 380 of FIG. 3. These three boxes form a loop. In box 360, it is determined whether the end of the "removed goals" list has been reached. If the end has been reached, the "check added obstacles and removed goals" method is complete. If the end has not been reached, the next goal state 'G' is retrieved at box 370. This goal state 'G' is then added to the heap at box 380 and control is returned to box 360. Thus, in this loop, each of the removed goal states in the 'removed goal list' is added to the heap.

B. Clear influence.

The 'clear influence' method of box 120 includes two main parts. The first part determines the 'perimeter of influence' due to the newly added obstacle and removed goal states, and the second part takes the perimeter and puts it into the heap.

Figure 4:
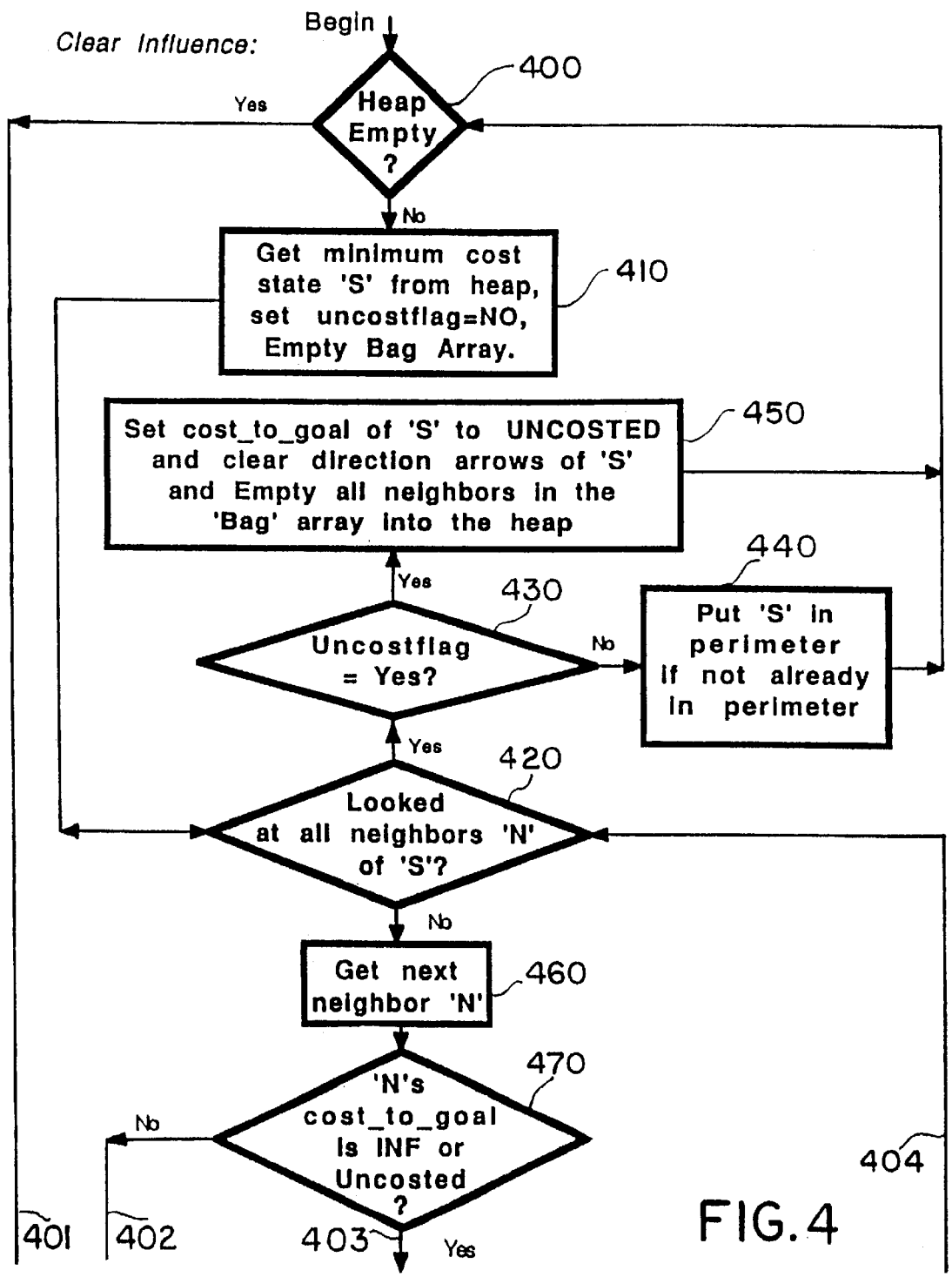
FIGS. 4 and 5 are flow charts giving more details of box 120 of FIG. 1.
Figure 5:
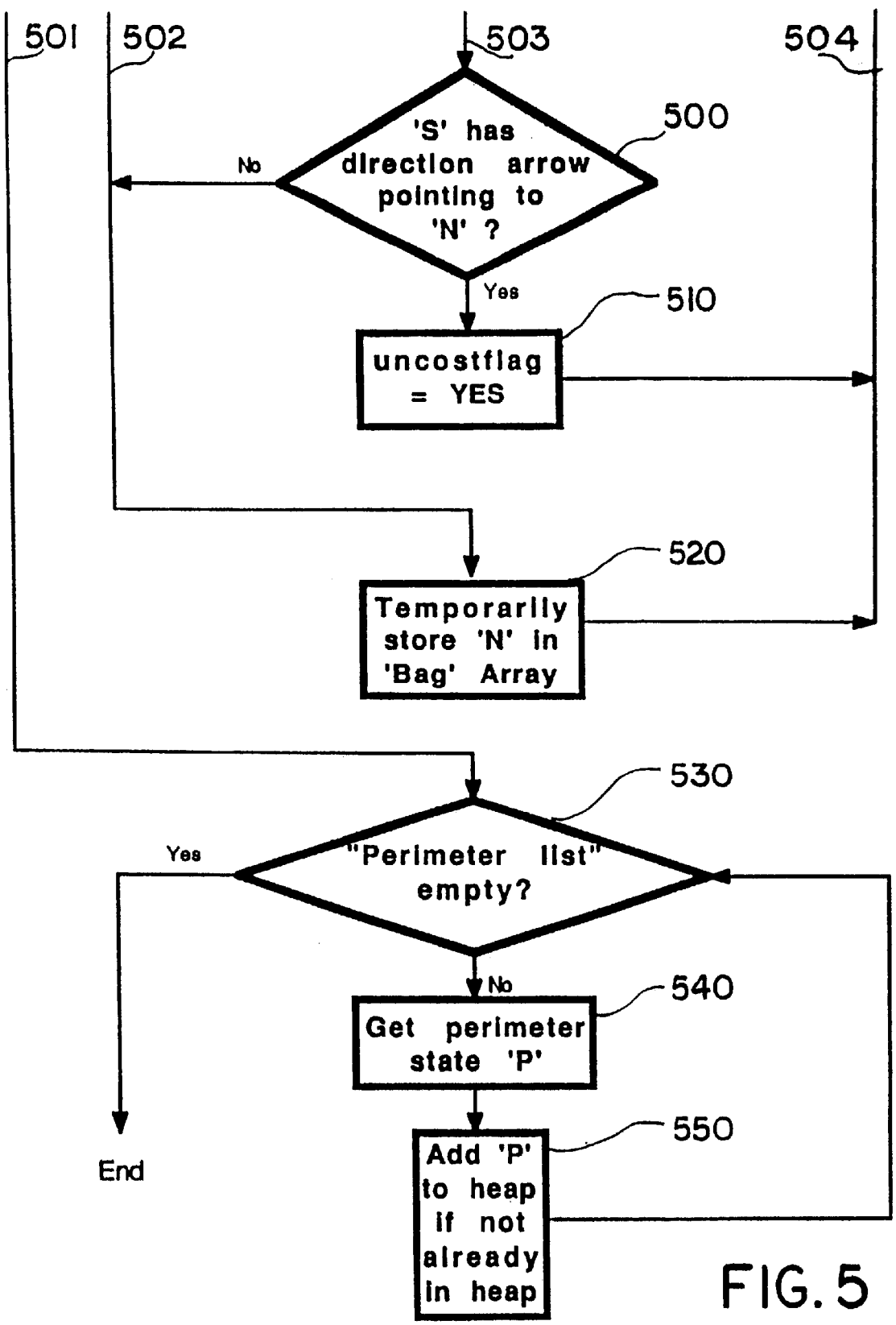

The first part of the "clear influence" method of box 120 is shown in boxes 400, 410 420, 430, 440, 450, 460 and 470 of FIG. 4, and boxes 500, 510 and 520 of FIG. 5. It should be noted that line 401 of FIG. 4 connects to line 501 of FIG. 5, line 402 of FIG. 4 connects to line 502 of FIG. 5, line 403 of FIG. 4 connects to line 503 of FIG. 5, and line 404 of FIG. 4 connects to line 504 of FIG. 5.

At the beginning of the 'clear influence' method, the heap consists of neighbor states at the back edge of any added obstacles and any removed goal states. At box 400, the heap is tested to see if it is empty. If the heap is empty control passes via line 401/501 to box 530.

If the heap is not empty, then, at box 410, a minimum cost state 'S' is retrieved from the heap and and a variable, uncostflag, corresponding to 'S' is set to "NO". At box 420, it is then determined whether all neighbors, 'N', of 'S' have been considered. If all the neighbors have been considered, control passes to box 460.

If all of the neighbors have not been considered, the variable uncostflag is tested at box 430. If uncostflag has a value "No" then, at box 440, 'S' is added to the perimeter, if 'S' has not already been added to the perimeter. If uncostflag has a value "Yes", then, at box 450, the cost_to_goal field of 'S' is set to UNCOSTED; the direction_arrows field of 'S' is cleared; and all neighbor from the 'Bag' array are emptied into the heap which sifts them, i.e. it does not store any duplicate states.

At box 460 a next neighbor 'N' is retrieved. At box 470 the cost_to_goal field of 'N' is tested to see if it is either INF or UNCOSTED. If it is neither, control passes via line 402/502 to box 520. If it is either INF or uncosted, control passes via line 403/503 to box 500.

At box 500, 'S' is checked to see if it has a direction arrow pointing to 'N'. If not, control passes to box 520. If so, the uncostflag associated with 'S' is set to "YES".

In box 520 the neighbor 'N' is temporarily stored in the Bag array. Control then returns via line 504/404 to box 420.

Thus, during the first part of the "clear influence" method of box 120, each state 'S' in the heap, that points to any neighbor 'N' that has a cost_to_goal that is either INFINITE or UNCOSTED is identified. Such a state 'S' must therefore have been 'connected' via direction arrows to the back of a new obstacle state or to a removed goal state. Any neighbor that is not INFINITE or UNCOSTED is a candidate for expanding the search and is temporarily stored in the 'Bag'. The 'Bag' is a standard array containing states. After all neighbors of 'S' are examined, if 'S' is connected, then all neighbors of 'S' that are in the 'Bag' are added ("emptied") to the heap, which sifts them, and 'S' is reinitialized to have cost_to_goal of UNCOSTED and no direction arrows. If 'S' is not connected, 'No' branch from box 430, then 'S' must be a member of the 'perimeter' and the neighbors that are in the 'Bag' are NOT added to the heap.

The second part of the "clear influence" method of box 120 is shown in boxes 530, 540, and 550 of FIG. 5. At box 530, the perimeter list, stored in a sifting array, is checked to see if it is empty. If so, the clear influence method ends. If not, a perimeter state 'P' is retrieved 540 and added 550 to the heap, if not already in the heap. After box 550, control is returned to box 530. This second part of box 120 thus reads the states in the "perimeter list" and stores them in the heap.

Thus the perimeter list can be said to surround an influenced or "affected region" of the configuration space, and this terminology has been used herein. The term "influenced" is used herein particularly to refer to the "clear influence" step 120 and is distinguished from the term affected, which is used more broadly as explained below. However, this terminology is not meant to imply that the surrounded region is contains the only states which may be changed as a result of differential budding. States on or outside the perimeter may have their cost_to_goal or direction_arrows values changed as a result of budding the heap in box 140 of FIG. 1.

C. Check removed obstacles and added goals.

The 'check removed obstacles and added goals' method of box 130 has three main parts.

The first part is shown in boxes 600, 610 and 620. At box 600 it is determined whether the end of the 'removed obstacle' list has been reached. If the end has been reached, control passes to box 630. If the end has not been reached, a next obstacle state, 'S', is retrieved from the list at box 610. In this state, 'S', the direction_arrows field is cleared and the cost_to_goal field is set to UNCOSTED. This first part is, then, a loop which initializes each 'removed obstacle' state in configuration space to have no direction arrows and an UNCOSTED cost_to_goal. These are appropriate values, since these now unoccupied (removed) obstacle states have no presumed costs or arrows. These removed obstacle states can be said to be the region affected by the obstacle removal, and this terminology is used herein. However, it should be noted that states outside this "affected region" may still have their cost_to_goal and direction_arrows values changed as a result of budding in box 140. The states surrounding the removed obstacle can be said to be the perimeter, but they require a less sophisticated treatment than the perimeter of the removed goals and added obstacles.

Figure 6:
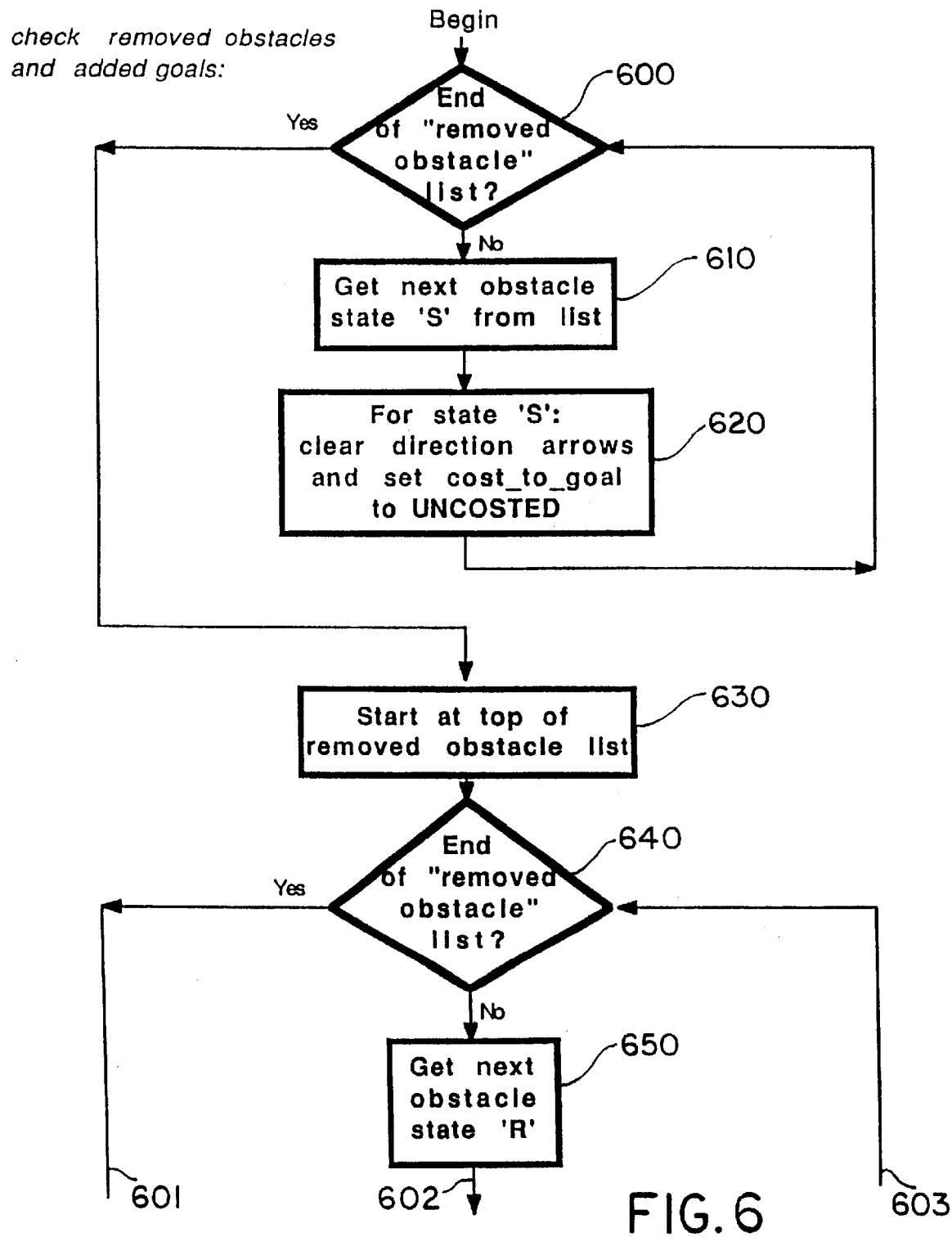
FIGS. 6 and 7 are flow charts giving more details of box 130 of FIG. 1.
Figure 7:
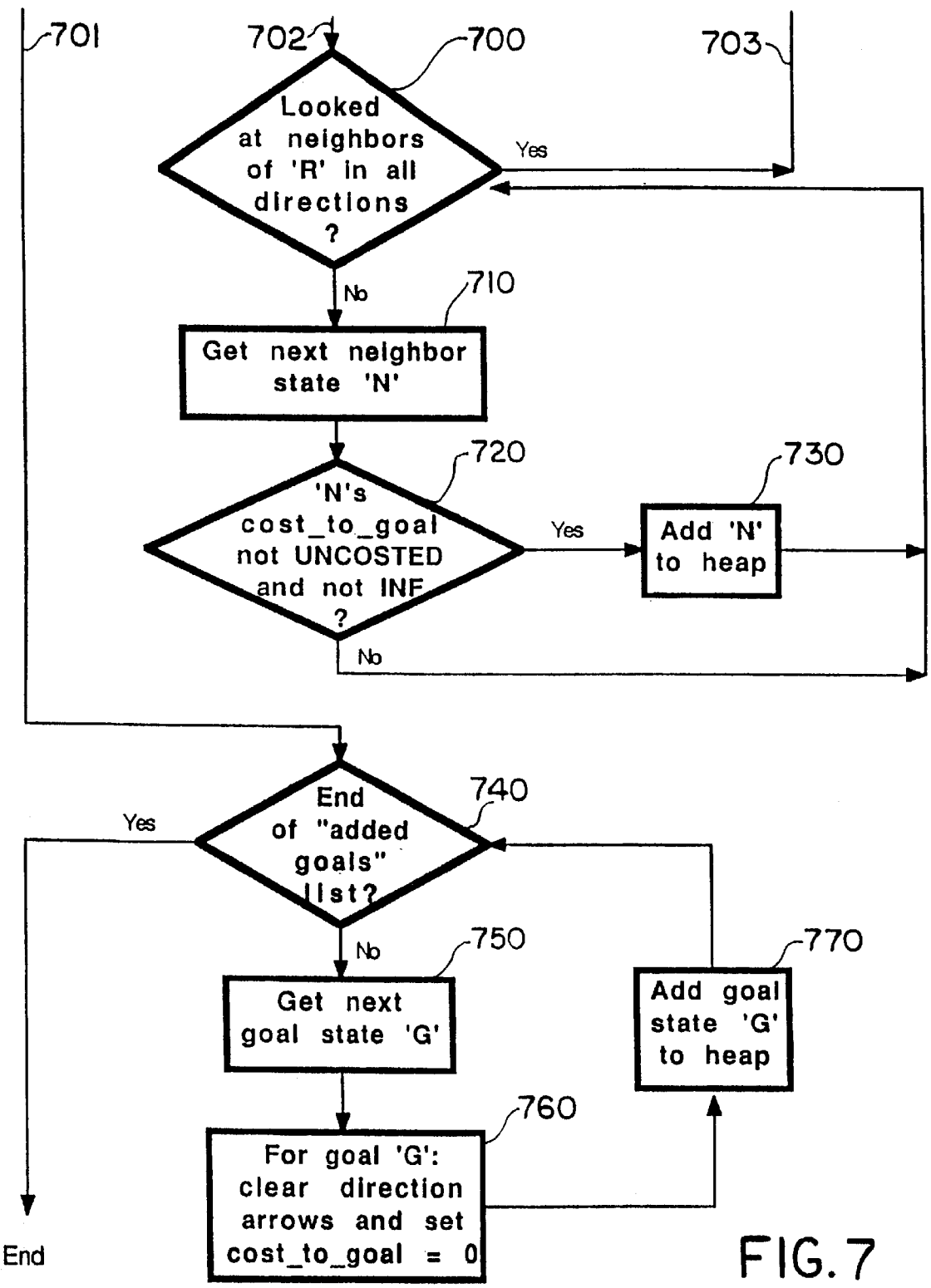

The second part of box 130 is shown in boxes 630, 640 and 650 of FIG. 6 and boxes 700, 710, 720, and 730 of FIG. 7. It should also be noted that line 601 of FIG. 6 connects to line 701 of FIG. 7, line 602 of FIG. 6 connects to line 702 of FIG. 7, and line 603 of FIG. 6 connects to line 703 of FIG. 7.

This second part of box 130 starts at the top of the removed obstacle list, at 630. A test is performed at 640, as in box 600, to determine whether the end of the "removed obstacle" list has been reached. If the end has been reached, control passes via line 601/701 to box 740. If the end has not been reached, a next obstacle state 'R' is retrieved at 650. Then, in box 700, it is determined whether all neighbors of 'R' have been considered. If so, control is passed via lie 703/603 to box 640. If not, a next neighbor state 'N' of 'R' is retrieved at 710. If 'N' has a cost_to_goal field which has a value of UNCOSTED or INF, then control is returned to box 700. If 'N' has a cost_to_goal field which is not UNCOSTED and not INF, then 'N' is added to the heap at 730.

Thus, in this second part of box 130, all neighbors of a removed obstacle state that have a cost_to_goal other than 'INFINITY' or 'UNCOSTED' are added to the heap, which sifts them. These states together form an edge that is adjacent to the removed obstacle. These neighboring states will help (via the 'budding' mechanism of box 140) to fill in the vacated area where the 'removed obstacle' states reside.

The third part of box 130 is shown in boxes 740, 750, 760, and 770 of FIG. 7. At box 740, a test is performed to determine if the end of the "added goals" list has been reached. If the end has been reached, the 'check removed obstacles and added goals' method terminates. If the the end has not been reached, a next goal state 'G' is retrieved at 750. At 760, for the goal 'G', the direction_arrows field is cleared and the cost_to_goal field is set to zero. Then, at 770, the goal 'G' is added to the heap and control is returned to box 740.

Thus, this third part of box 130 is a loop which takes each newly added goal state from the "added goals" list, clears the direction arrows, sets the cost_to_goal to zero, and adds each goal state to the heap. Thus the added goal states are both the "affected region" and the perimeter as that terminology is used herein. However, it should be noted that states outside this "affected region" may still have their cost_to_goal and direction_arrows values changed as a result of budding in box 140.

In summary, then, the "affected region" as that term is used herein means states that have been cleared as part of the clear influence step 120, and states corresponding to removed obstacles and added goal states which are "influenced" are the ones cleared during the clear influence step 120.

Appendix A contains source code performing the method of FIGS. 1–7. In addition to code for executing the method, Appendix A has code for producing a graphic simulation. The source code is in the 'C' language. In printing this source code, the printer has changed the character sequence "\n" in the "printf" statements to "0" (zero). Therefore, in order to use this code, the programmer will have to change these zeroes back to "\n".

This concludes the differential budding aspect of this algorithm. At this point, the states that reside in the heap are 'budded' box 140 according to the 'budding method' found in U.S. patent application Ser. No. 123,502 now abandoned. This produces the final updated configuration space from which an optimal path can be produced.

2. Simplified Examples

The method of FIGS. 1–7 will now be illustrated with reference to some simplified examples. In these examples, a coarse configuration space is used, so that values of the direction_arrows and cost_to_goal fields will be clearly visible. In addition, the various steps used in the method are more clearly visible on the coarse configuration space.

A. Adding an obstacle.

Figure 8A:
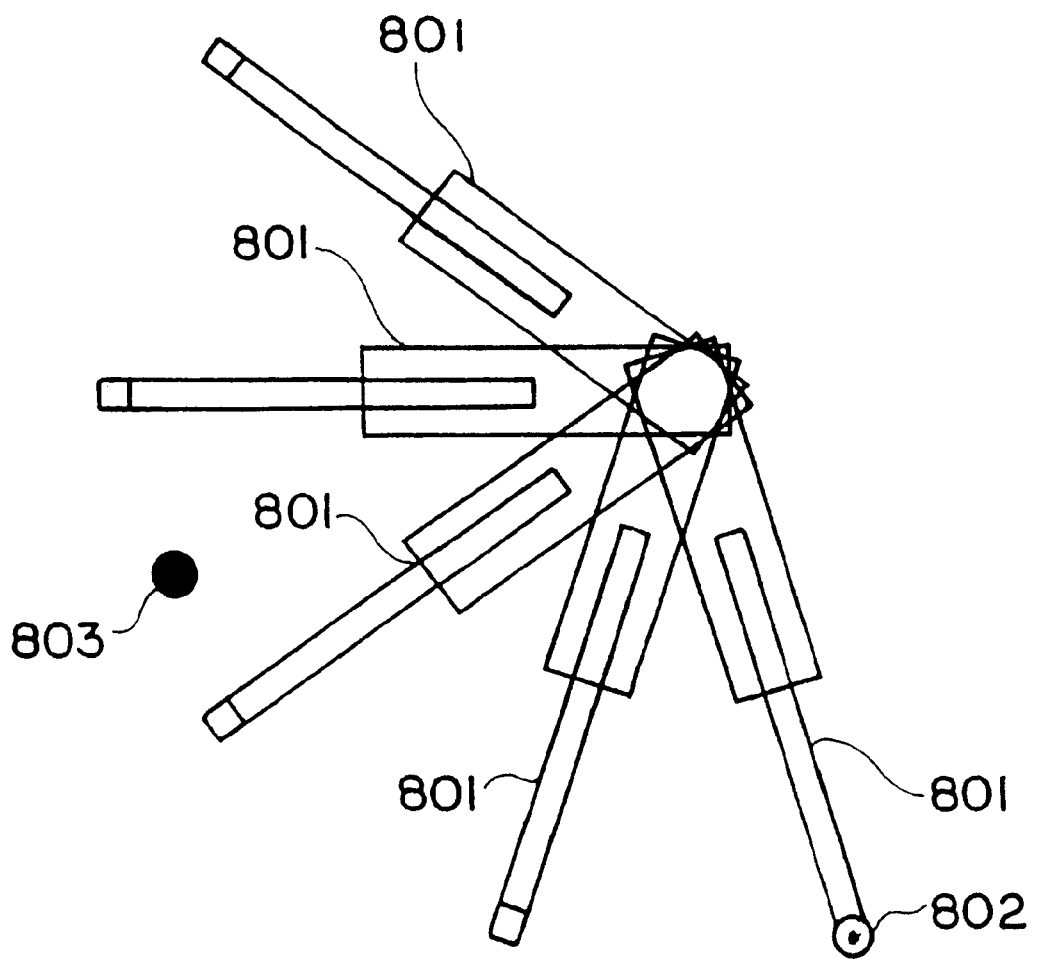
FIG. 8a shows a task space with a two link robot following a minimum joint motion path.

FIG. 8a illustrates a task space with a two-link robot 801 following a minimum joint motion path to a goal 802. An obstacle 803 has been added to the task space, after the minimum joint motion path was calculated.

Figure 8B:
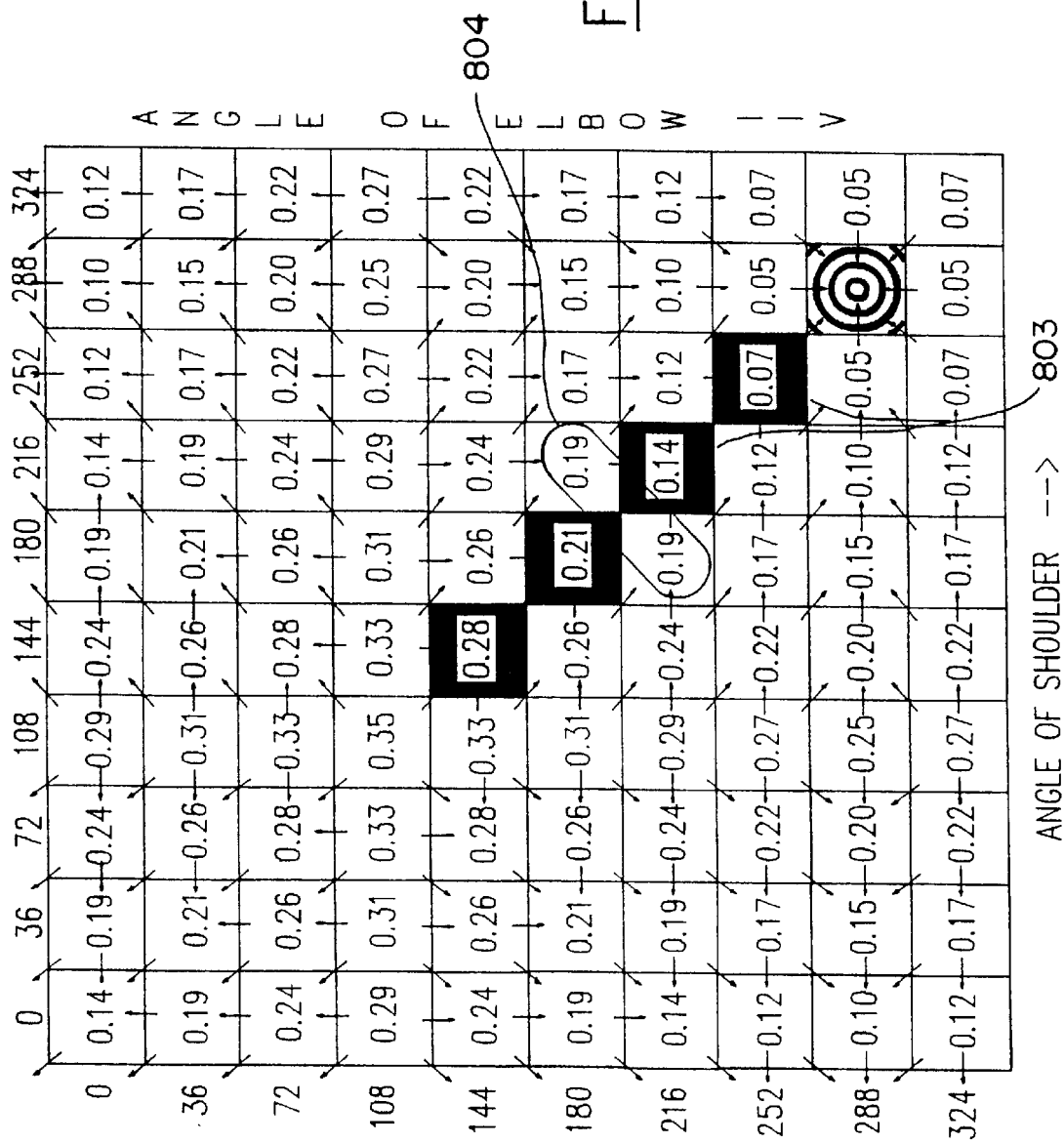

FIG. 8b shows a coarse configuration space corresponding to the task space of FIG. 8a. In the coarse configuration space, states appear as squares in the table. The locations of the states are identified by shoulder and elbow angle. States have cost to goal values marked as numbers in the squares. Direction arrows are shown leading from one state to another. For instance, the state corresponding to a shoulder angle of 72° and an elbow angle of 36° is indicated as [72,36]. State [72,36] has a cost to goal of 0.26 and two direction arrows pointing respectively to states [36,36] and [36,0]. It should be noted that each illustrated direction arrow is associated with the state where it starts. Each direction arrow points to the state where its arrowhead appears. The goal is indicated with a target symbol at state [288,288]. The path to the goal is indicated by blackened states, e.g. at 805.

In the configuration space of FIG. 8b, the newly added obstacle first appears as a line polygon 804, which blocks the path 805. The line polygon 804 has a finer resolution than the configuration space, and will be discretized in later figures.

Figure 9:
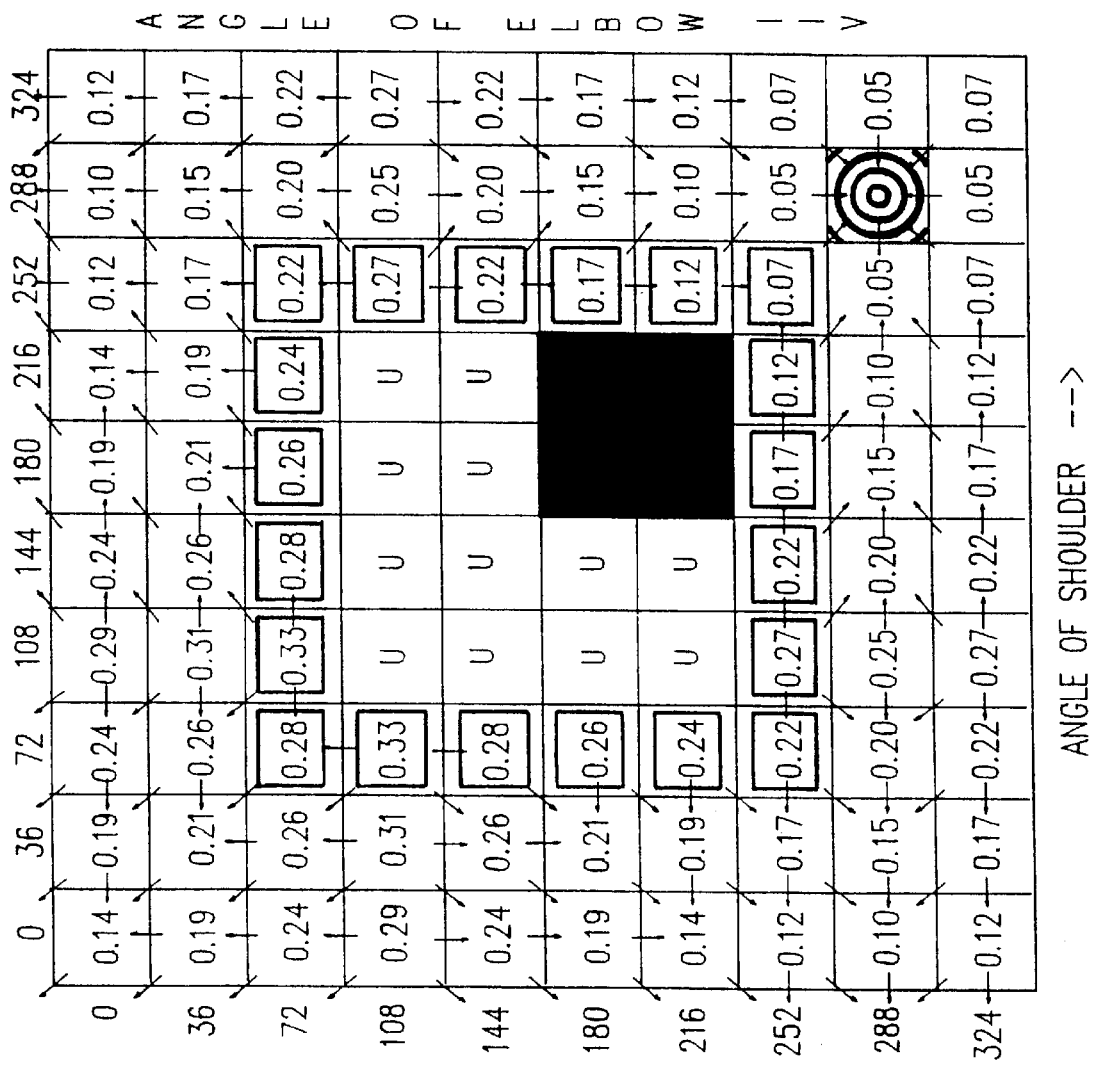

In the configuration space of FIG. 9, the obstacle has been transformed into states [180,180], [180,216], [216,180], and [216,216]. FIG. 9 shows the configuration space after the 'clear influence' phase of box 120. The heap now contains all configuration states that are 'boxed' such as [72,72], [72,180] etc. These coordinates are read [shoulder angle, elbow angle]. The states that have actually been cleared during the 'clear influence' stage 120 show a 'U' (meaning UNCOSTED) as their state cost_to_goal. All of these states were traceable (via direction arrows in FIG. 8) to the back of the added obstacle.

Figure 10:
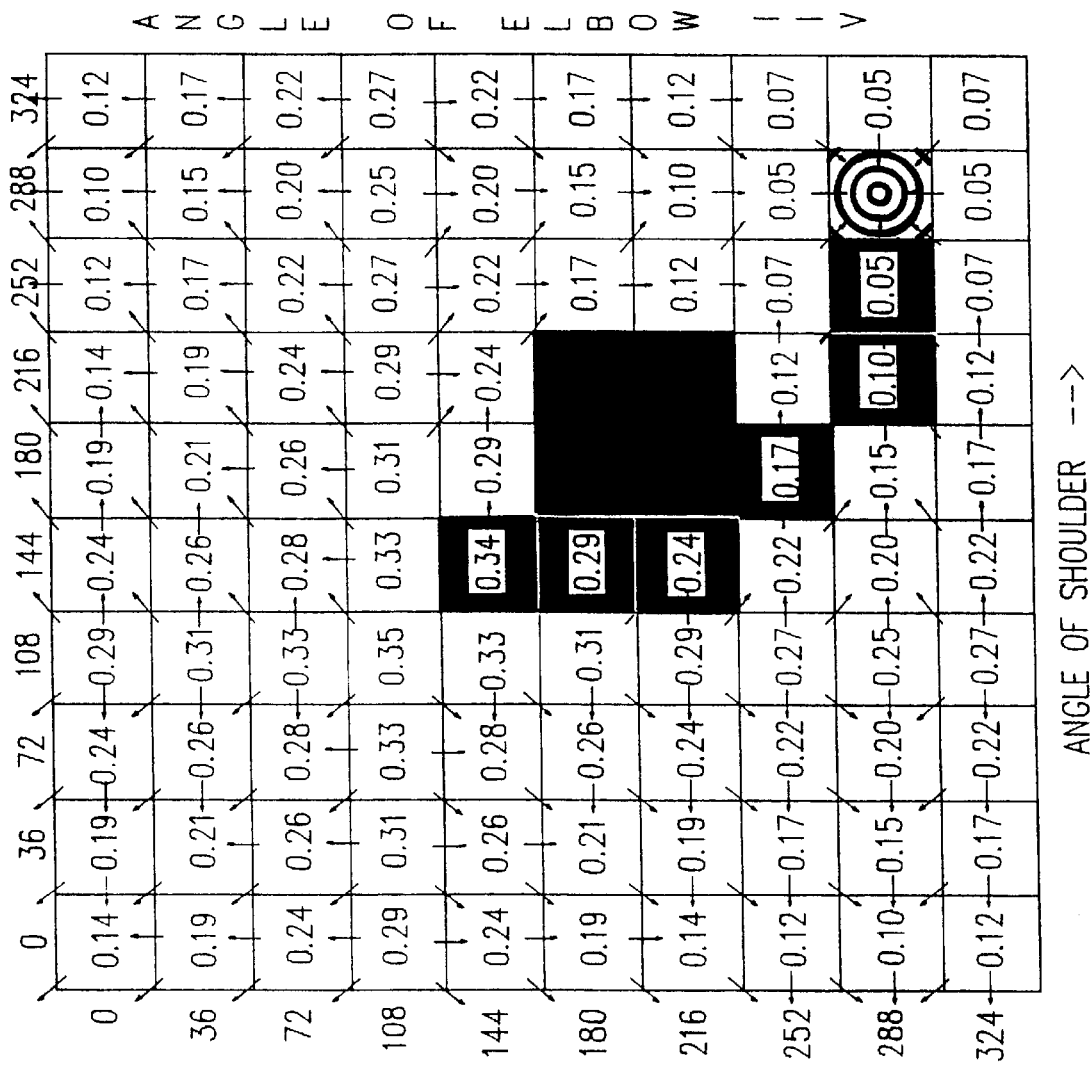

In FIG. 10, a stable configuration space has been calculated and is shown after 'budding' the states that were in the heap after FIG. 9.

B. Removing an obstacle.

Figure 11A:
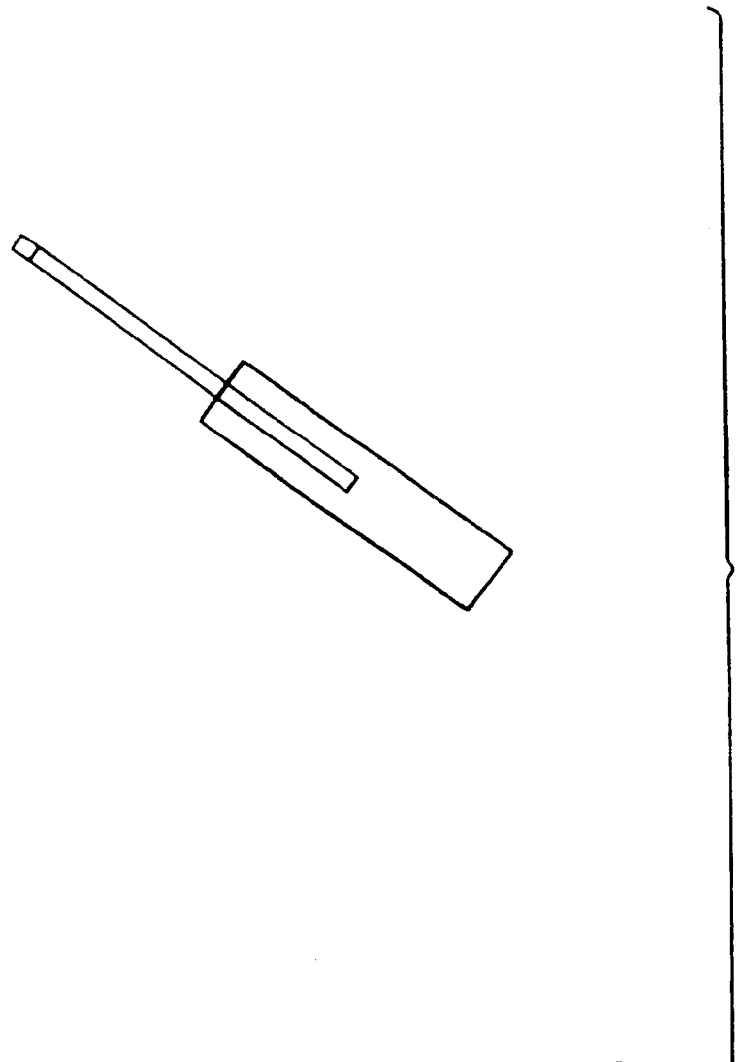
FIG. 11a shows the task space of FIG. 8a with the obstacle removed.

In the task space of FIG. 11a, the obstacle 803, previously added to the task space, has been removed again.

Figure 11B:
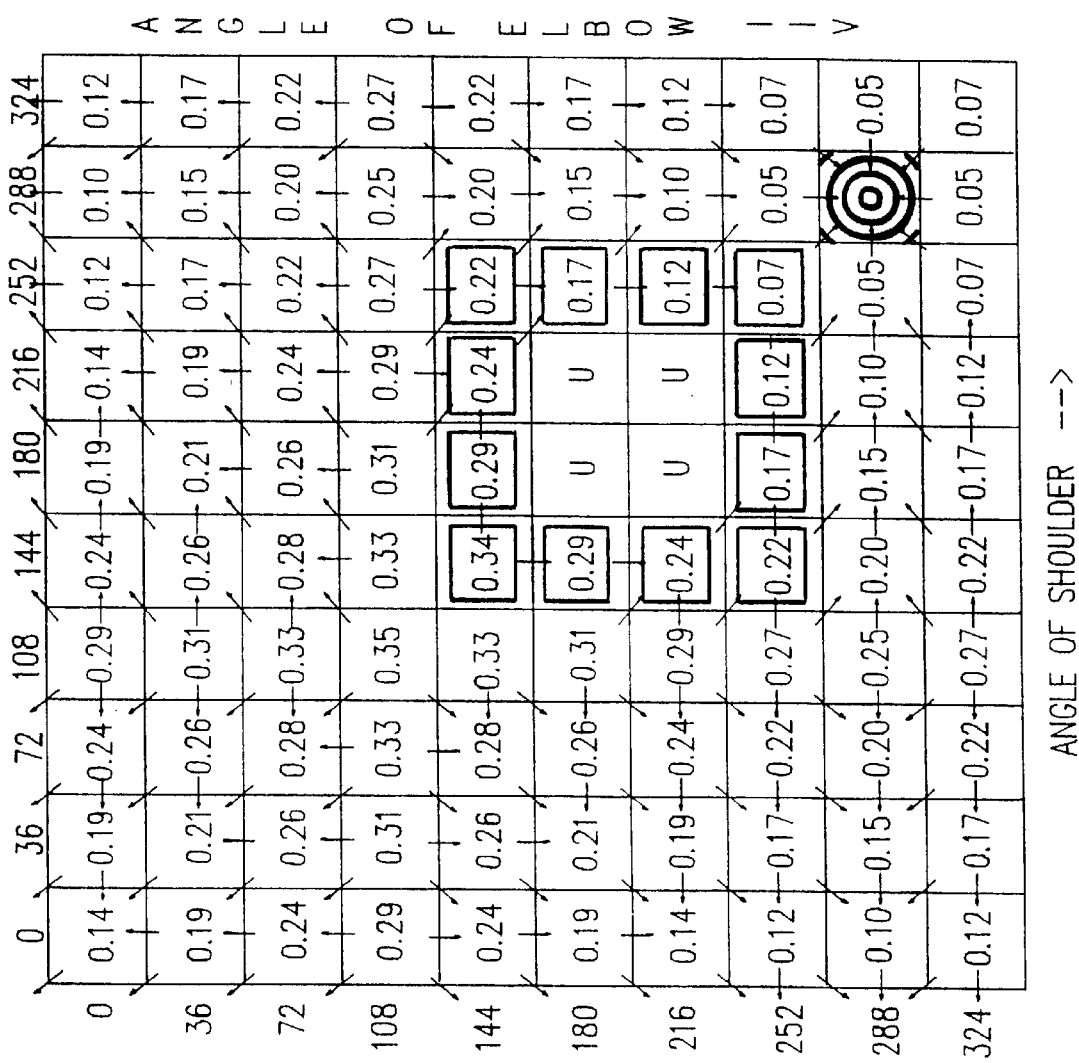
FIG. 11b shows a configuration space which has been altered by removing an obstacle and to which the method of FIGS. 1–7 has been applied.

FIG. 11b illustrates the effect of removing the obstacle 803 on the configuration space. Boxes 600, 610, and 620 yield the UNCOSTED values that are at states [180,180], [180,216], [216,180], and [216,216]. Boxes 630, 640, and 650 of FIG. 6 along with 700, 710, 720, and 730 of FIG. 7 result in the 'boxed states' that are on the perimeter of the influenced or affected region and therefore reside on the heap as of FIG. 11. The cost_to_goal fields of states [180,180], [180,216], [216,180] and [216,216] are set to UNCOSTED, and the 'boxed states', e.g. [144,144], [144,180], [144,216], etc. shown are in the heap.

Figure 12:
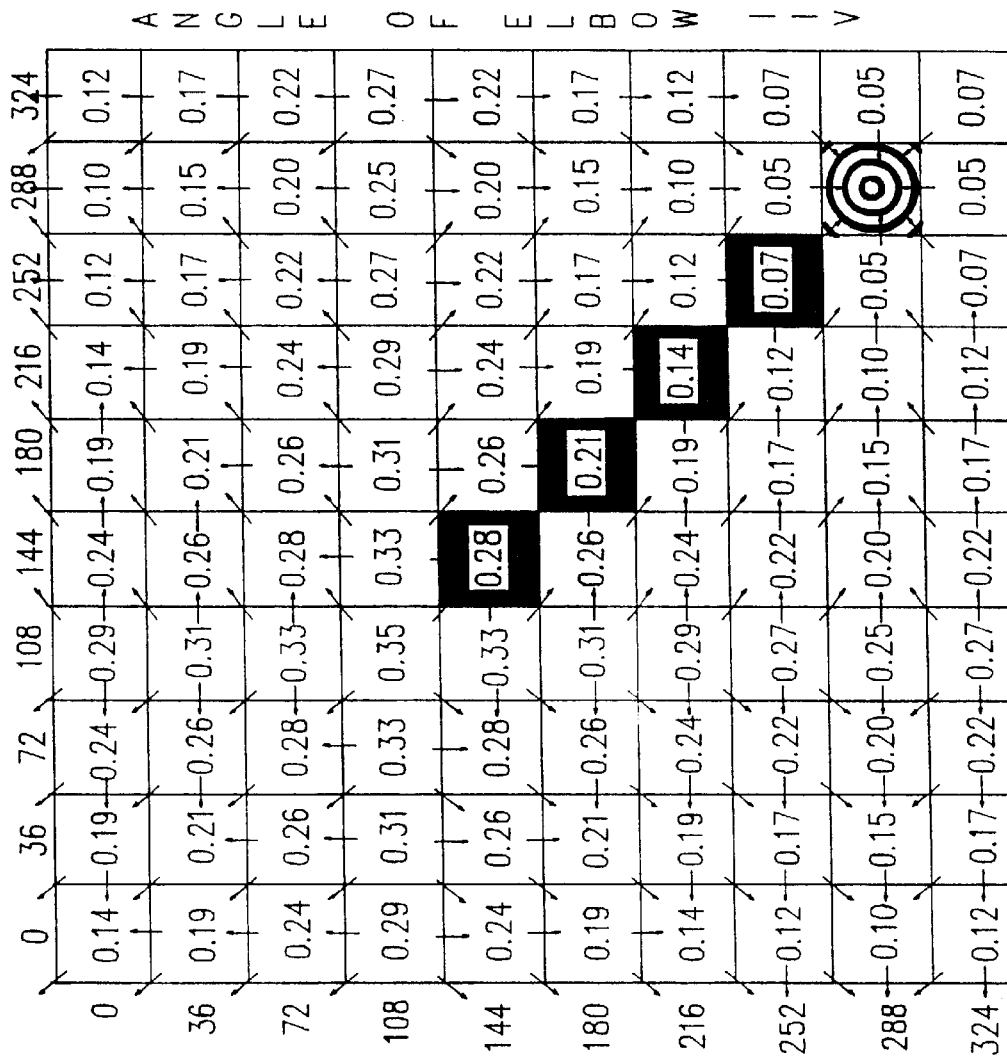
FIG. 12 shows the configuration space of FIG. 11b after budding and with a new path.

The result of budding the 'boxed states' from FIG. 11 is the stable configuration space shown in FIG. 12.

C. Adding goals.

Figure 13A:
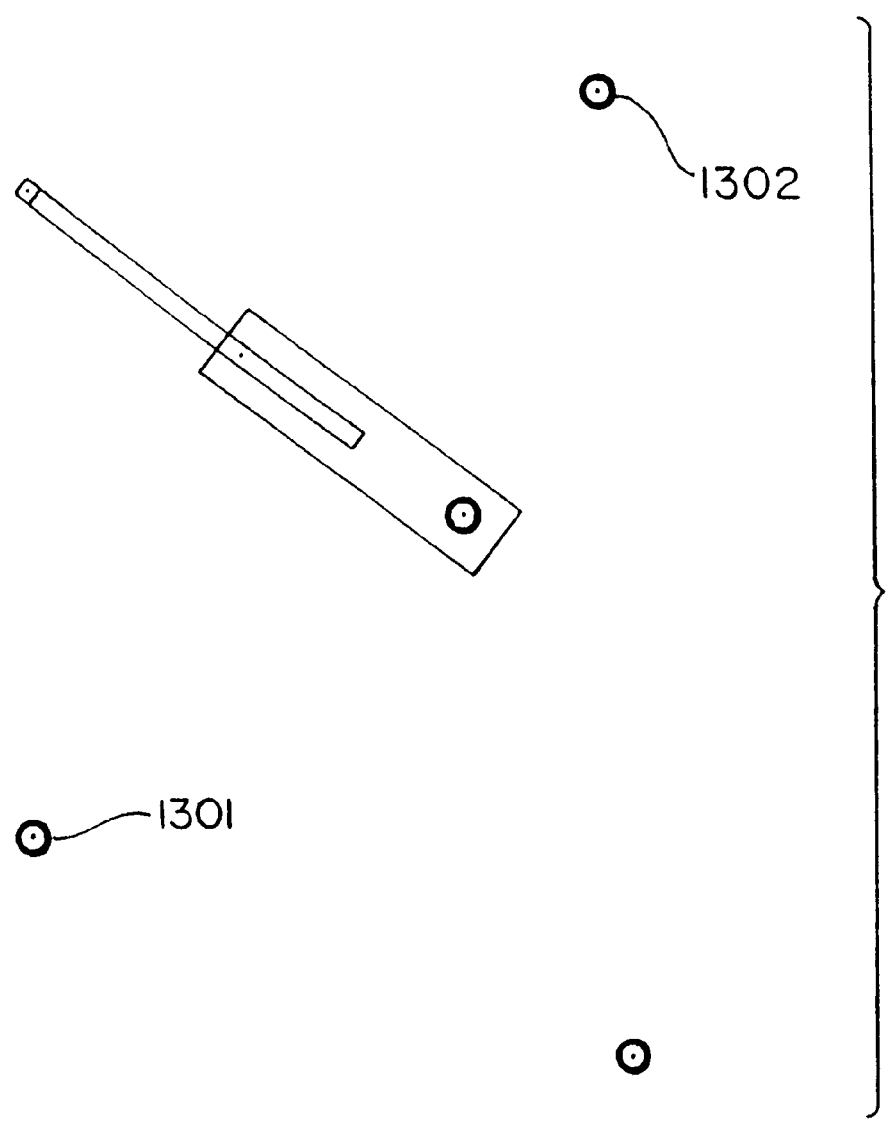
FIG. 13a shows the task space of FIG. 11a with newly added goals.

FIG. 13a shows the task space with newly added goals 1301 and 1302.

Figure 13B:
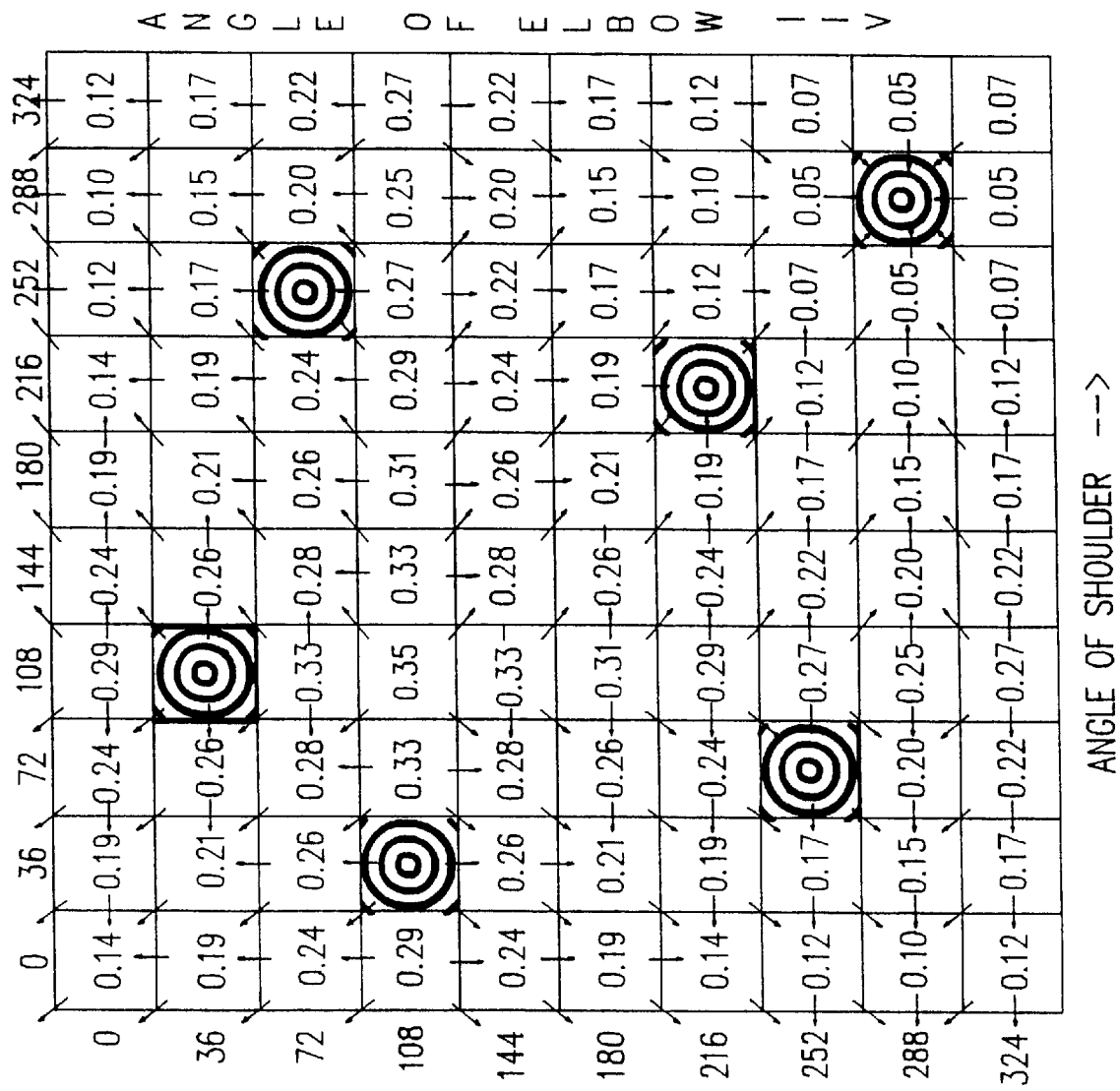

In FIG. 13b, the newly added goals are shown at goal states: [108,36], [36,108], [252,72], [72,252] and [216,216]. The goal states are cost-initialized to zero and their direction arrows are cleared. The pre-existing goal is shown at state [288,288].

Figure 14:
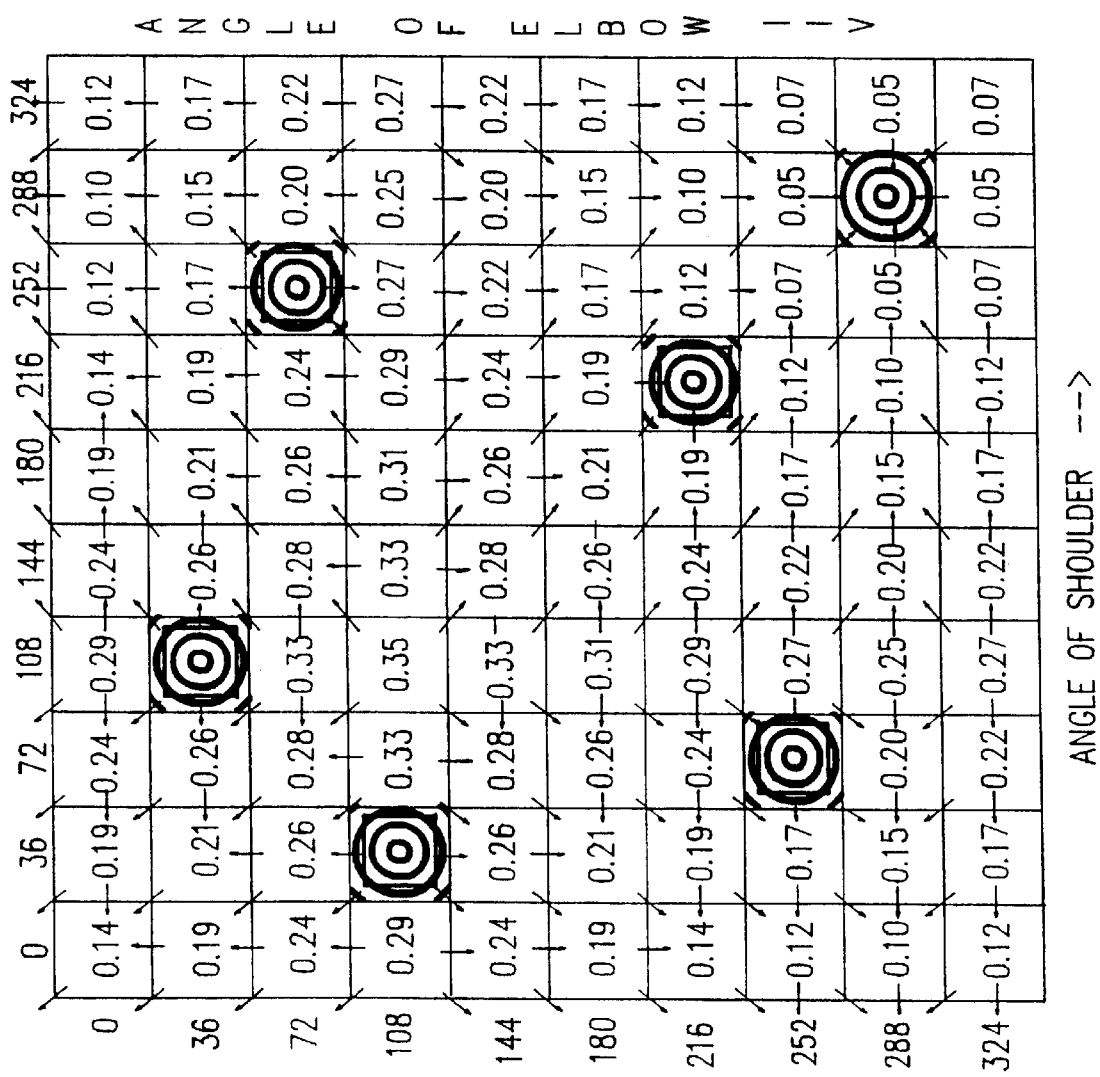
FIG. 14 shows the configuration space of FIG. 13b at a second intermediate status.

In FIG. 14, these new goals are shown in the heap. The 'boxed states' that are also goal states show boxes through the goal (target) symbol.

Figure 15:
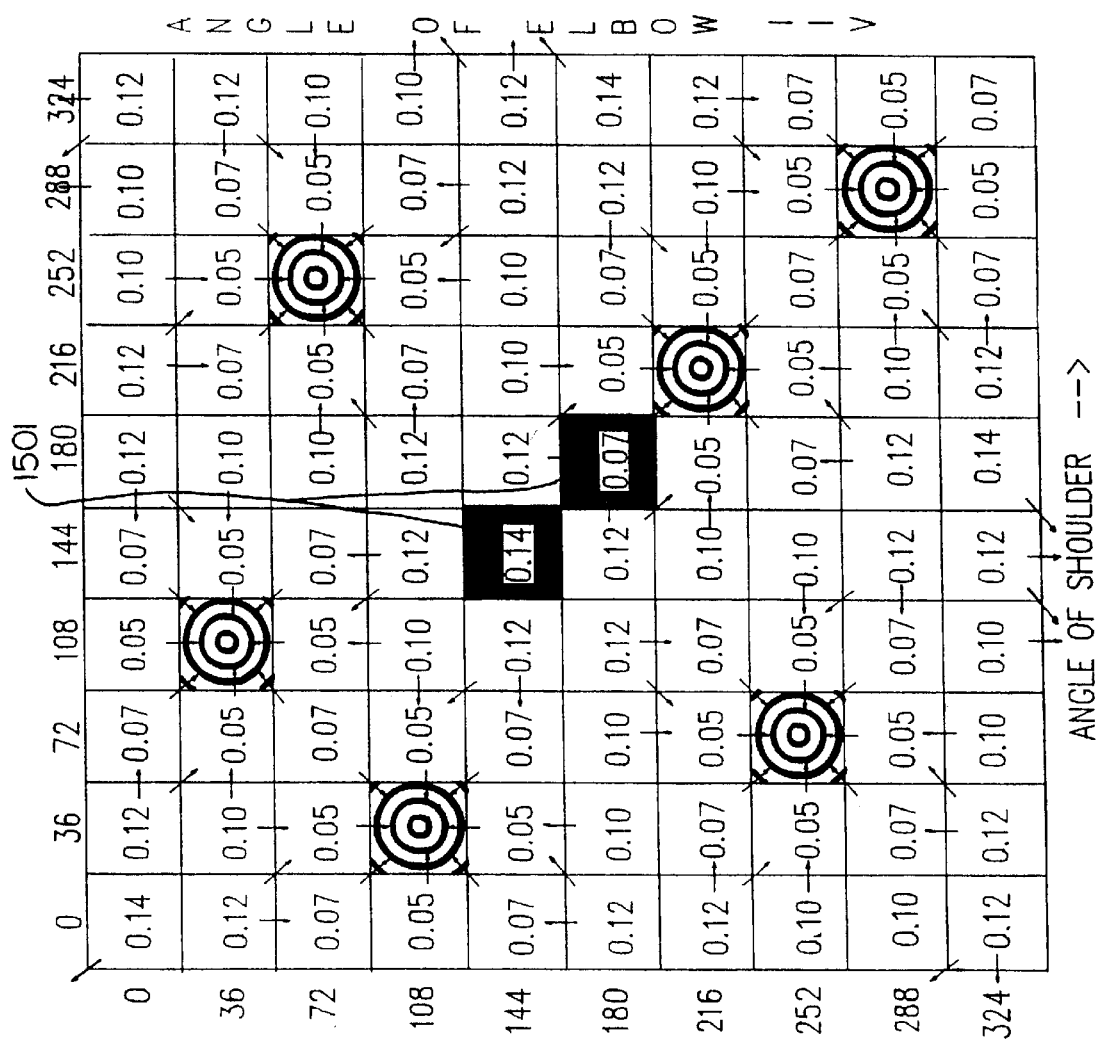
FIG. 15 shows the configuration space of FIG. 14 after budding and with a new path.

In FIG. 15. the final (stable) configuration space is shown after budding the heap, with accommodations for the new goals. A new path is also shown at 1501.

D. Removing goals.

Figure 16:
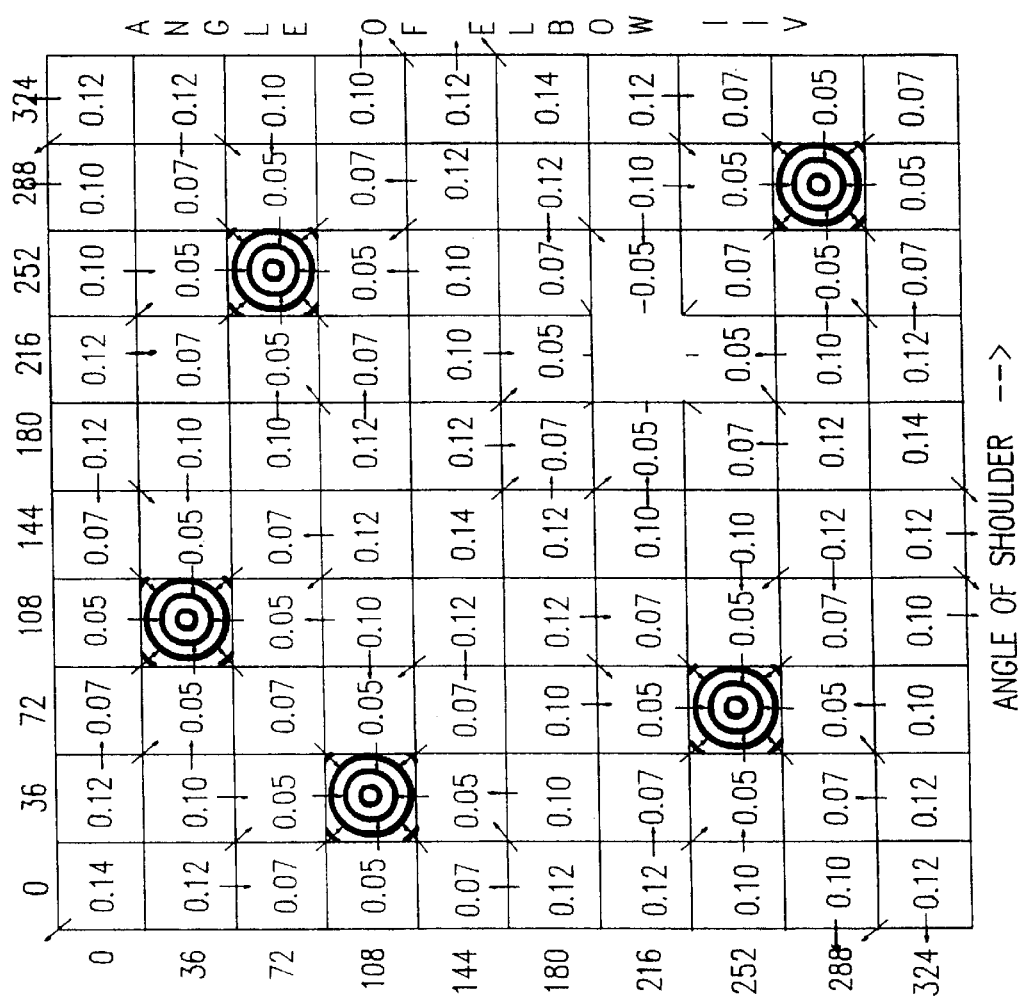
FIG. 16 shows the configuration space of FIG. 15 with a goal state removed.

FIG. 16 shows the removal of goal 1301, which corresponds to state [216,216].

Figure 17:
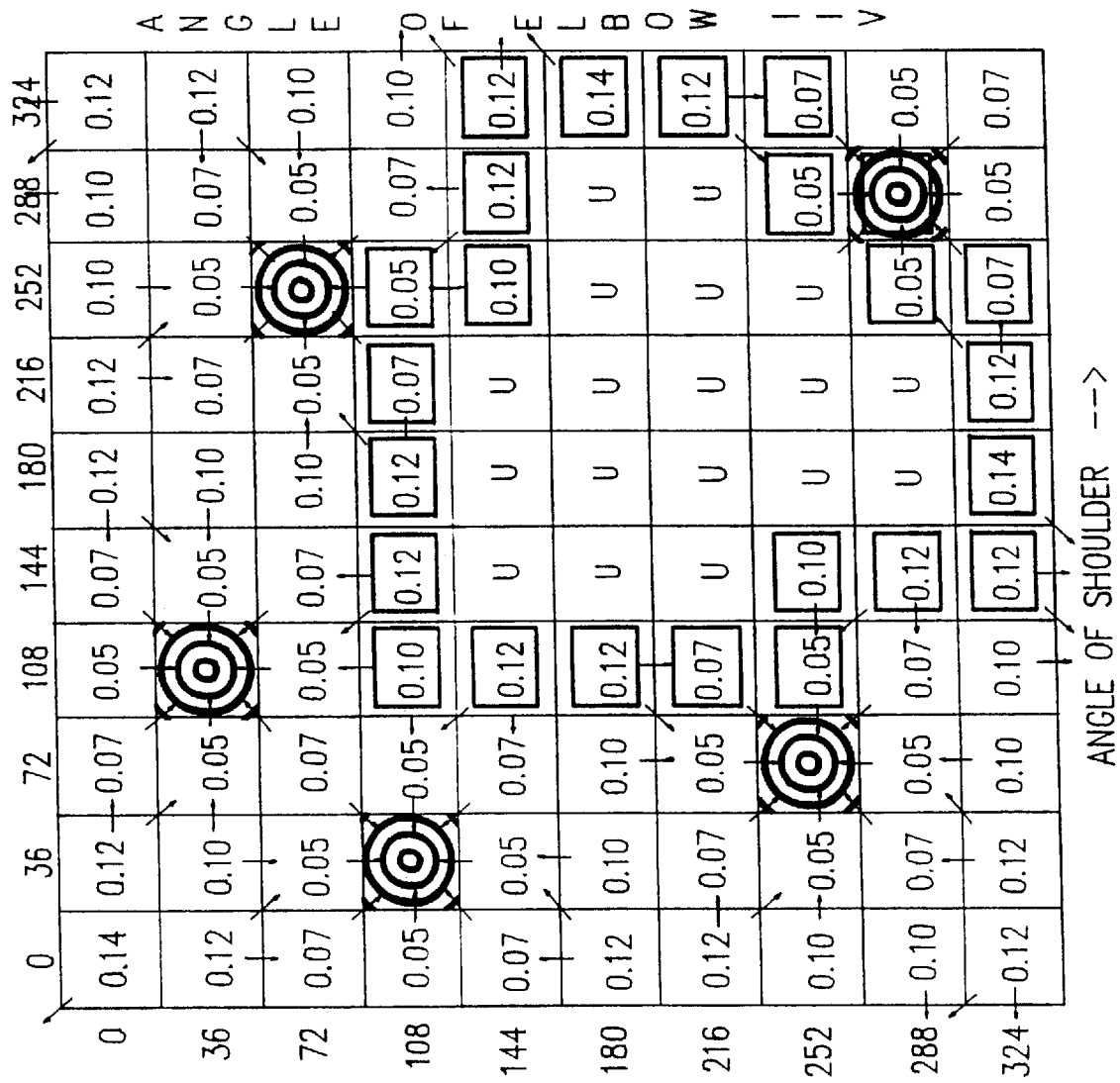
FIG. 17 shows the configuration space of FIG. 16 at an intermediate status resulting from the application of the method of FIGS. 2–7.

In FIG. 17, the area influenced by the removed goal of FIG. 16, formerly at [216,216], is shown by the area of 'UNCOSTED' states, e.g. [144,144], [180,144], [216,144], etc. The perimeter of these UNCOSTED states, along with the front edge of the obstacle, are shown as 'boxed states'. The 'boxed states' are in the heap and will be budded next. The states that are actually cleared during the 'clear influence' step 120, show a 'U' (meaning UNCOSTED) as their state cost_to_goal. Prior to the 'clear influence' step of box 120, all of these states were traceable (via direction arrows as shown in FIG. 8b) to the back of the removed goal, formerly at [216,216].

Figure 18:
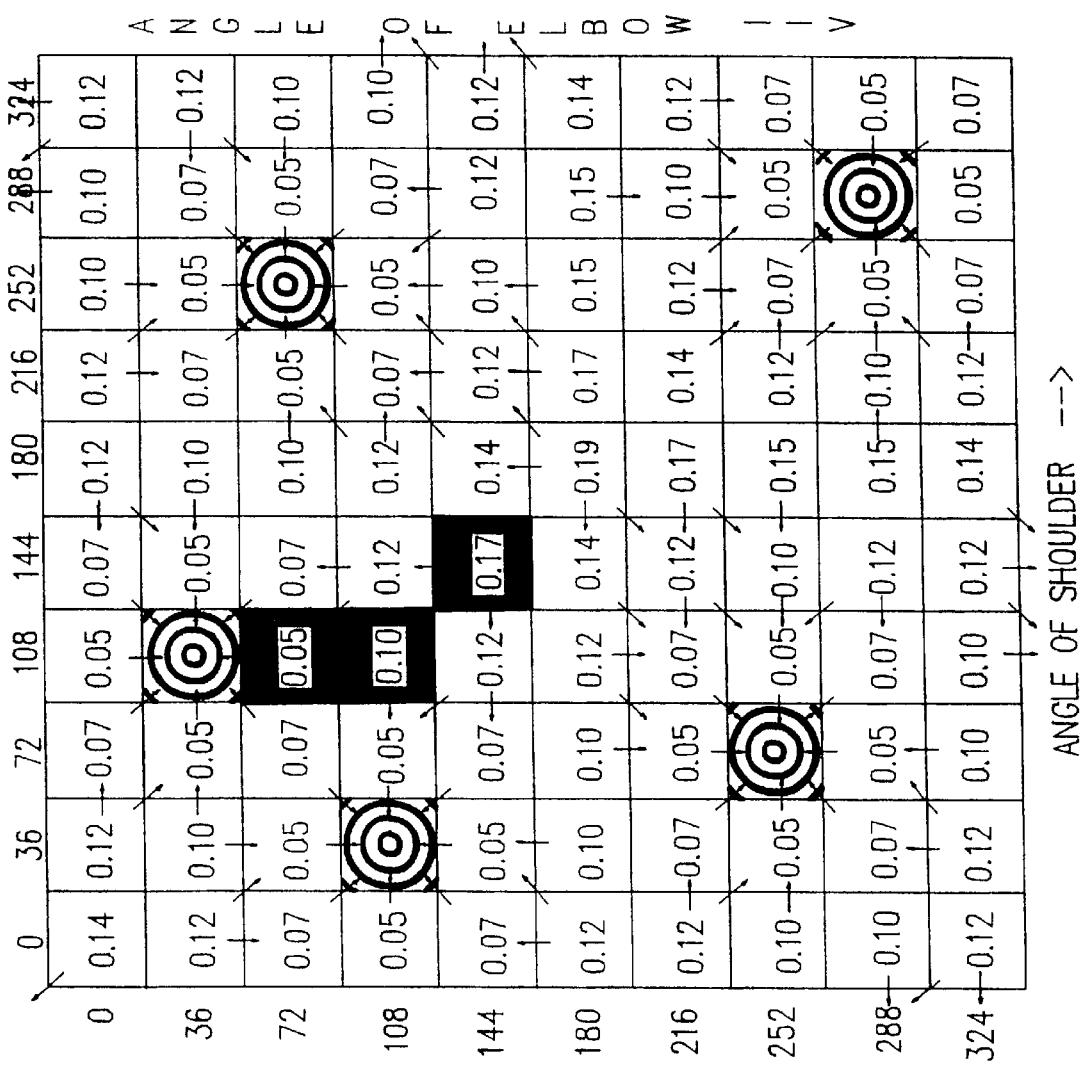
FIG. 18 shows the configuration space of FIG. 17 after budding and with a new path.

In FIG. 18, the result of Budding the configuration space starting with the 'boxed states' that were in the heap is shown. A new path appears in FIG. 18. The new path leads through states [144,144], [108,108], and [108,72] to the goal state at [108,32].

E. Adding goal and obstacle.

Figure 19A:
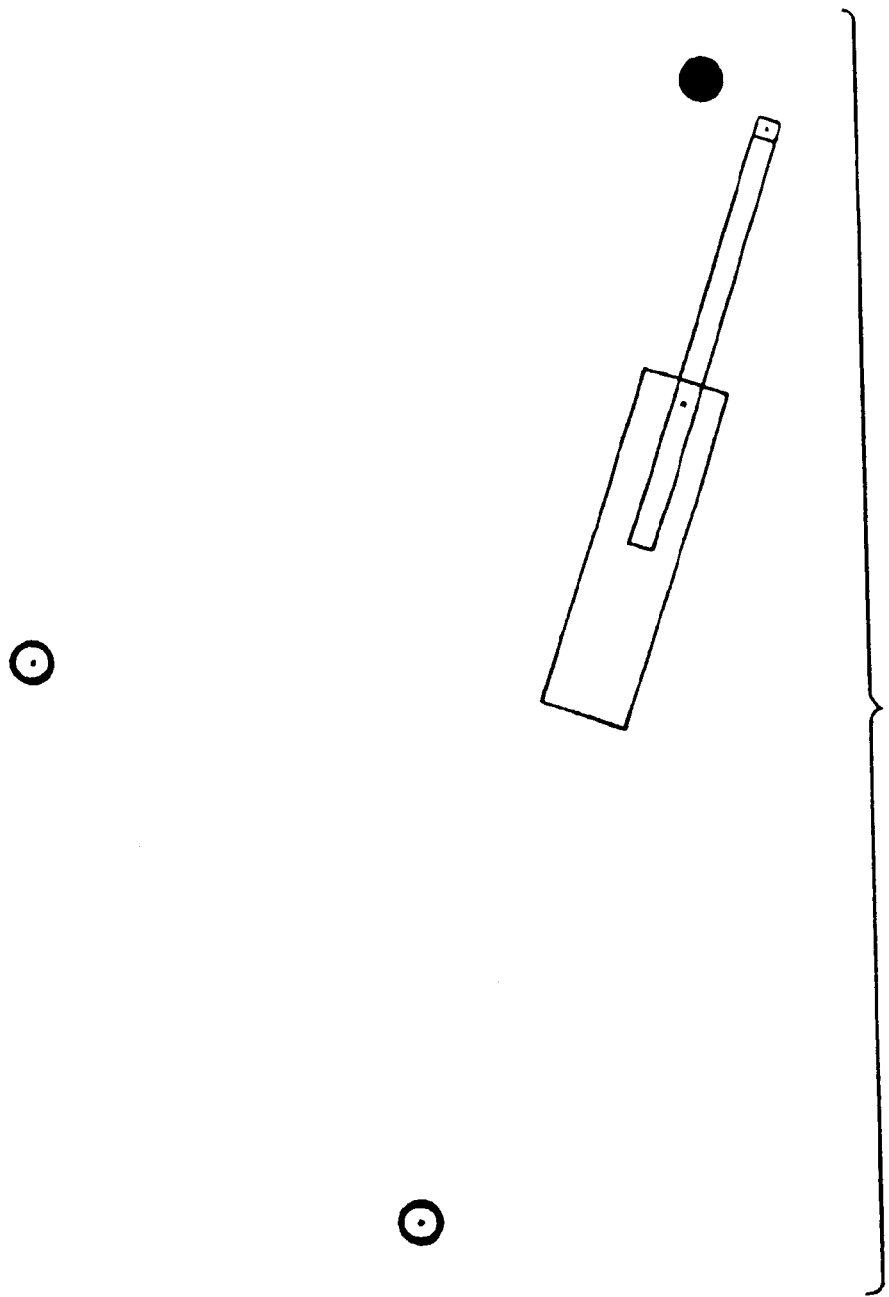
FIG. 19a shows the task space resulting in FIG. 19b.
Figure 19B:
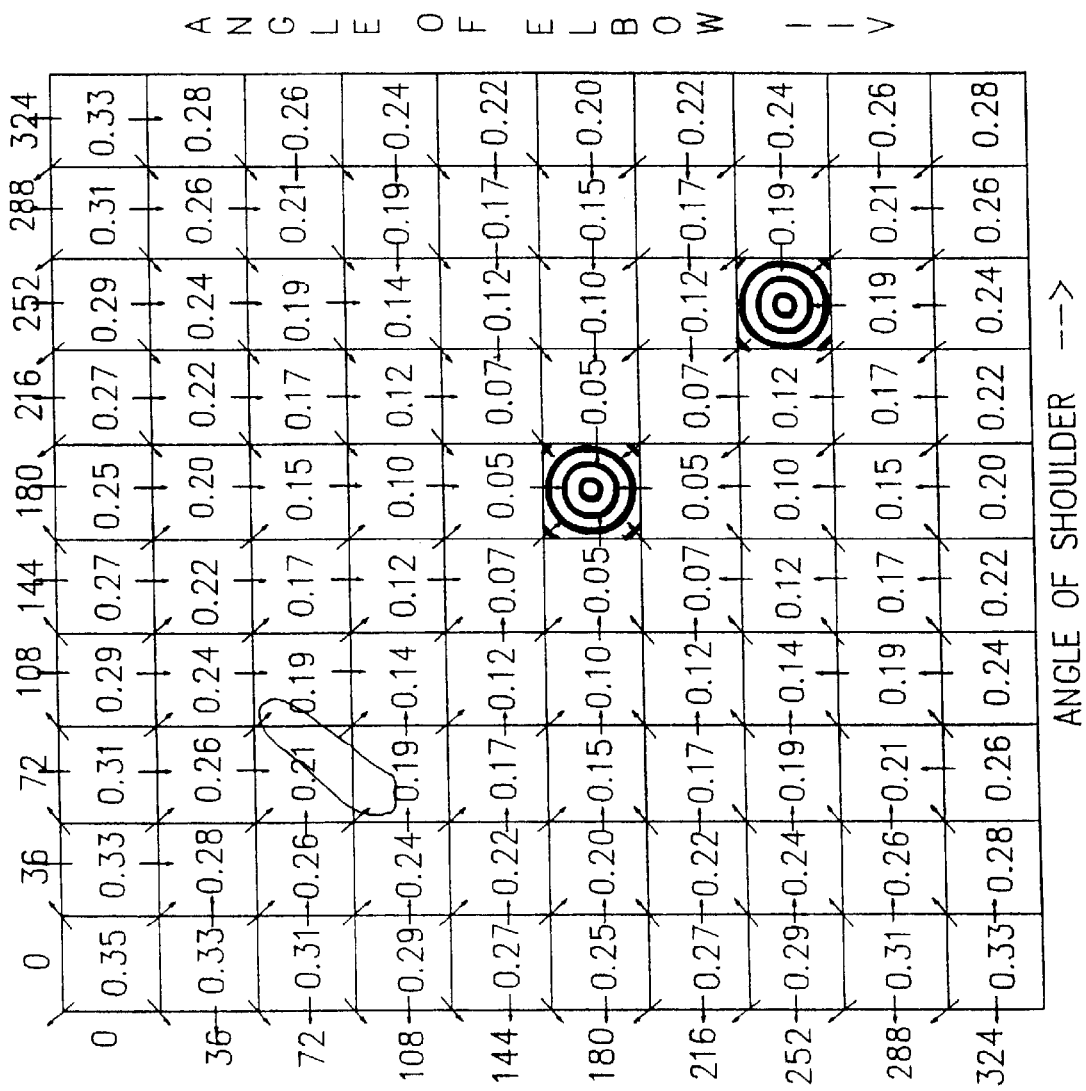
FIG. 19b shows the configuration space of FIG. 18 with a newly added goal state and a new obstacle.

In FIGS. 19a and b, a new goal located at state [252,252] and a new obstacle in the [72,72] vicinity are added at the same time.

In FIG. 20, the states of the perimeter of the influence of the discretized obstacle, and the new goal state, are stored on the heap after 'clearing the influence' 120 of the new obstacle, and are shown as 'boxed states'.

FIG. 21 shows the resulting configuration space and the new path 2101 that the robot would follow.

F. Moved obstacle and moved goal.

In FIG. 22, the obstacle has moved slightly, from 2201 to 2202, and a goal is also moved from [252,252] to [288,288]. In this situation, all four main procedures are performed simultaneously: adding and removing goal states, and adding and removing obstacle states. By moving the obstacle, some new obstacle states may be added, in this case [72,36], [36,72]; and some obstacle states may be removed, in this case [108,72] and [72,108]. State [72,72] is unaffected. The goal at [252,252] can be 'moved' by adding a goal at the new location, [288,288] in this case, and removing the goal at the old location, [252,252] in this case.

FIG. 23 shows the configuration space of FIG. 22 as it appears after the operations described in FIGS. 2–7 but before budding.

In FIG. 23, the cost_to_goal of states [108,72] and [72,108] which were formerly part of the obstacle are set to UNCOSTED. The goal at [180,180] is included on the heap because it is at the perimeter of the influence of the removed goal state [252,252]. The goal state at [288,288] is in the heap because it is going to be budded. In addition to added goals, other states on the heap are shown in 'boxed states' at the perimeters of affected areas. The cost_to_goal fields of states in the affected areas have been set to uncosted.

Figure 24:
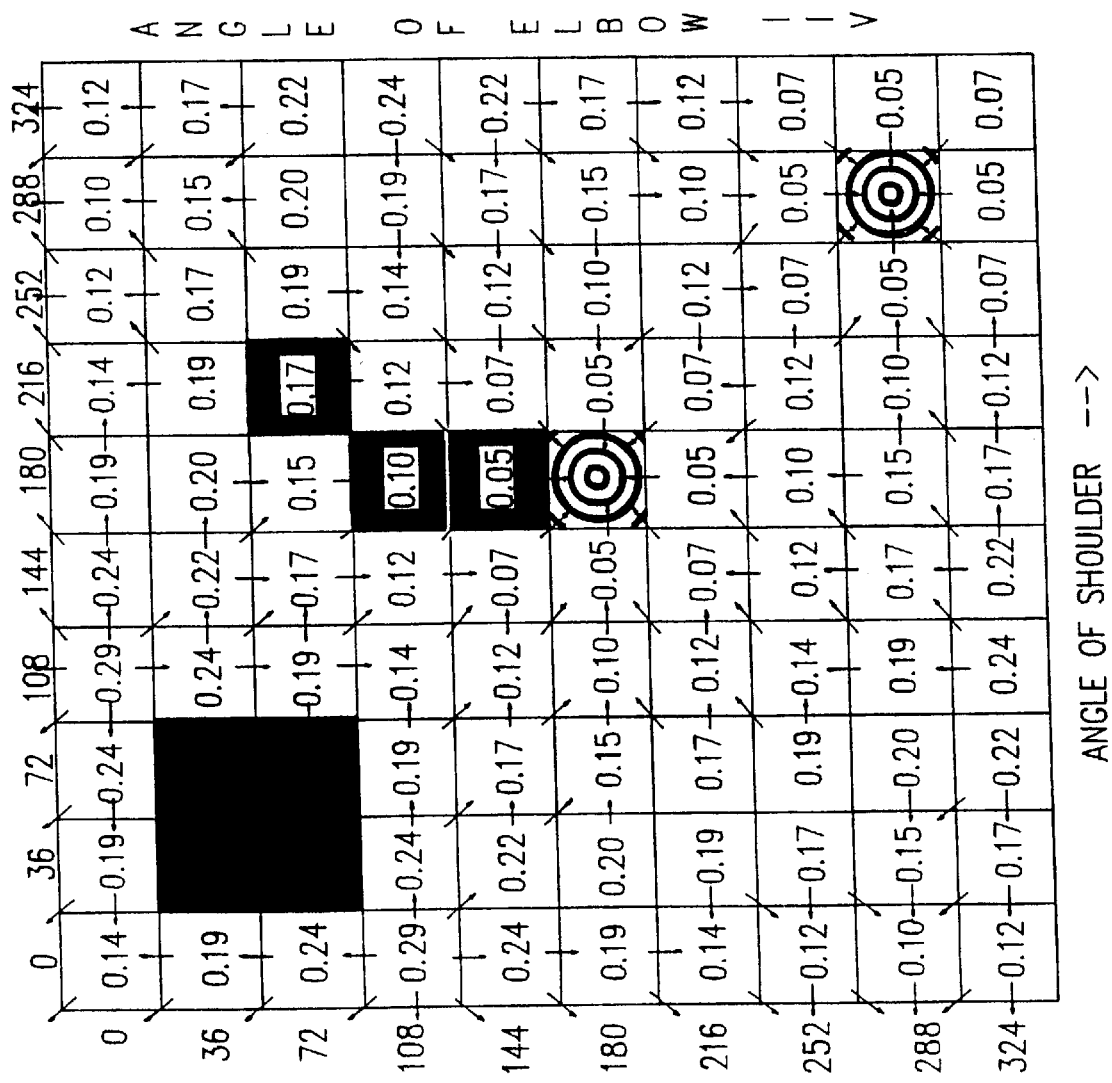
FIG. 24 shows the configuration space of FIG. 23 after budding and with a new path.

FIG. 24 shows the stable configuration space which results from budding the states which are on the heap as of the time of FIG. 23.

3. Treatment of Unknown or Unforeseen New Information

In all of the previous examples, perfect knowledge of the environment, that is, of all of the obstacles in the environment, was assumed. The invention can also handle the situation where some new information is discovered while the robot is already moving on a prescribed path. This arises when a robot does not have a vision sensor, or has a faulty one, but does have a proximity or tactile sensor of some kind. This can also arise where stored information becomes out of date. In many cases a robot may be able to learn about an environment simply by moving around, acquiring information about new obstacles or goals or removed obstacles or goals as it encounters them, and incorporating this knowledge into its configuration space. The robot can also adapt to a changing environment even if the vision sensors are not perfect. This next example shows how the method of FIGS. 1–7 can solve this problem. It should be noted that although the following description relates to added obstacles, it is equally applicable to removed obstacles, and removed and added goals.

A. Coarse configuration space.

Figure 25A:
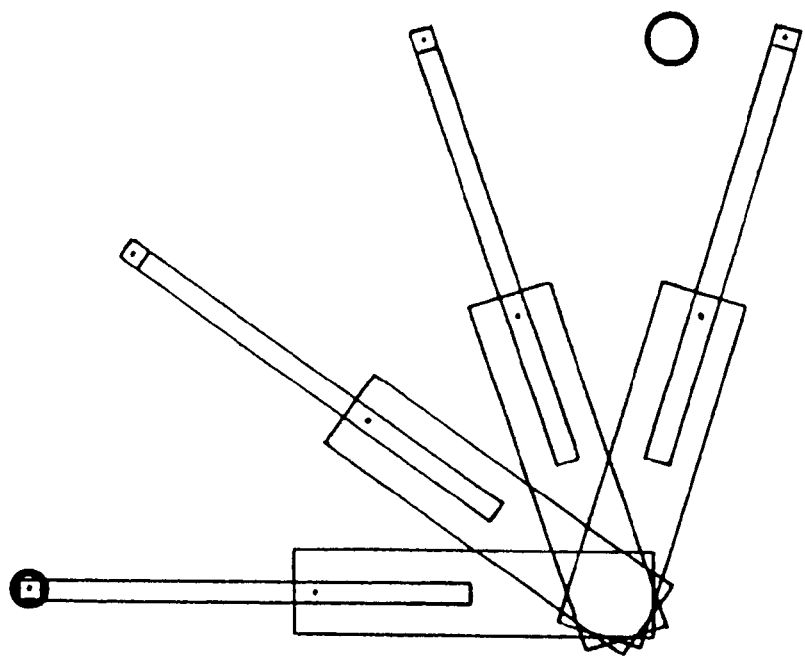
FIG. 25a shows a task space with a goal and a phantom obstacle.
Figure 25B:
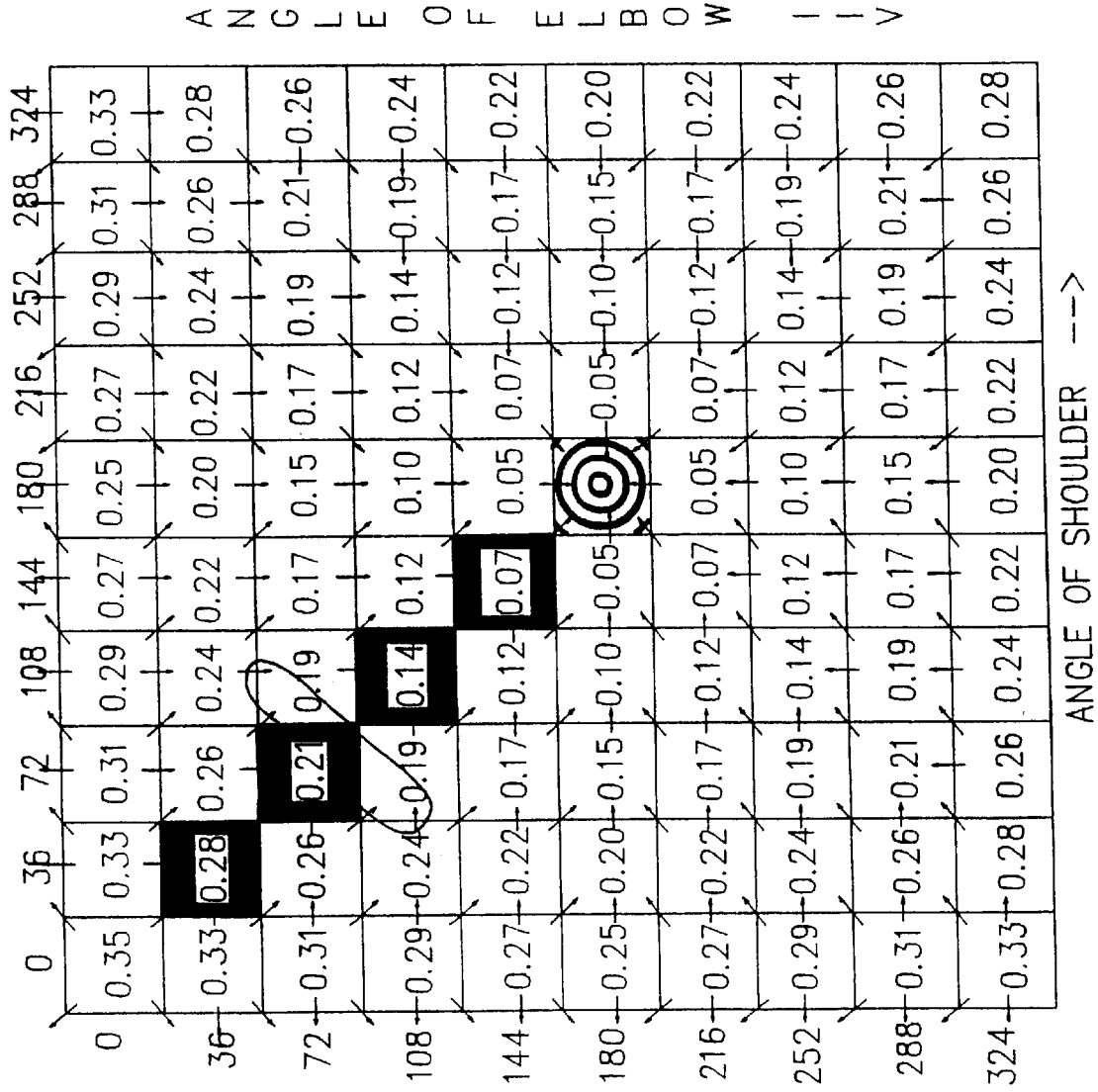
FIG. 25b shows a configuration space corresponding to the task space of FIG. 25a before the phantom obstacle is sensed.

In FIG. 25b, there is a goal state at [180,180] and the starting state is [36,36]. An unsensed (also called a phantom) obstacle is located in the area of [108,72], [72,108], [72, 72], [108,36] and [36,108]. According to the sensed, but factually incomplete information, the robot should be able to move from state [36,36] to [180,180] without obstruction. As the robot actually performs the move, the tactile or proximity sensors will report that an obstacle has been encountered at location [72,72]. FIG. 25a shows a task space corresponding to FIG. 25b.

Figure 26:
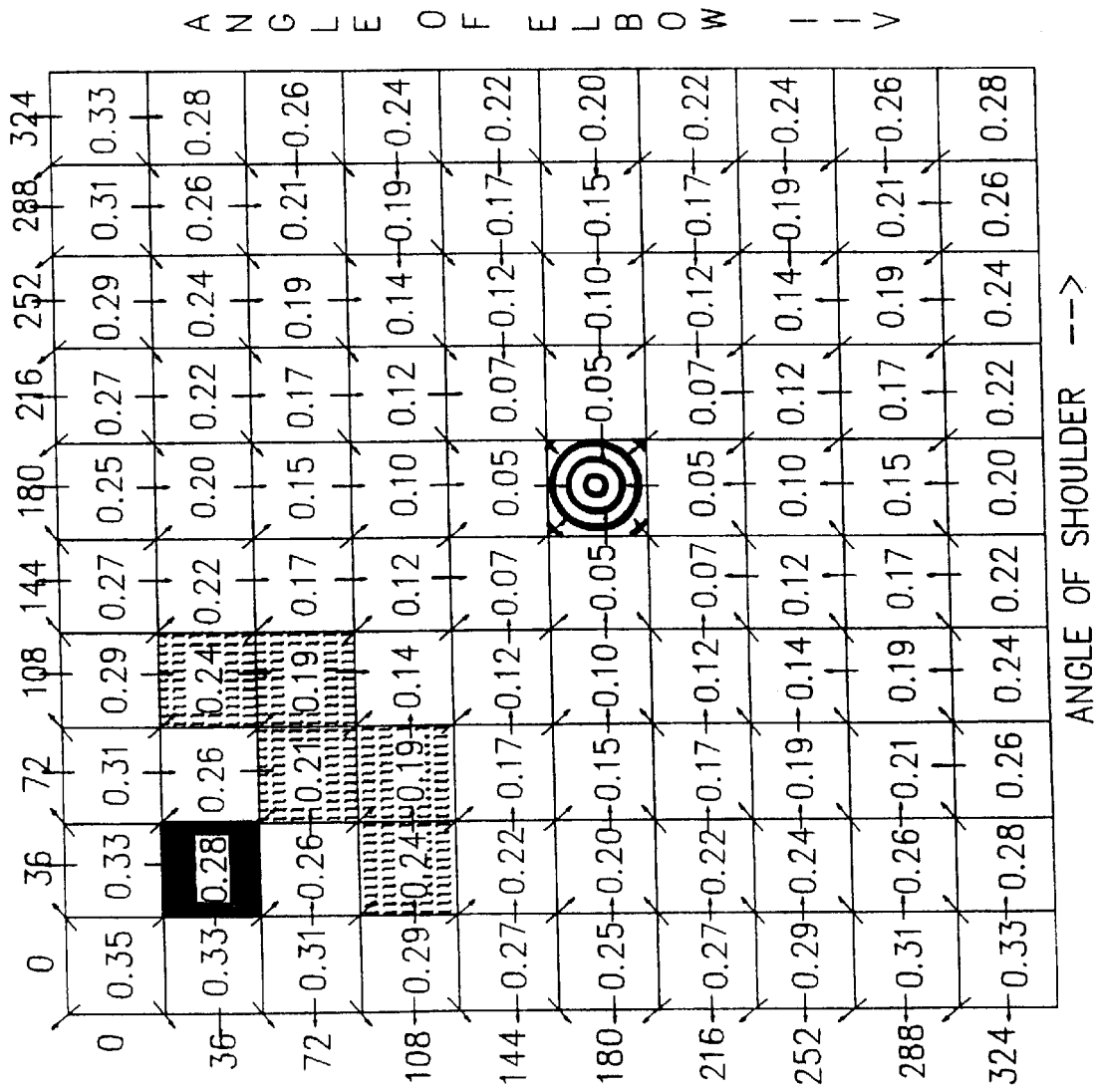
FIG. 26 shows the configuration space of FIG. 25b with the phantom obstacle discretized.

In FIG. 26, the 'phantom' obstacle is shown discretized and in half tone. Note that the direction arrows point through the phantom, because the planner is not aware that this obstacle actually exists.

Figure 27:
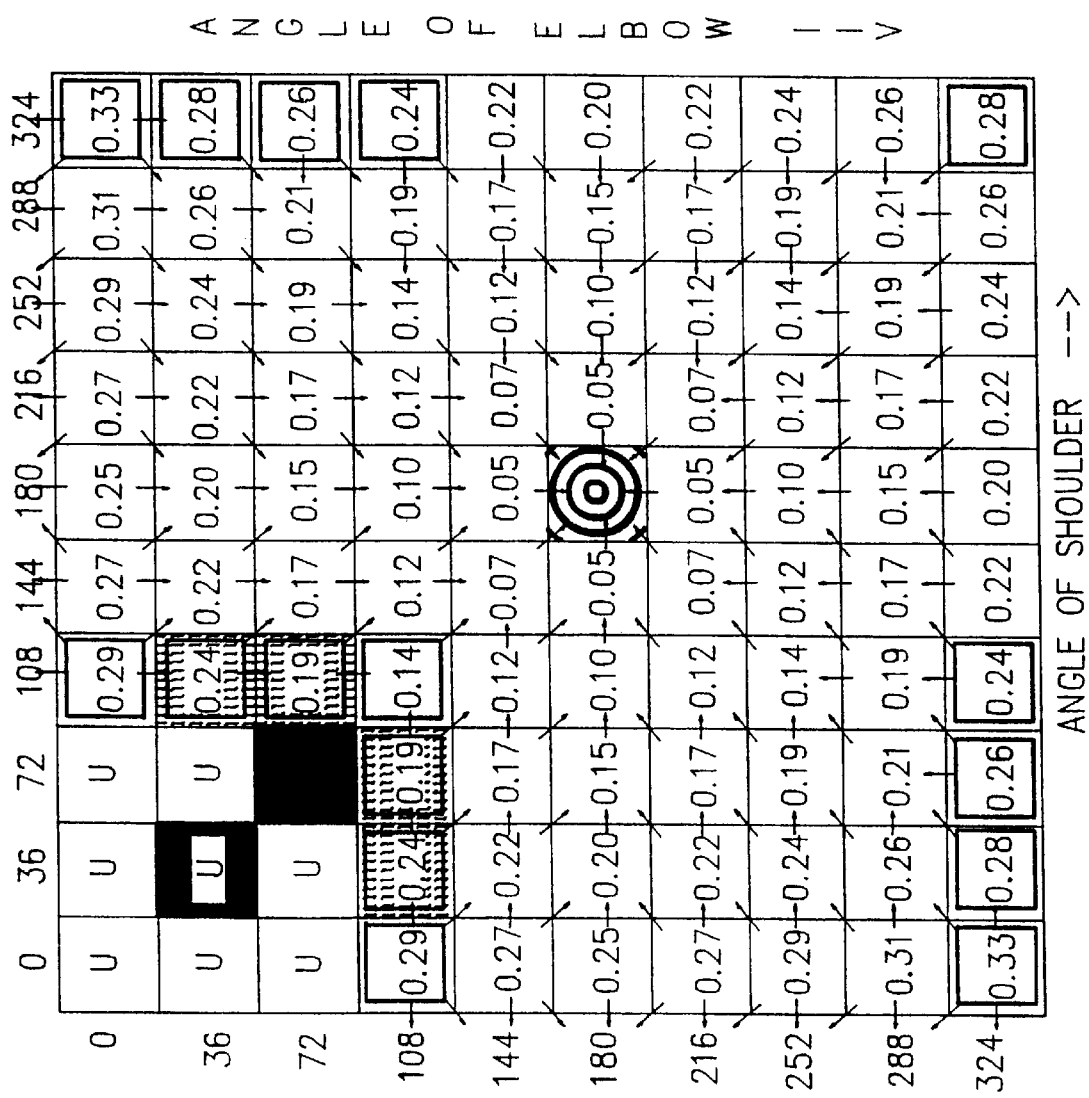
FIG. 27 shows the configuration space of FIG. 26 in an intermediate status after the robot first encounters the phantom obstacle and after the application of the method of FIGS. 2–7.

In FIG. 27, the robot takes its first step along the prescribed path, but at its next step senses an obstacle state at [72,72]. The newly discovered obstacle state is treated the same as a newly added obstacle. The perimeter of configuration space that this new obstacle state affects is shown in FIG. 27 as 'boxed states' and is added to the heap. States affected by the newly discovered obstacle at [72,72] have their cost_to_goal fields set to UNCOSTED. Thus FIG. 27 shows a configuration space in which the portion of the phantom obstacle corresponding to state [72,72] has been sensed and in which the method of FIGS. 1–7 has been performed, inasfar as it relates to newly added obstacles.

Figure 28:
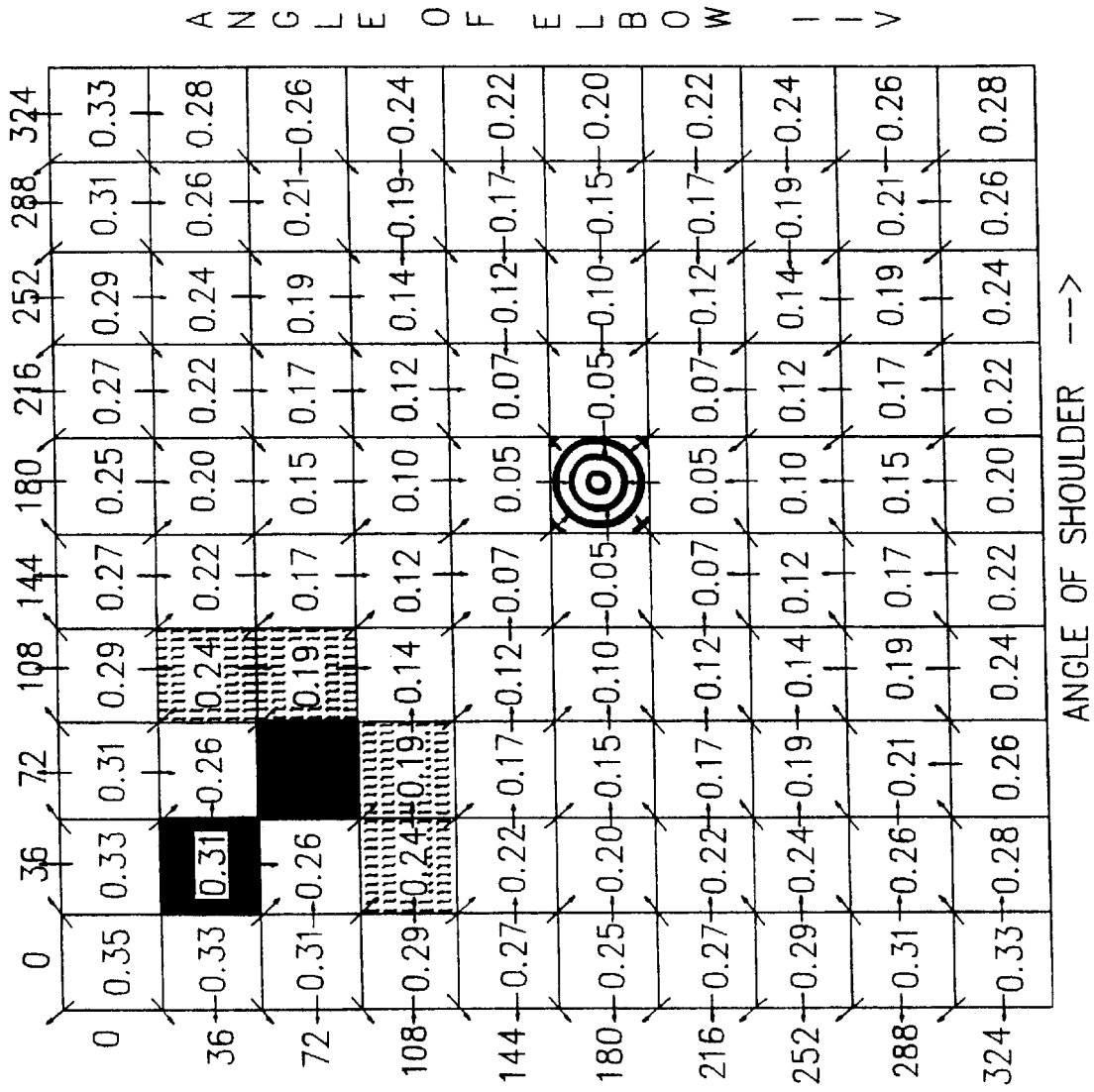
FIG. 28 shows the configuration space of FIG. 27 after budding.

In FIG. 28, the stable configuration space corresponding to FIG. 27 is shown. FIG. 28 is generated by budding the states which are on the heap at the time of FIG. 27. FIG. 28 thus takes into account the newly discovered information about the phantom obstacle.

Figure 29:
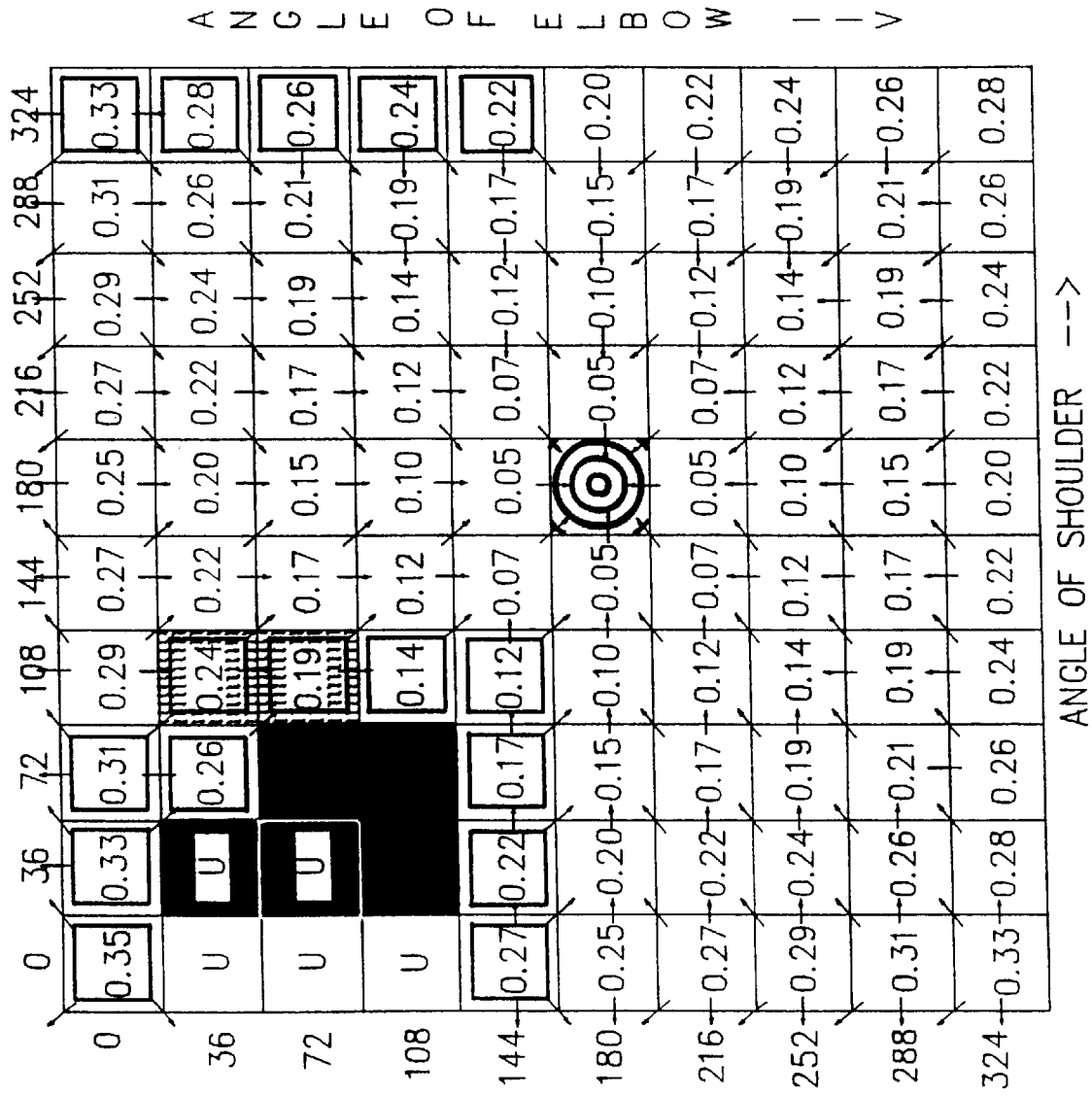
FIG. 29 shows the configuration space of FIG. 28 in an intermediate status after the robot encounters the phantom obstacle for the second time and after the application of the method of FIGS. 2–7.

In FIG. 29, the robot has followed the newly calculated path, shown in FIG. 28. The robot thus moved from the position of FIG. 28 (state [36,36]) to state [36,72]. The robot then tried to move to state [72,108]. At [72,108], however, the robot sensed another obstacle, which is therefore indicated in black meaning that it has been recognized as an obstacle.

At this point, it should be noted that many techniques can be used for following the path with sensing capabilities enabled. The method shown is simple. If an obstacle is sensed, then the immediate neighbor states are also checked for obstacle existence. Therefore, in this case, the path follower has also sensed the obstacle state [36,108]. State [36,108] is therefore also indicated in black, meaning that it has been recognized as an obstacle.

In practice, if the motion controller of a robot has a proximity and/or tactile sensors and could pinpoint the point at which contact with an obstacle occurred, then the entire set of obstacle states in the configuration space corresponding to that point could be directly determined. If many obstacle states can be obtained en masse, only one differential budding "session" will be necessary to compensate for one obstacle point in task space. In the above example, only a few states at a time are discovered requiring several differential budding sessions. It can be seen, then, that, although the path following mechanism does not actually impact the method as it applies to phantom obstacles, it does affect the number of times the method is applied. It should be noted that if the object is a car, the path following mechanism is a driver, who can make fairly sophisticated observation about changes in the environment which can be reported back.

The edge of the 'cleared influence' area is once again added to the heap and is shown by the 'boxed states'.

Figure 30:
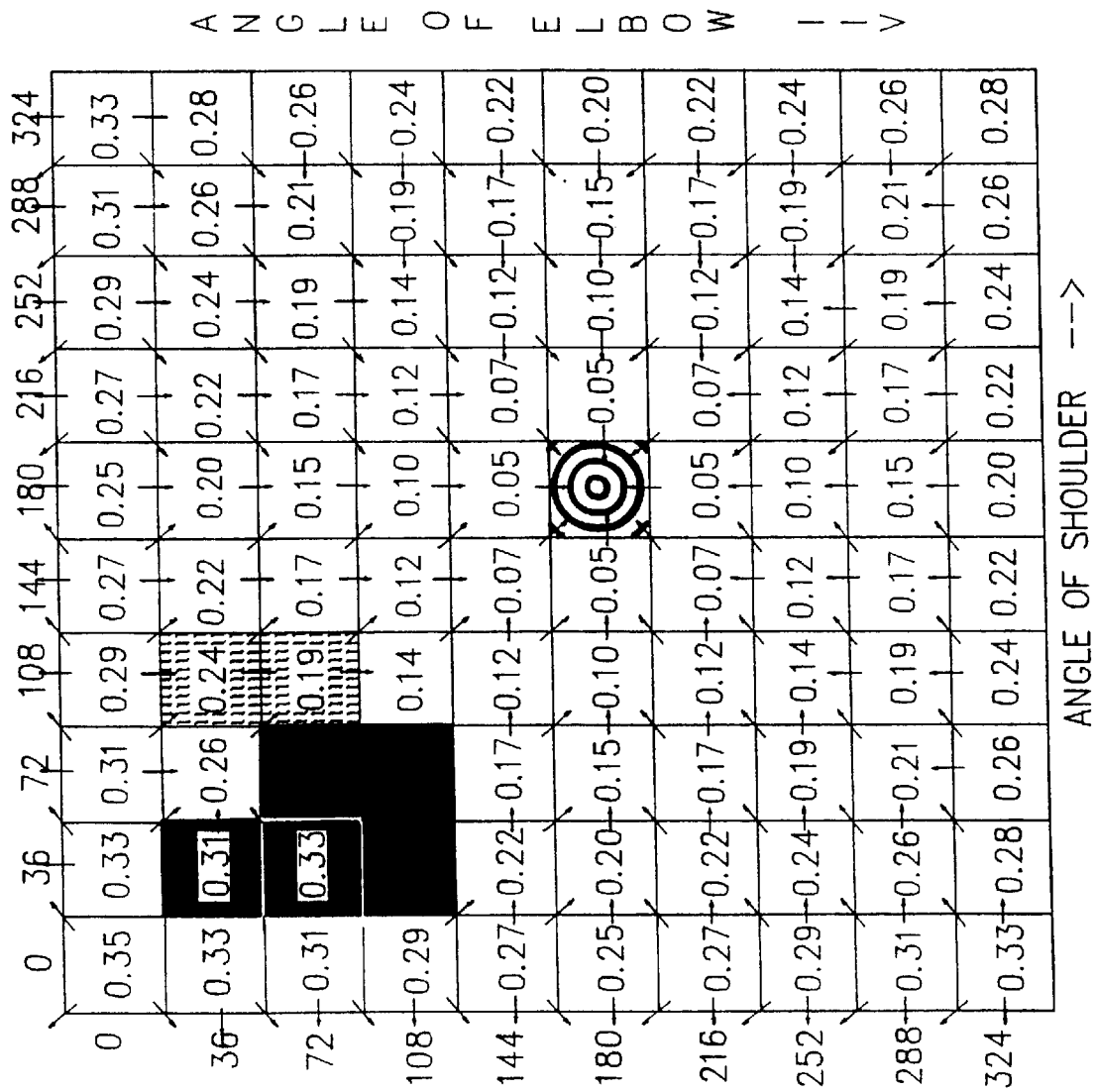
FIG. 30 shows the configuration space of FIG. 29 after budding.

In FIG. 30, the stable configuration space shown is the result of 'budding' the states on the heap as of the time of FIG. 29. In the configuration space of FIG. 30, the portions of the phantom obstacle at [108,36] and [108,72] remain unsensed. Therefore direction arrows continue to point at those portions.

Figure 31:
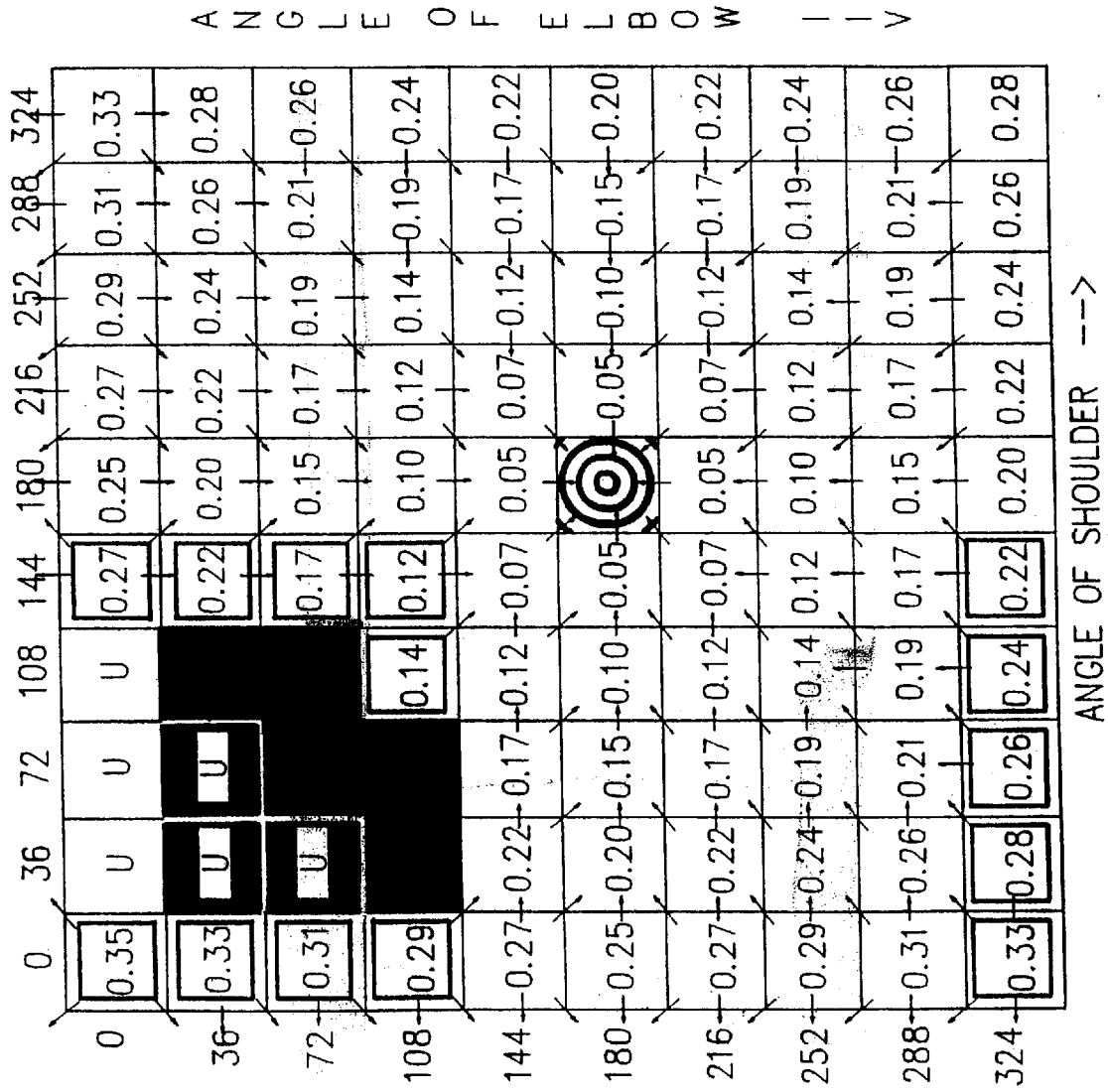
FIG. 31 shows the configuration space of FIG. 30 in an intermediate status after the robot encounters the phantom obstacle for the third time and after the application of the method of FIGS. 2–7.

In FIG. 31, the robot has followed the newly planned path to state [72,86], because the sensed information did not show an obstacle at this state. It then attempted to move to [108,72] which is a phantom obstacle state. According to the present path following mechanism, [108,36] was therefore also sensed as a phantom obstacle state. At this point, the entire 'phantom obstacle' has been sensed. Therefore the entire phantom obstacle, consisting of states [36,108], [72, 72], [72,108], [108,36], and [108, 72], is now indicated in black. 'Boxed states' are on the heap, indicating the perimeter of the area affected by the newly discovered portions of the phantom obstacle. The 'boxed states' do not entirely surround the obstacle, because only part of the obstacle is newly discovered. States whose direction arrows previously pointed to the undiscovered part of the obstacle have had their cost_to_goal fields set to UNCOSTED.

Although the present example resulted the sensing of the entire 'phantom obstacle', it is often necessary to only sense part of the obstacle before an optimal path is found that does not lead into the obstacle.

Figure 32:
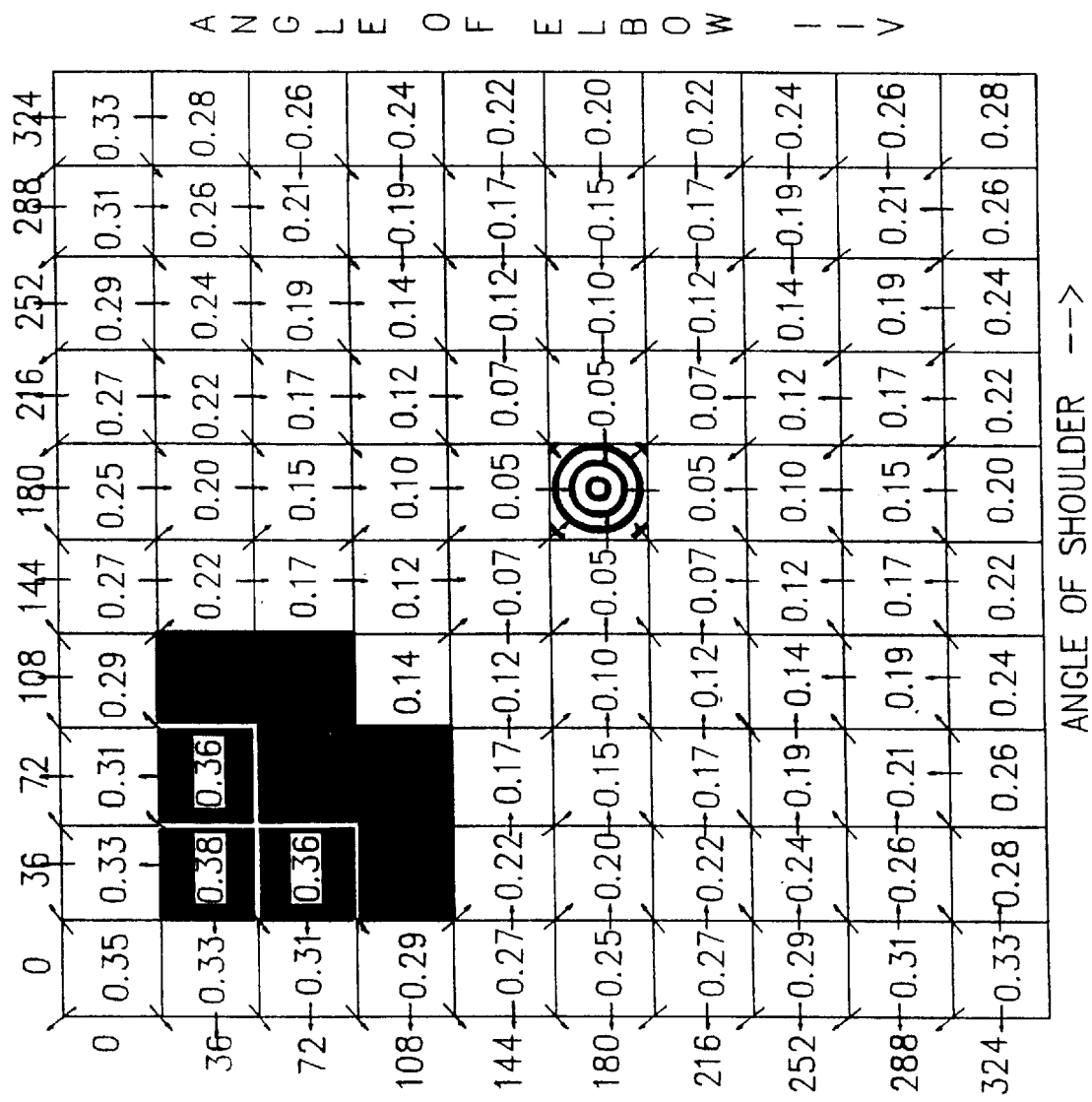
FIG. 32 shows the configuration space of FIG. 31 after budding.

FIG. 32 shows the stabilized configuration space of FIG. 31 after the states on the heap have been budded.

Figure 33:
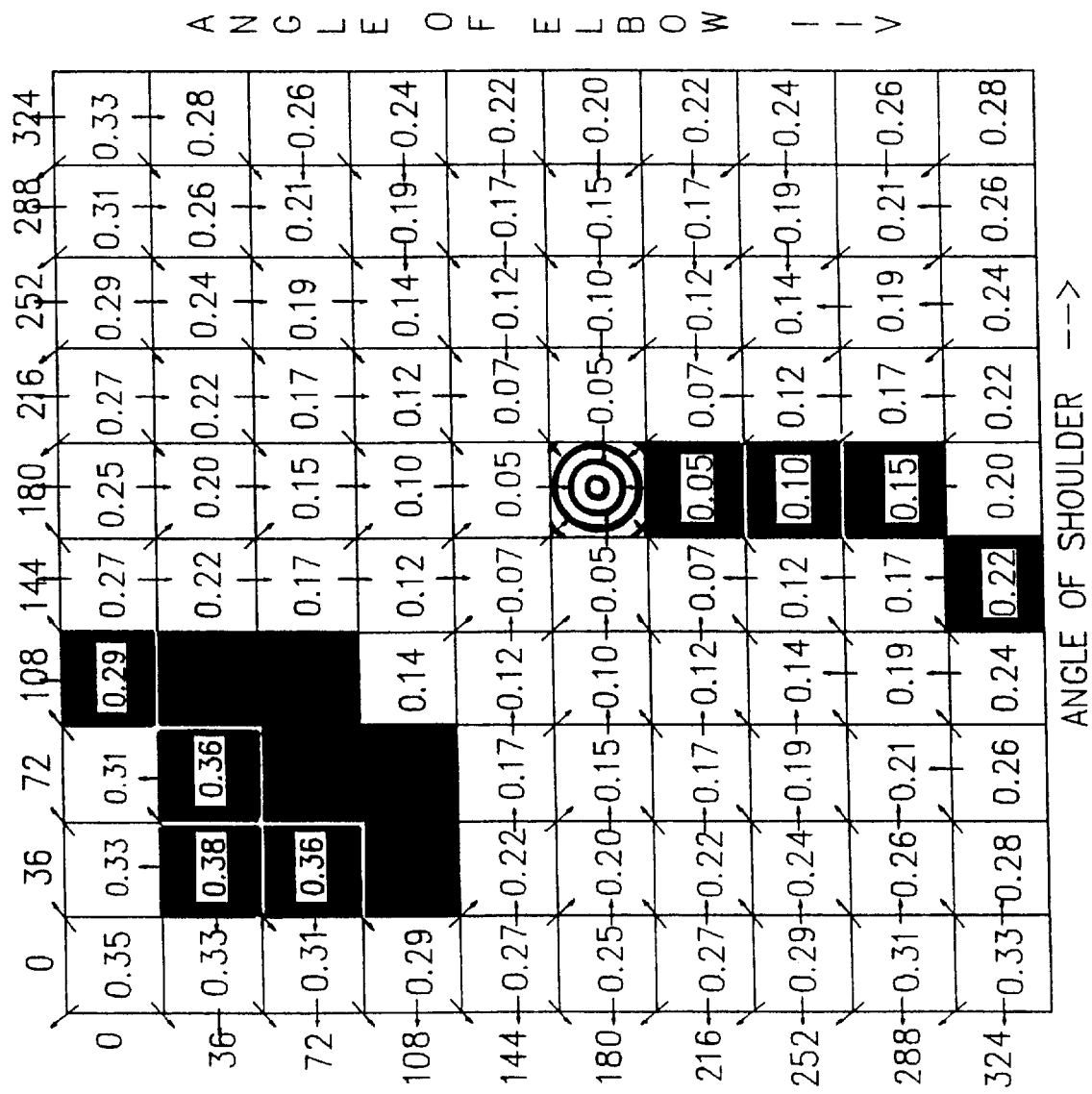
FIG. 33 shows the configuration space of FIG. 32 with the newly calculated path.

In FIG. 33, the path has been marked on the configuration space of FIG. 32. The robot can now follow the prescribed path from [72,36] to [108,0], [144,324], [180,288], [180, 252], [180,216], and finally to the goal [180,180] without further difficulties.

This technique works equally well with other metrics, in higher resolutions and dimensions, and with different numbers of neighbors.

B. Fine configuration space.

A finer resolution (64 by 64) example with 16 neighbors, i.e., sixteen possible direction arrows for each state, using 'distance minimization of the end-effector' criterion as the variable metric follows.

Figure 34A:
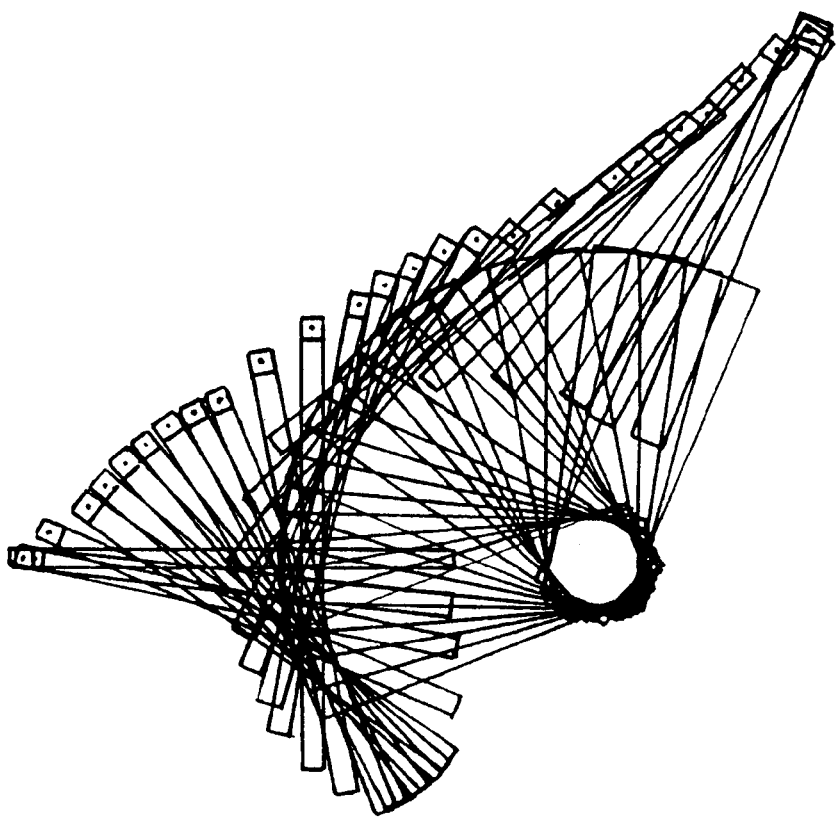
FIG. 34a shows a task space with one goal and a two-link robot following a path which minimizes the distance of travel of the end-effector.

FIG. 34a shows a task space in which a two-link robot follows a path determined by a criterion which seeks straight line motion of the end effector.

Figure 34B:
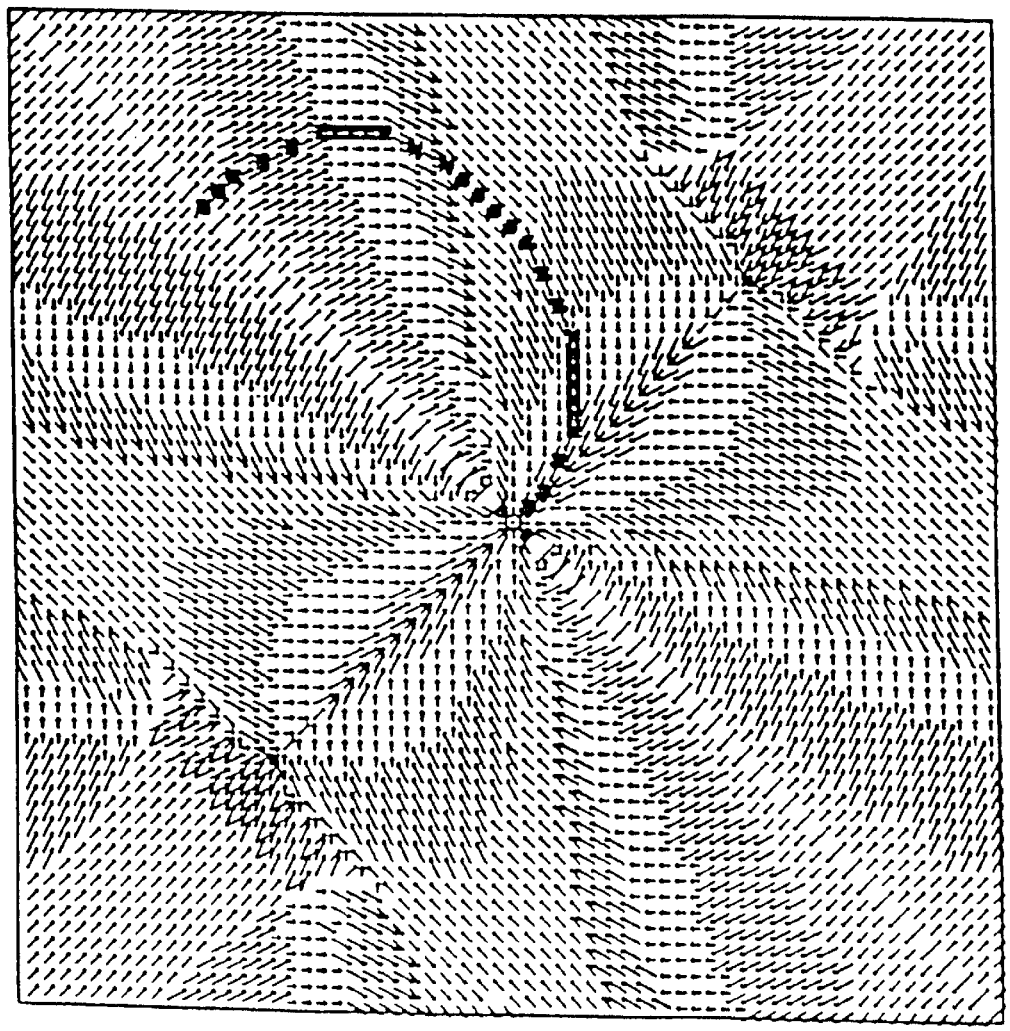

FIG. 34b shows the configuration space which corresponds to FIG. 34a. The states in this configuration space are only indicated by their direction arrows, because the resolution is too fine to indicate cost to goal values or to allow squares to be marked around the states. The configuration space of FIG. 34b shows the space variant metric which results from the criterion of seeking straight line motion of the end effector.

Figure 35A:
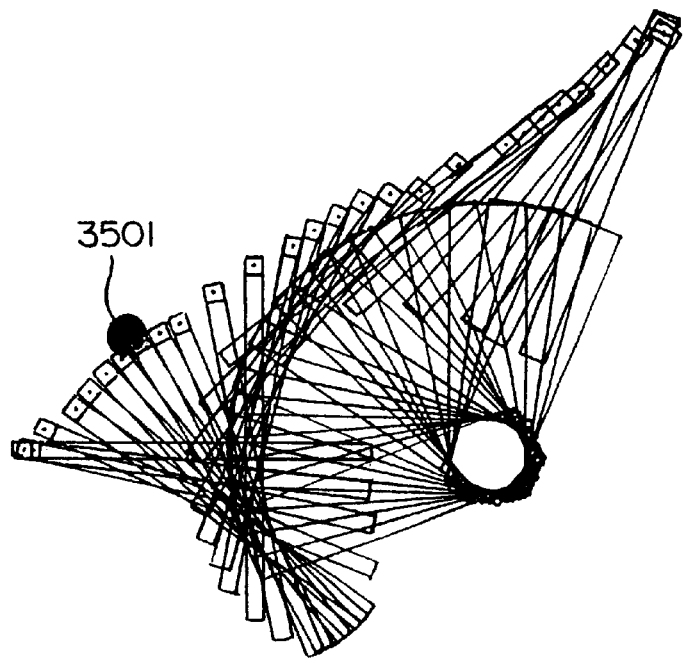
FIG. 35a shows the task space of FIG. 34a with a newly added obstacle.

FIG. 35a shows the task space of FIG. 34a, with a newly added obstacle 3501. The newly added obstacle 3501 blocks the previously planned path.

Figure 35B:
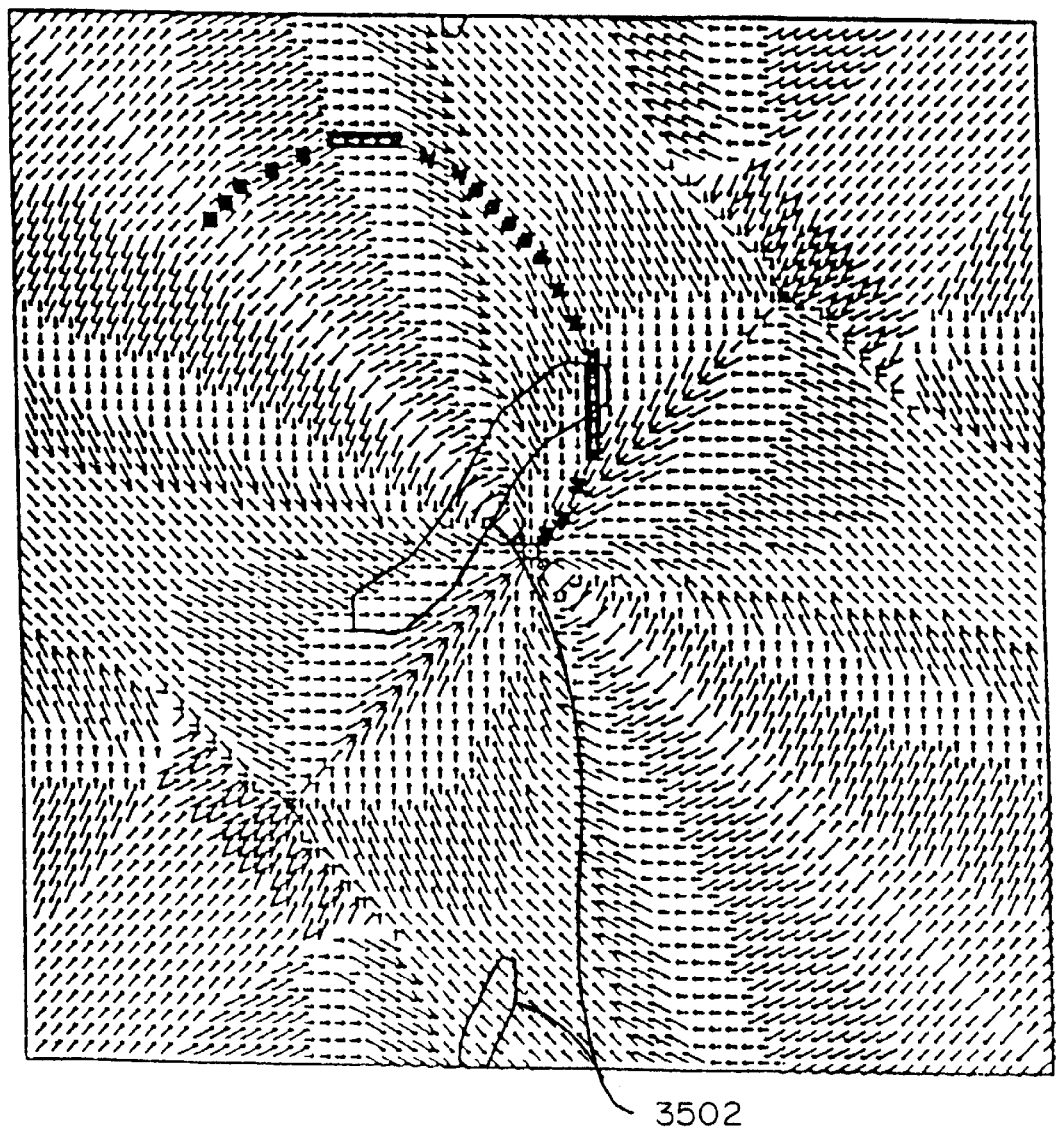
FIG. 35b shows the configuration space of FIG. 34b with an outline of the newly added obstacle.

FIG. 35b shows the configuration space of FIG. 34b, with the newly introduced obstacle 3502 shown in a non-discretized form.

Figure 36:
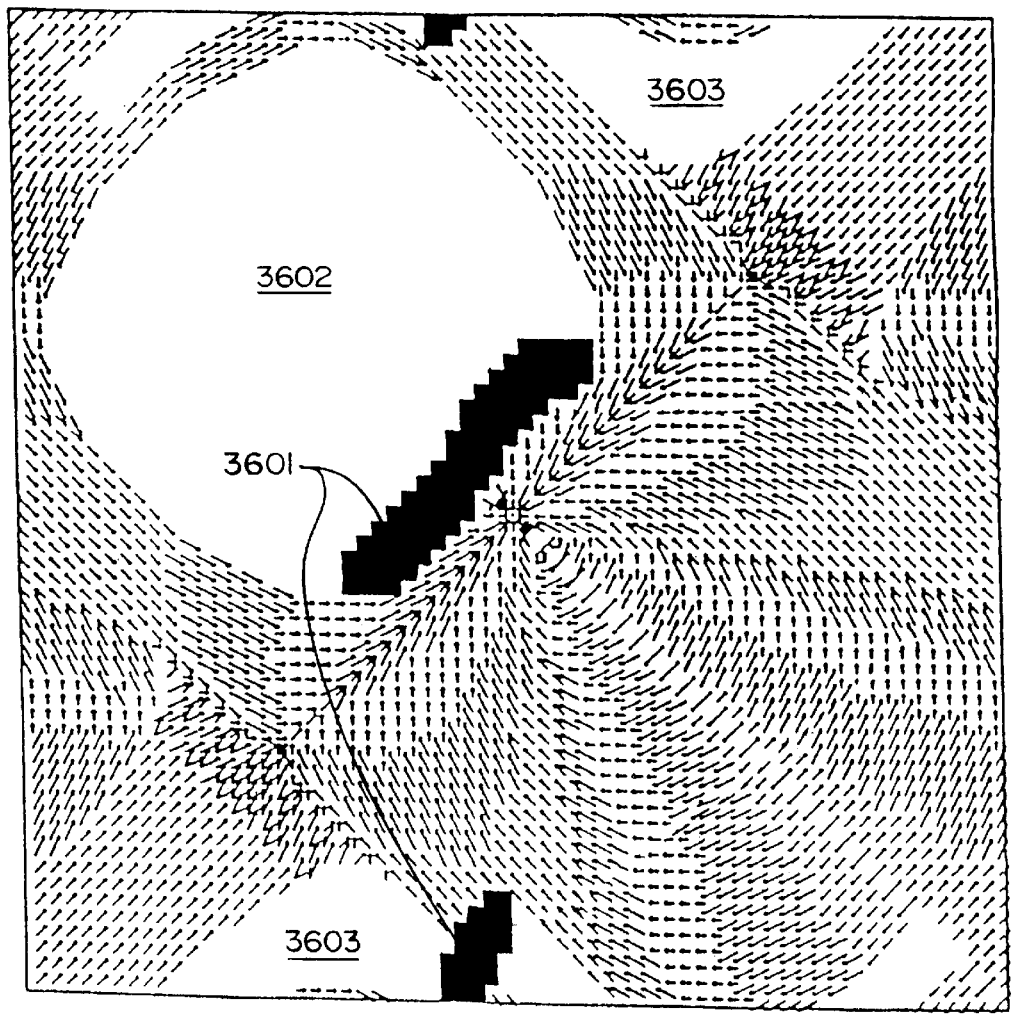
FIG. 36 shows the configuration space of FIG. 35 at an intermediate status after adding the obstacle and after applying the method of FIGS. 2–7.

FIG. 36 shows the configuration space of FIG. 35b, but with the newly added obstacle discretized. Those states whose direction arrows previously pointed to the obstacle 3601 have now had their cost_to_goal fields set to UNCOSTED. UNCOSTED is indicated in FIG. 36 by the states which are now white. These states now appear to be white because, in addition to being UNCOSTED, they have no direction arrows. The newly added obstacle 3601 has affected two regions. One affected region 3602 is adjacent to the portion of the obstacle 3601 which would strike the forearm of the robot. A second affected region 3603 is adjacent to the portion of the obstacle 3601 which would strike the protruding elbow end of the forearm link. The perimeter includes those points adjacent to the white (cleared and UNCOSTED) area 3602, 3603, as well as the region in front of the obstacle. The perimeter region is not 'boxed' because the graphical congestion in the fine resolution example prohibits it. Nevertheless the perimeter states are on the heap.

Figure 37:
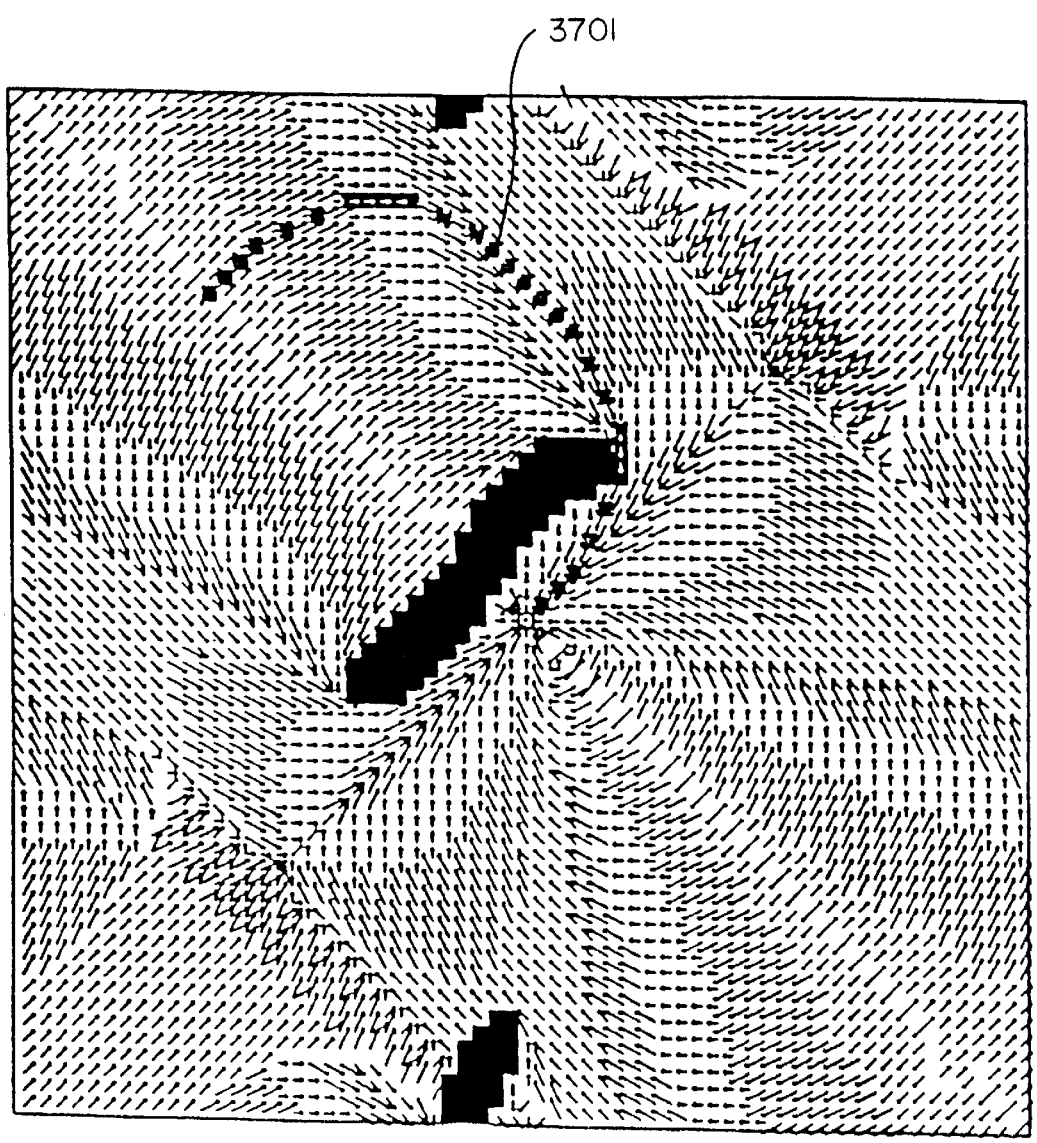
FIG. 37 shows the configuration space of FIG. 36 after budding.

FIG. 37 shows the completed configuration space, corresponding to FIG. 36. In order to get from FIG. 36 to FIG. 37, the perimeter states of FIG. 36, i.e. those on the heap, were budded. The new path that is prescribed, taking the new obstacle into account, is shown at 3701.

Figure 38:
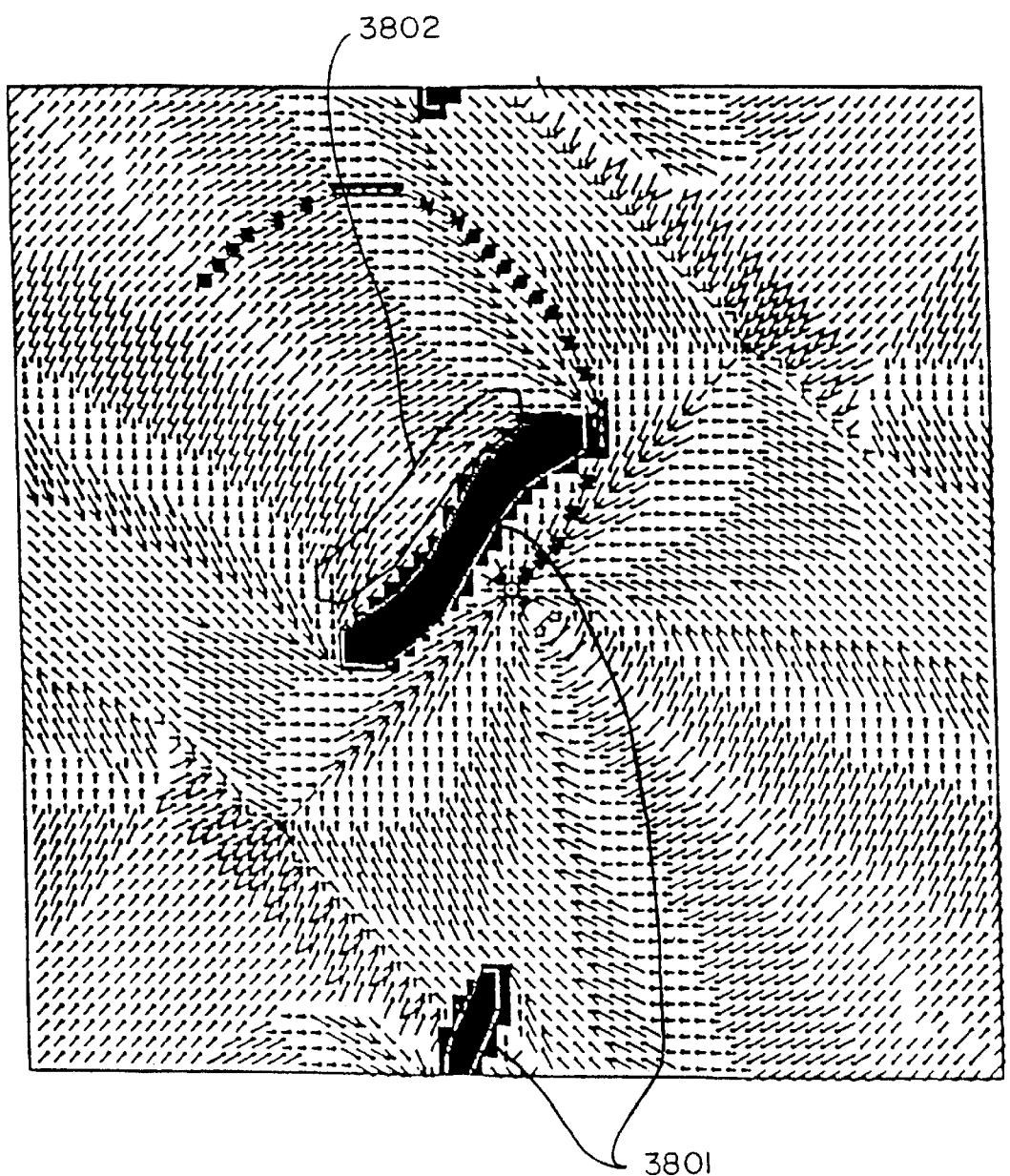
FIG. 38 shows the configuration space of FIG. 37 with a new position for the obstacle indicated in outline.

FIG. 38 shows the configuration space of FIG. 37 with the obstacle in a position which appears moved away from the goal. The discretized area 3801 is where the obstacle moved from, and the polygonal shape 3802 is the non-discretized region describing approximately where the obstacle has moved to.

Figure 39:
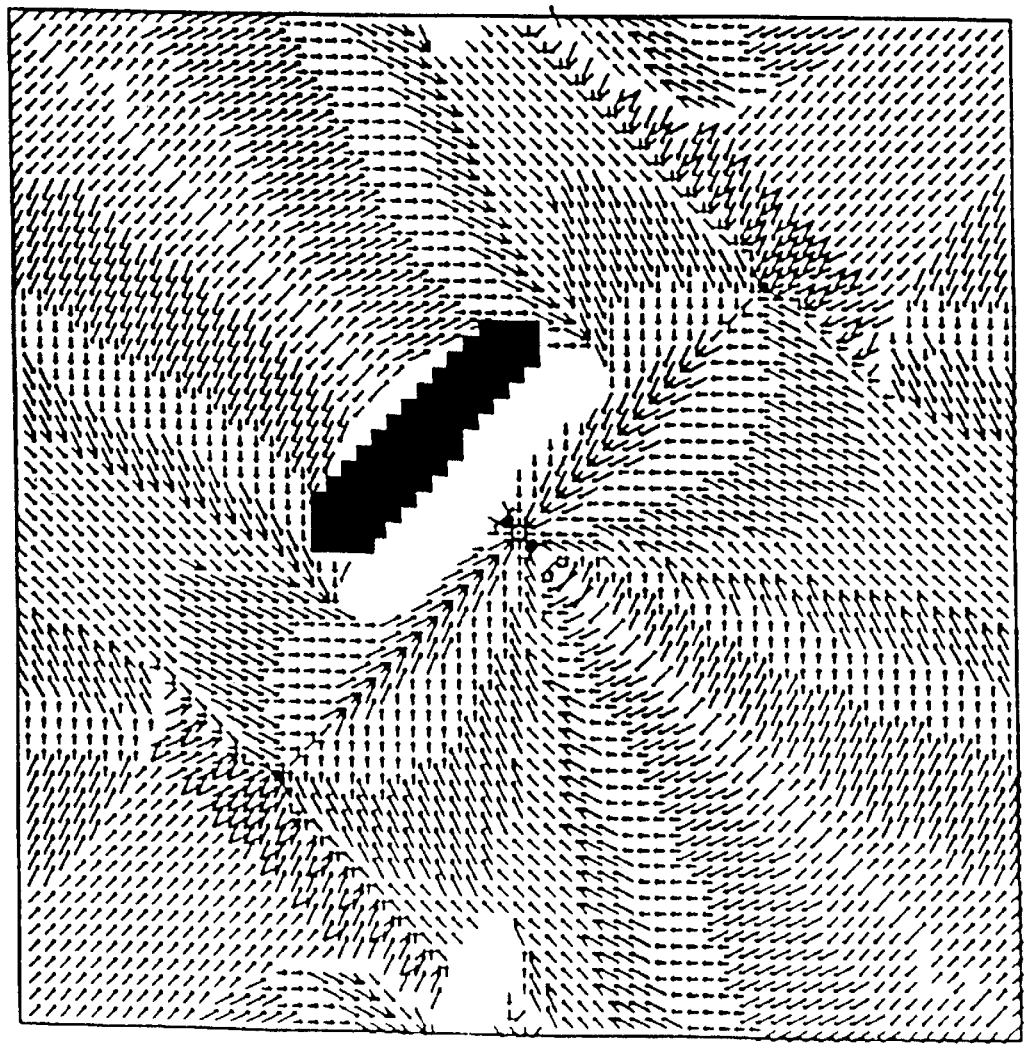
FIG. 39 shows the configuration space of FIG. 38 at an intermediate status after moving the obstacle and after applying the method of FIGS. 2–7.

FIG. 39 shows the configuration space of FIG. 38 after the method of FIGS. 1–7 has been applied. As in FIG. 36, the area affected by the movement of the obstacle is now white. The perimeter of the white area is on the heap, although the resolution of the figure is too fine to show the perimeter area as boxed. It can be seen that not very much of the configuration space has to be recalculated in this case.

Figure 40A:
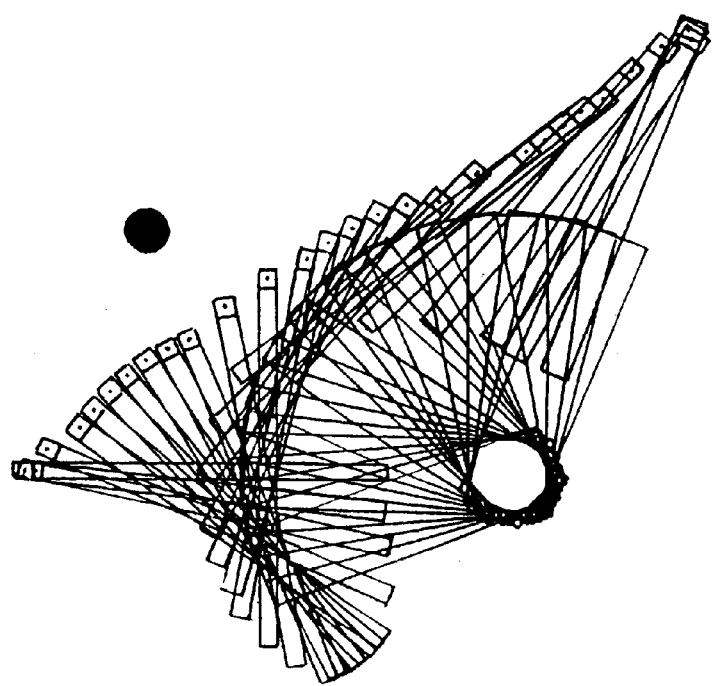
FIG. 40a shows the task space corresponding to FIG. 40b.
Figure 40B:
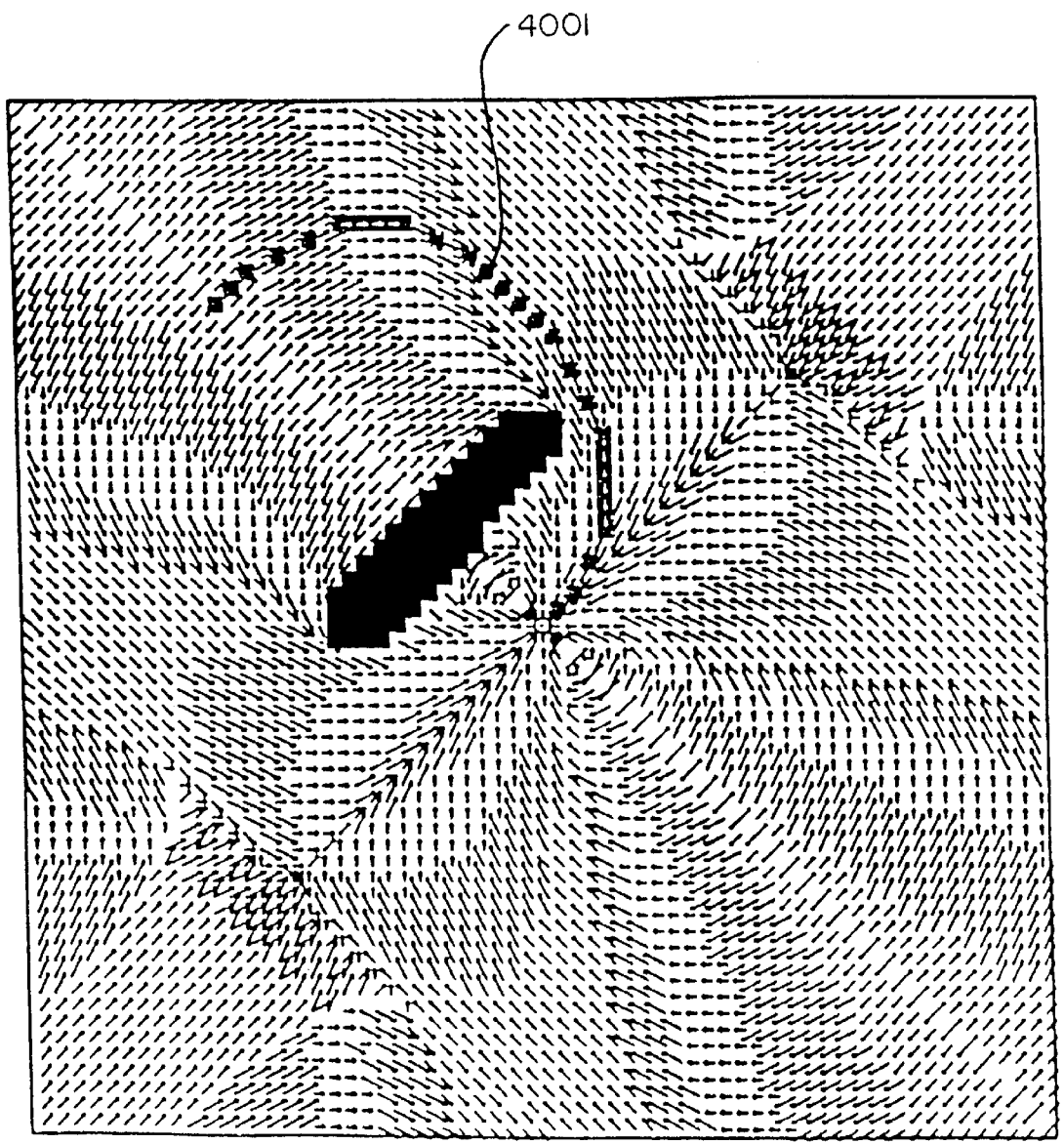
FIG. 40b shows the configuration space of FIG. 39 after budding and with a new path.

FIG. 40b shows the configuration space of FIG. 39 after the perimeter states have been budded. The resulting path is shown at 4001.

FIG. 40a shows the task space corresponding to the configuration space of FIG. 40b.

Figure 41A:
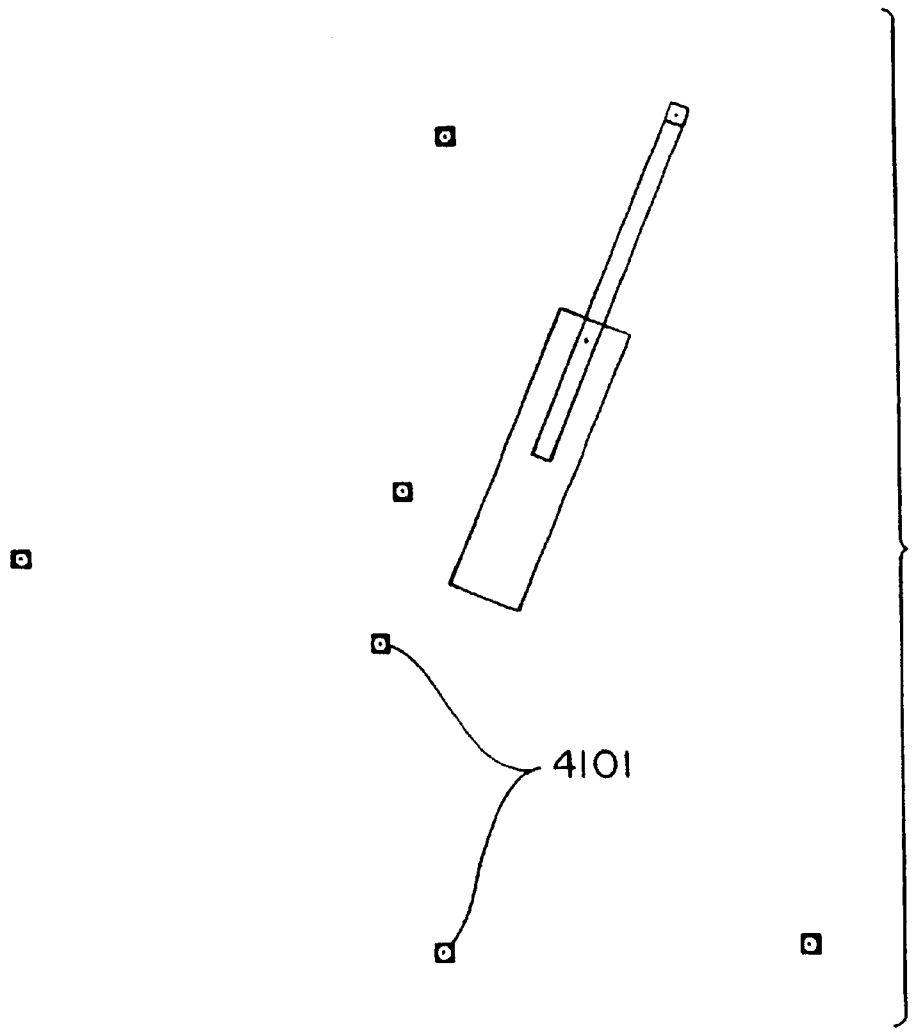
FIG. 41a shows a task space with a two-link robot and a number of goals.

FIG. 41a shows a task space in which there are no obstacles, but a number of goals, e.g. 4101, have been added.

Figure 41B:
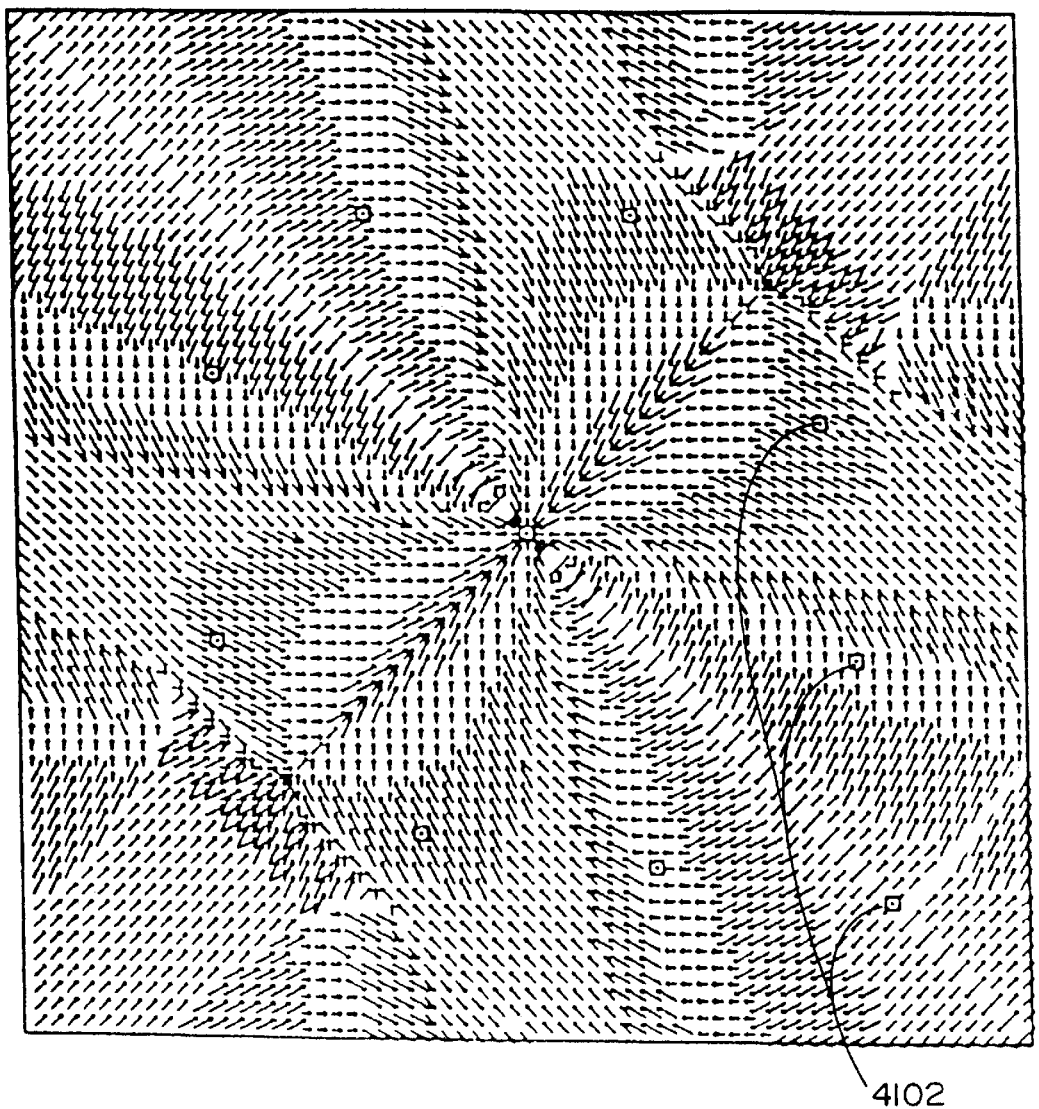
FIG. 41b shows a configuration space corresponding to the task space of FIG. 41a with cost waves propagated using a metric which minimizes joint motion.

FIG. 41b shows a configuration space in which cost waves have been propagated from a single goal, using the metric induced by the criterion of moving the end-effector in a straight line. As in FIG. 41a, no obstacles are appear. Goal states corresponding to the newly added goals of FIG. 41a have been superimposed on the configuration space of FIG. 41b resulting in nine newly added goal states. e.g. 4102.

In applying the method of FIGS. 1–7 to the space of FIG. 41b, the newly added goals must be added to the heap. However no 'clear influence' step needs to be applied. It is only necessary to bud the new heap.

Figure 42A:
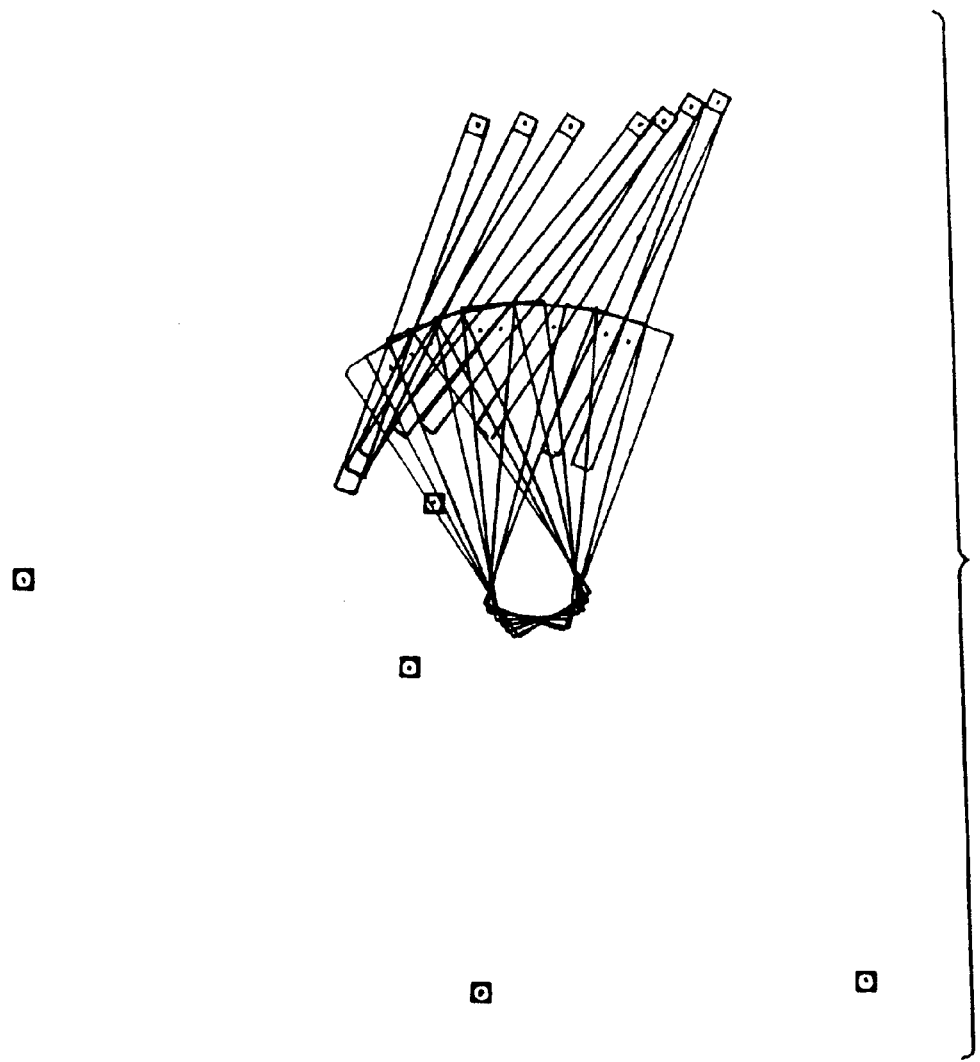
FIG. 42a shows the task space of FIG. 41a with the robot following a newly calculated path.
Figure 42B:
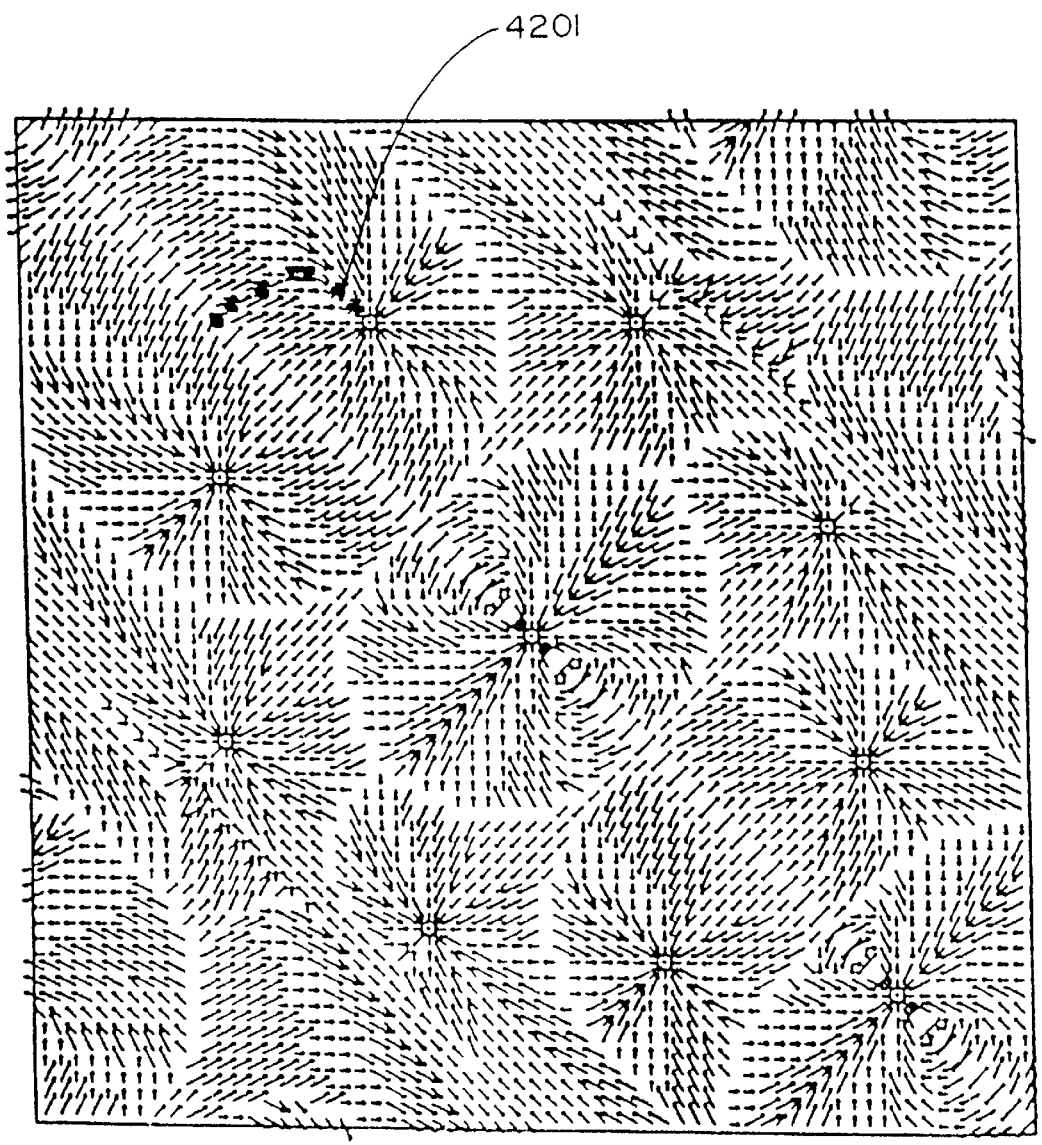
FIG. 42b shows the configuration space of FIG. 41b after application of the method of FIGS. 1–7.

FIG. 42b shows the result of budding the goal states which were added to the heap at the time of FIG. 41b. In addition, a path is shown from a given starting state to the appropriate goal.

FIG. 42a shows the task space corresponding to the configuration space of FIG. 42b.

Figure 43:
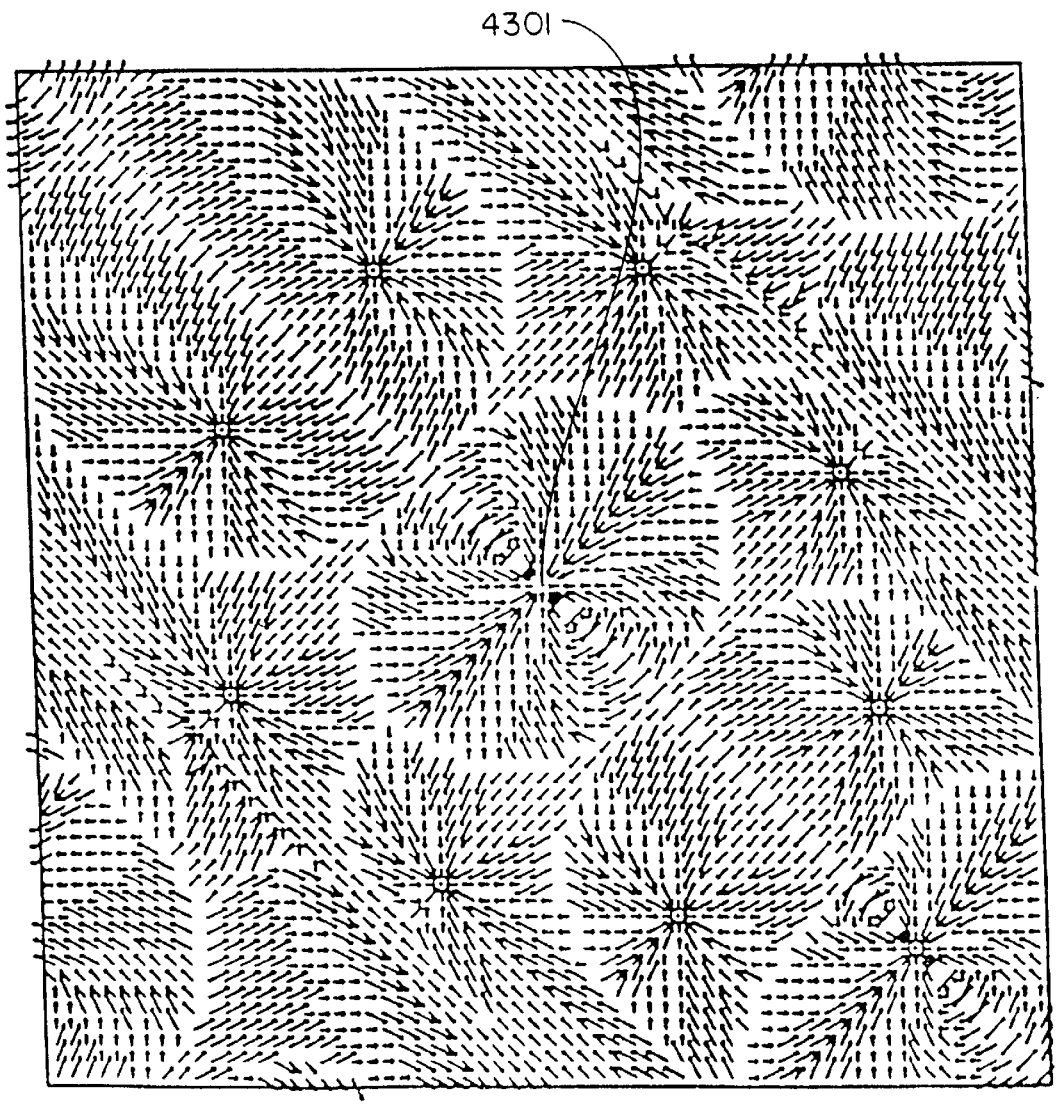
FIG. 43 shows the configuration space of FIG. 42 with a goal state removed.

FIG. 43 shows the configuration space of FIG. 42b where the goal state 4301, which is roughly in the center, is removed, and the other nine goal states are unchanged.

Figure 44:
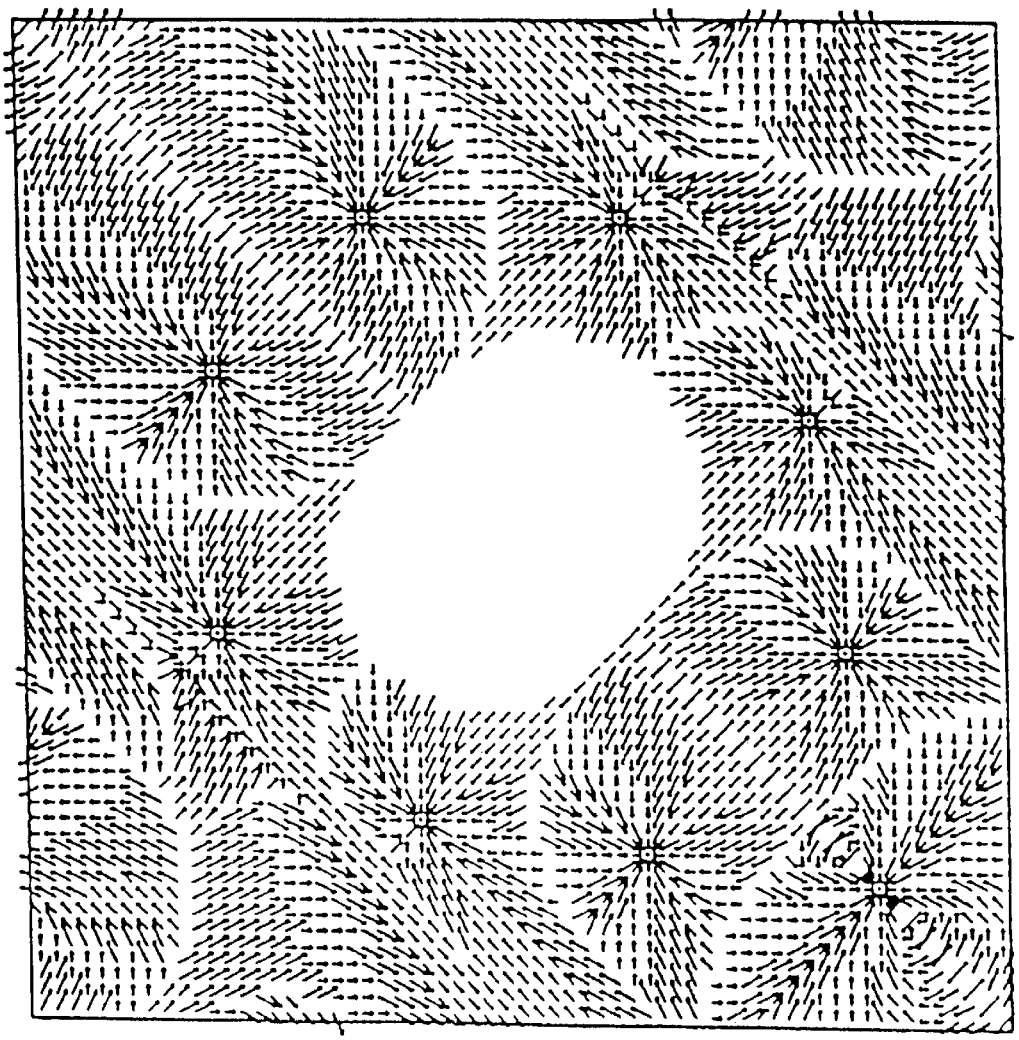
FIG. 44 shows the configuration space of FIG. 43 at an intermediate status after removing the goal and after applying the method of FIGS. 2–7.

FIG. 44 shows the result of 'clearing the influence' 120 of the removed goal state. As before, the area from which influence has been cleared is indicated in white, signifying that the direction arrows have been cleared and the cost_to_goal fields have been set to UNCOSTED. Again, the states on the perimeter of the white area are on the heap.

Figure 45:
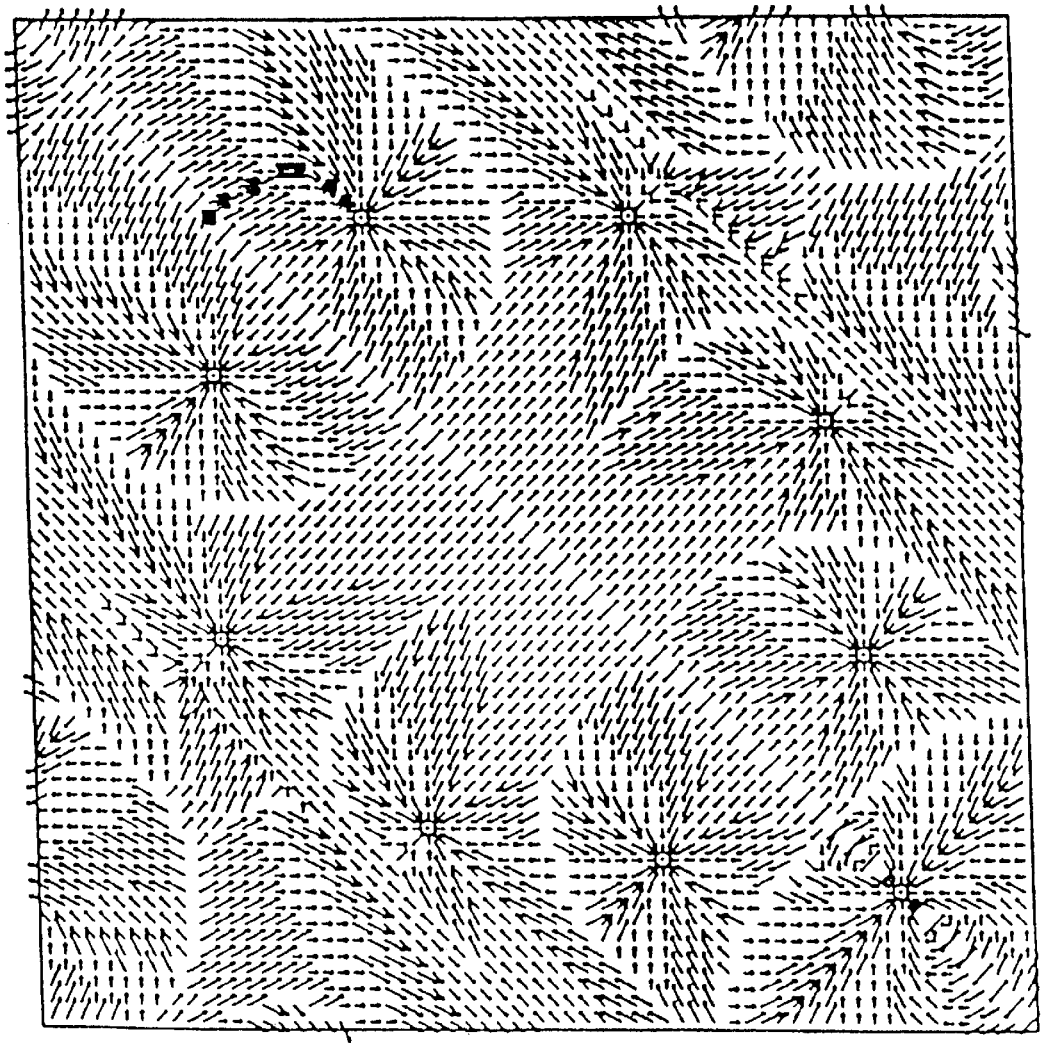
FIG. 45 shows the configuration space of FIG. 44 after budding.

FIG. 45 shows the stable configuration space resulting from budding the perimeter states which were on the heap at the time of FIG. 44.

Figure 46:
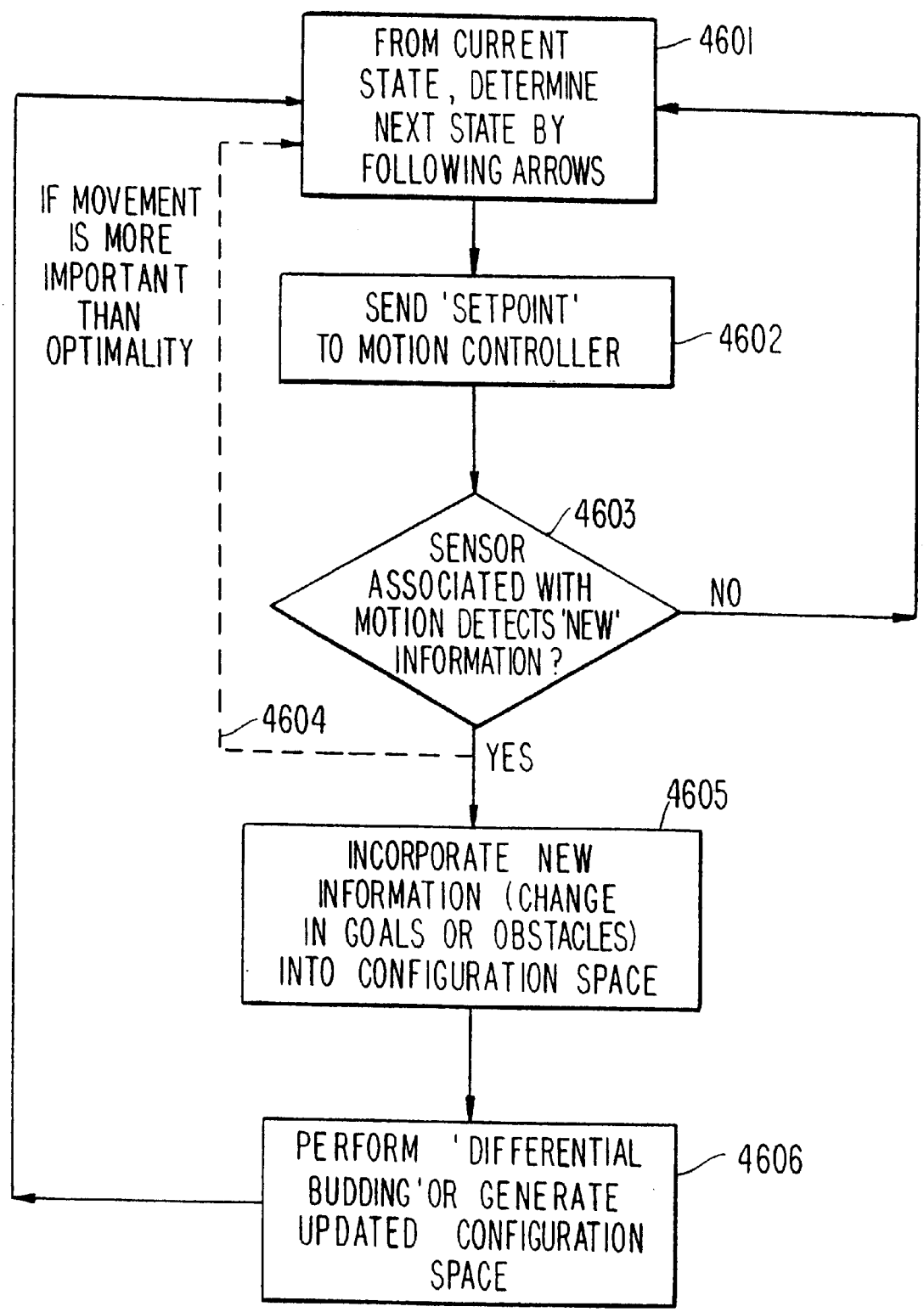
FIG. 46 shows a flow chart for dealing with phantom changes in conditions.

FIG. 46 is a flow chart which summarizes the above-described approach to dealing with unsensed or partially sensed changes in conditions.

In box 4601 the method determines a next state in a precalculated path, by following direction_arrow values from a current states.

In box 4602 the method sends a setpoint to a motion controller for the robot, based on the next state.

At box 4603 a test is performed to determine whether a sensor associated with the motion to the next state has detected new information. If no new information is detected, control returns to box 4601.

If new information is detected there are two options. If the new information is not an absolute obstacle to movement, control may optionally return via the dotted line 4604 to box 4601. The dotted line 4604 represents a situation in which movement is chosen over calculation of a new optimum path. The dotted line 4604 is chosen, in other words, when movement is more important than strict optimality.

While the dotted line 4604 is taken, a processor could be incorporating new information into a configuration space while motion continues. Such parallel processing could be useful when the new information does not immediately affect the motion on the precalculated path. For instance, if the method is applied to control of emergency vehicles, an emergency vehicle might report a traffic blockage in a lane of opposing traffic. Such a report need not affect the progress of the emergency vehicle which reports the blockage. In this case of the emergency vehicle, the vision of the driver is the proximity sensor.

If the dotted line 4604 is not taken, and new information is sensed, control passes to box 4605. In box 4605, the new information is incorporated into configuration space. At 4606, differential budding occurs, for instance using boxes 110–140 of FIG. 1.

After 4606, control returns to box 4601.

Appendix A also shows code for dealing with phantom changes in conditions.

We claim:

1. A method for planning a physical path for a physical object to follow in a physical task space in which there has been a physical change in conditions comprising executing the following steps in at least one digital data processing device that includes or is coupled with at least one computer readable medium:

a. starting from an initialized configuration space data structure, embodied within the at least one computer storage medium and representing the physical task space, the configuration space data structure storing signals representing the object and its environment;

b. receiving signals indicating the physical change in conditions;

c. identifying a perimeter of a region in the configuration space data structure which is affected by the change in conditions;

d. propagating cost waves in the configuration space data structure, within the at least one computer readable medium, from the perimeter to update the signals stored in the configuration space data structure; and e. providing parameter signals based on the updated signals, the parameter signals being usable by the physical object to follow the physical path.

2. The method of claim 1 wherein the object is a robot.

3. The method of claim 1 wherein the signals represent cost to goal and/or direction arrows values.

4. A method for planning a physical path for a physical object to follow in a physical task space in which there has been physical a change in conditions comprising executing the following steps in at least one digital data processing device that includes or is coupled with at least one computer storage medium:
   a. starting from a configuration space data structure, embodied in the at least one computer readable medium, comprising a plurality of state data structures which in turn each comprise respective direction_ arrows and cost_to_goal data structures for storing signals representing the physical task space as it existed prior to the change in conditions;
   b. receiving signals indicating the physical change of conditions;
   c. within the at least one computer readable medium, differentially budding an area in the configuration space data structure which is affected by the change in conditions, wherein differentially budding comprises the steps of:
      I. identifying a perimeter of a region in the configuration space data structure which is affected by the change in conditions; and
      ii. budding from the perimeter to update signals stored in the cost_to_goal and direction_arrows data structures corresponding to the change in conditions, wherein budding comprises for each affected state data structure:
         A) exploring all neighbors of that affected state data structure;
         B) improving neighbors of that affected state data structure by storing appropriate signals in the respective cost_to_goal and direction_arrows data structures;
         C) adding improved neighbors to a storage data structure; and
         D) repeating b) ii) A)–b) ii) D) for all states in the storage data structure; and
   d. providing parameter signals based on the updated values, the parameter signals being usable by the physical object to follow the physical path.

5. Computer apparatus for planning a path for an object to follow in a physical task space in which there has been a change in conditions comprising:
   a. means for storing a configuration space representing the object and its environment;
   b. means for receiving signals indicating the change of conditions;
   c. means for identifying a perimeter of a region in the configuration space which is affected by the change in conditions;
   d. means for propagating cost waves from the perimeter by updating the configuration space, within the means for storing, to fill the configuration space with an updated representation corresponding to the change in conditions; and
   e. means for supplying parameter signals based on the updated configuration space, the parameter signals being usable by the object to follow the path.

6. The apparatus of claim 5 wherein the object is a robot.

7. Computer apparatus for planning a path for a physical object to follow in a physical task space in which there has been a physical change in conditions comprising:
   a. a computer readable medium for embodying a configuration space, as a data structure, which configuration space includes a plurality of states which in turn are for storing direction arrows and cost to goal signals representing the physical task space as it existed prior to the change in conditions;
   b. means for receiving signals indicating the physical change of conditions;
   c. means for differentially budding an area in the configuration space which is affected by the change in conditions, comprising:
      I. means for identifying a perimeter of a region in the configuration space which is affected by the change in conditions; and
      ii. means for budding from the perimeter to update stored cost to goal and direction arrows signals corresponding to the change in conditions, wherein budding comprises for each affected state:
         A) means for exploring all neighbor states of that affected state;
         B) means for improving neighbors of that state by storing appropriate respective cost to goal and direction arrows signals in the neighbor states;
         C) second means for storing;
         D) means for adding improved neighbors to the second means for storing; and
         E) means for repeating b) ii) A)–b) ii) D) for all states in the second means for storing; and
   d. means for supplying parameter signals based on the updated signals, the parameter signals being usable by the physical object to follow the physical path.

8. A computer readable storage medium encoded with a computer program for planning a path for an object to follow in a physical task space in which there has been a change in conditions comprising
   a. means for maintaining a configuration space data structure, the configuration space data structure representing the physical task space and storing signals representing the object and its environment;
   b. means for receiving signals indicating the change in conditions;
   c. means for identifying a perimeter of a region in the configuration space data structure which is affected by the change in conditions;
   d. means for propagating cost waves in the configuration space data structure, within the at least one storage device, from the perimeter to update the signals stored in the configuration space data structure; and
   e. means for providing parameter signals based on the updated signals, the parameter signals being usable by the object to follow the path.

9. The medium of claim 8 wherein, the configuration space data structure contains direction arrow signals which reflect propagation in response to a space variant metric.

10. The medium of claim 8 wherein the change in conditions comprises at least one added obstacle in the task space.

11. The medium of claim 10 wherein
   a. the configuration space comprises a plurality of states, each states being associated with
      I. a direction arrow signal indicating a least cost path;
      ii. a cost to goal signal;
   b. the means for identifying a perimeter comprises:
      I. means for locating a back edge of the obstacle;
      ii. means for storing a perimeter list of states surrounding states in the affected region, the affected region being those states for which the direction arrow signals indicate a path through the added object via the back edge of the obstacle;

iii. means for clearing the cost to goal signals and the direction arrows signals from the affected regions.

12. The medium of claim 11 wherein the means for identifying the perimeter further comprises means for second locating a front edge of the obstacle; and means for including the front edge in the perimeter list.

13. The medium of claim 11 wherein the means for storing comprises means for storing said perimeter list in a sifting heap.

14. The medium of claim 8 wherein the change of conditions comprises that an obstacle has been removed.

15. The medium of claim 8 wherein the change of conditions comprises that a goal has been added.

* * * * *